United States Patent
Moore

(10) Patent No.: US 8,166,649 B2
(45) Date of Patent: May 1, 2012

(54) METHOD OF FORMING AN ELECTRODED SHEET

(75) Inventor: Chad B. Moore, Corning, NY (US)

(73) Assignee: Nupix, LLC, Corning, NY (US)

( * ) Notice: Subject to any disclaimer, the term of this patent is extended or adjusted under 35 U.S.C. 154(b) by 822 days.

(21) Appl. No.: 12/194,839

(22) Filed: Aug. 20, 2008

(65) Prior Publication Data

US 2008/0314626 A1    Dec. 25, 2008

Related U.S. Application Data

(63) Continuation-in-part of application No. PCT/US2006/61872, filed on Dec. 11, 2006, and a continuation-in-part of application No. 11/609,093, filed on Dec. 11, 2006, now abandoned, and a continuation-in-part of application No. 11/609,131, filed on Dec. 11, 2006, and a continuation-in-part of application No. 11/609,220, filed on Dec. 11, 2006.

(60) Provisional application No. 60/957,317, filed on Aug. 22, 2007, provisional application No. 61/060,614, filed on Jun. 11, 2008, provisional application No. 60/749,446, filed on Dec. 12, 2005, provisional application No. 60/759,704, filed on Jan. 18, 2006, provisional application No. 60/827,146, filed on Sep. 27, 2006, provisional application No. 60/827,152, filed on Sep. 27, 2006, provisional application No. 60/827,170, filed on Sep. 27, 2006.

(51) Int. Cl.
*H01K 3/10* (2006.01)
*H05K 1/03* (2006.01)

(52) U.S. Cl. ............. 29/850; 29/830; 29/831; 29/832; 29/846; 29/852; 174/255

(58) Field of Classification Search ............ 29/830, 29/831, 832, 846, 852, 850; 174/255, 256, 174/257, 261; 257/244, 520, 661
See application file for complete search history.

(56) References Cited

U.S. PATENT DOCUMENTS 3,602,754 A    8/1971    Pfaender
(Continued)

FOREIGN PATENT DOCUMENTS

| JP | 62111234 A | 5/1987 |
| JP | 2000085068 A | 3/2000 |
| WO | 9900695 A1 | 1/1999 |

OTHER PUBLICATIONS

Supplementary European Search Report for European Application No. EP 06846554, Issued on Feb. 12, 2009.

(Continued)

*Primary Examiner* — Derris Banks
*Assistant Examiner* — Tai Nguyen
(74) *Attorney, Agent, or Firm* — Brown & Michaels, PC

(57) ABSTRACT

A sheet in an electronic display is composed of a substrate containing an array of wire electrodes. The wire electrodes are preferably electrically connected to patterned transparent conductive electrode lines. The wire electrodes are used to carry the bulk of the current. The wire electrodes are capable of being extended away from the substrate and connected directly to the printed circuit board. The transparent conductive electrode (TCE) is used to spread the charge or voltage from the wire electrode across the pixel. The TCE is a patterned film and must be at least 50% transparent, and, for most applications, is preferably over 90% transparent. In most applications, the electroded surface of the electroded sheet has to be flattened. Use of a thin polymer substrate yields a light, flexible, rugged sheet that may be curved, bent or rolled.

12 Claims, 45 Drawing Sheets

U.S. PATENT DOCUMENTS

| | | | |
|---|---|---|---|
| 3,654,680 A | 4/1972 | Bode et al. | |
| 3,927,342 A | 12/1975 | Bode et al. | |
| 3,964,050 A | 6/1976 | Mayer | |
| 4,027,188 A | 5/1977 | Bergman | |
| 4,038,577 A | 7/1977 | Bode et al. | |
| 4,554,537 A | 11/1985 | Dick | |
| 4,728,864 A | 3/1988 | Dick | |
| 4,833,463 A | 5/1989 | Dick et al. | |
| 4,896,149 A | 1/1990 | Buzak et al. | |
| 5,086,297 A | 2/1992 | Miyake et al. | |
| 5,162,901 A | 11/1992 | Shimada et al. | |
| 5,436,634 A | 7/1995 | Kanazawa | |
| 5,446,344 A | 8/1995 | Kanazawa | |
| 5,661,500 A | 8/1997 | Shinoda et al. | |
| 5,674,553 A * | 10/1997 | Shinoda et al. | 427/68 |
| 5,745,086 A | 4/1998 | Weber | |
| 5,838,105 A | 11/1998 | Mitomo | |
| 5,892,558 A | 4/1999 | Ge et al. | |
| 5,984,747 A | 11/1999 | Bhagavatula et al. | |
| 5,985,700 A | 11/1999 | Moore | |
| 6,072,276 A | 6/2000 | Okajima | |
| 6,111,191 A | 8/2000 | Hall et al. | |
| 6,171,762 B1 | 1/2001 | Borrelli et al. | |
| 6,197,429 B1 | 3/2001 | Lapp et al. | |
| 6,247,987 B1 | 6/2001 | Moore | |
| 6,354,899 B1 | 3/2002 | Moore | |
| 6,414,433 B1 * | 7/2002 | Moore | 313/582 |
| 6,431,935 B1 | 8/2002 | Moore | |
| 6,452,332 B1 | 9/2002 | Moore | |
| 6,459,200 B1 | 10/2002 | Moore | |
| 6,472,594 B1 | 10/2002 | Ichinose et al. | |
| 6,480,253 B1 | 11/2002 | Shigeta et al. | |
| 6,507,146 B2 | 1/2003 | Moore | |
| 6,515,218 B1 | 2/2003 | Shimizu et al. | |
| 6,524,773 B1 | 2/2003 | Borrelli et al. | |
| 6,570,339 B1 | 5/2003 | Moore | |
| 6,573,880 B1 | 6/2003 | Simoni et al. | |
| 6,577,060 B2 | 6/2003 | Tokai et al. | |
| 6,611,100 B1 | 8/2003 | Moore | |
| 6,677,704 B2 | 1/2004 | Ishimoto et al. | |
| 6,750,605 B2 | 6/2004 | Moore | |
| 6,771,234 B2 | 8/2004 | Moore | |
| 6,785,036 B1 | 8/2004 | Berneth et al. | |
| 6,794,812 B2 | 9/2004 | Yamada et al. | |
| 6,836,063 B2 | 12/2004 | Ishimoto et al. | |
| 6,841,929 B2 | 1/2005 | Ishimoto et al. | |
| 6,917,156 B2 | 7/2005 | Moore | |
| 6,930,442 B2 | 8/2005 | Awamoto et al. | |
| 6,932,664 B2 | 8/2005 | Yamada et al. | |
| 6,936,761 B2 | 8/2005 | Pichler | |
| 6,946,803 B2 | 9/2005 | Moore | |
| 6,950,173 B1 | 9/2005 | Sutherland | |
| 6,969,292 B2 | 11/2005 | Tokai et al. | |
| 7,022,910 B2 | 4/2006 | Gaudiana et al. | |
| 7,034,446 B2 | 4/2006 | Moore | |
| 7,049,748 B2 | 5/2006 | Tokai et al. | |
| 7,082,236 B1 | 7/2006 | Moore | |
| 7,122,961 B1 | 10/2006 | Wedding | |
| 7,456,571 B1 | 11/2008 | Wedding | |
| 2001/0009352 A1 | 7/2001 | Moore | |
| 2001/0033483 A1 | 10/2001 | Moore | |
| 2002/0140133 A1 | 10/2002 | Moore | |
| 2002/0149717 A1 | 10/2002 | Borrelli et al. | |
| 2003/0042839 A1 | 3/2003 | Ishimoto et al. | |
| 2003/0095094 A1 * | 5/2003 | Goden | 345/107 |
| 2003/0122485 A1 | 7/2003 | Tokai et al. | |
| 2003/0134506 A1 | 7/2003 | Kim et al. | |
| 2003/0214223 A1 | 11/2003 | Ishimoto et al. | |
| 2003/0214224 A1 | 11/2003 | Awamoto et al. | |
| 2004/0242110 A1 | 12/2004 | Matsuda et al. | |
| 2005/0003640 A1 | 1/2005 | Ushiyama et al. | |
| 2005/0104509 A1 | 5/2005 | Yamashita | |
| 2005/0122306 A1 | 6/2005 | Wilcox et al. | |
| 2005/0126628 A1 | 6/2005 | Scher et al. | |
| 2005/0127455 A1 | 6/2005 | Nishiki et al. | |
| 2005/0140893 A1 | 6/2005 | Hong | |
| 2005/0150541 A1 | 7/2005 | Scher et al. | |
| 2005/0214967 A1 | 9/2005 | Scher et al. | |
| 2006/0181763 A1 | 8/2006 | De Zwart et al. | |
| 2006/0193031 A1 | 8/2006 | Moore | |
| 2006/0214880 A1 | 9/2006 | Moore | |
| 2007/0054730 A1 | 3/2007 | Mattice et al. | |
| 2007/0058178 A1 | 3/2007 | Kurihara et al. | |

OTHER PUBLICATIONS

Awanoto et al., "Development of Plasma Tube Array Technology for Extra-Large-Area Displays", SID 2005, pp. 206-209.

C. Bergman, R.W. Johnson, R.A. Strom and T.N. Thompson, "Large Screen Plasma Display", AD728623, Final Report on Contract No. F30602-70-C-0154, Rome Air Development Center, Jul. 1971.

C. Bergman, "Plasma Display Color Techniques Using Tubular Construction", AD766933 Final Report on Contract No. F30602-72-C-0167, Rome Air Development Center, Jul. 1973.

G.W. Dick, "Three-Electrode per PEL AC Plasma Display Panel", 1985 International Display Research Conf., pp. 45-50.

H. Hirakawa et al., "Dynamic Driving Characteristics of Plasma Tubes Array", SID 2004, pp. 810-813.

M. Ishimoto et al. "Discharge Observation of Plasma Tubes", SID 2003 pp. 36-39.

W. Mayer and V. Bonin, "Tubular AC Plasma Panels," 1972 IEEE Conf. Display Devices, Conf. Rec., New York, pp. 15-18.

C. Moore and R. Schaeffler, "Fiber Plasma Display", SID '97 Digest, pp. 1055-1058.

R. Strom, "32-Inch Graphic Plasma Display Module," 1974 SID Int. Symposium, San Diego, pp. 122-123.

R. A. Strom and C. Bergman, "Large Area Plasma Display module", AD782383, Final Report on Contract F30602-72-C-0211, Rome Air Development Center, Apr. 1974.

T. Shinoda et al. "New Approach for Wall Display with Fine Tube Array Technology" SID 2002, pp. 1072-1075.

The International Search Report and The Written Opinion of the International Searching Authority for PCT application No. PCT/US06/61872 mailed Mar. 10, 2008.

* cited by examiner

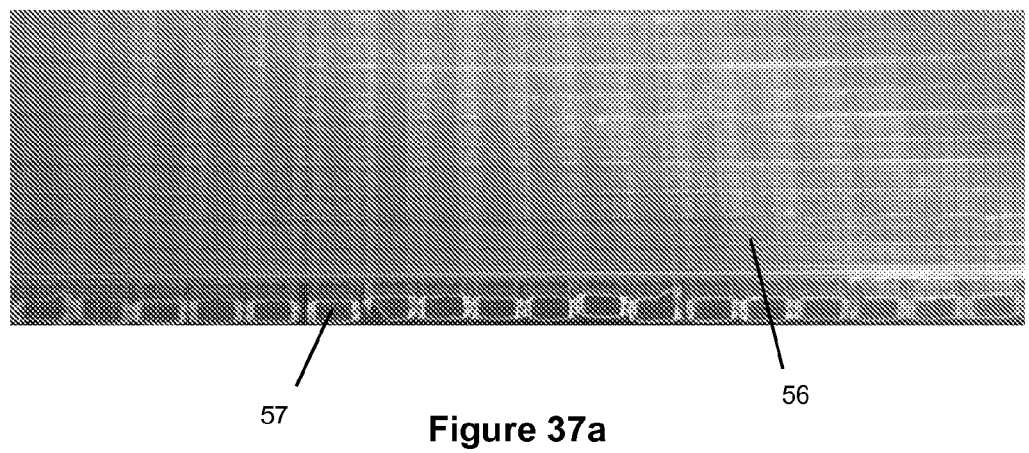
57   Figure 37a   56
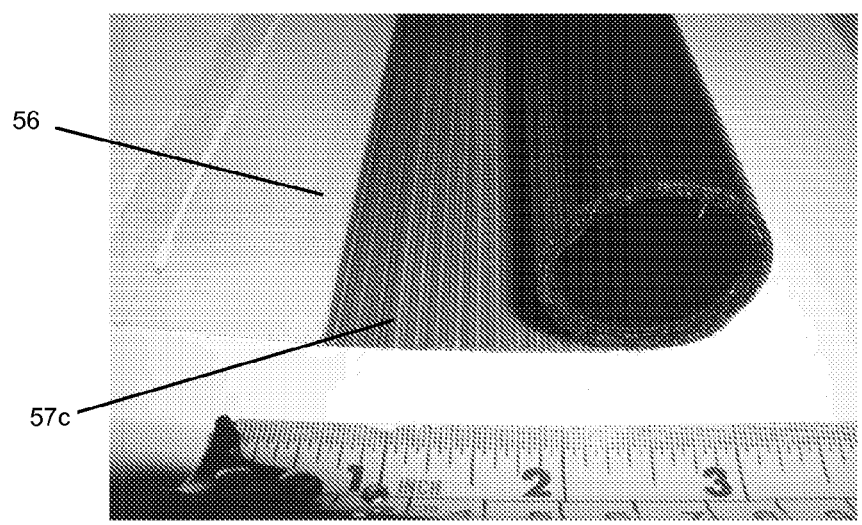
Figure 37b
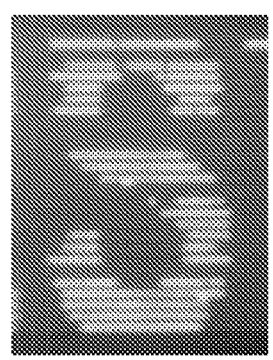 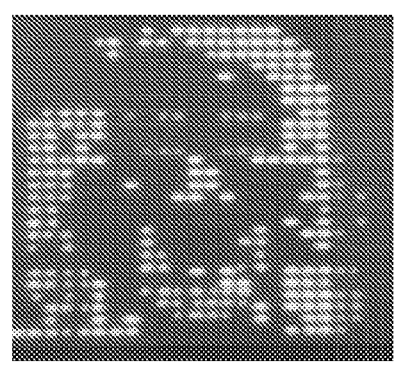
Figure 37c                    Figure 37d

METHOD OF FORMING AN ELECTRODED SHEET

REFERENCE TO RELATED APPLICATIONS

This application claims one or more inventions which were disclosed in Provisional Application No. 60/957,317, filed Aug. 22, 2007, entitled "ELECTRODED SHEET" and Provisional Application No. 61/060,614, filed Jun. 11, 2008, entitled "ELECTRODED SHEET (eSHEET) PRODUCTS". The benefit under 35 USC §119(e) of the United States provisional applications is hereby claimed, and the aforementioned applications are hereby incorporated herein by reference.

This application is also a continuation in part of copending U.S. application Ser. No. 11/609,093, filed Dec. 11, 2006, entitled "TUBULAR PLASMA DISPLAY", copending U.S. application Ser. No. 11/609,131, filed Dec. 11, 2006, entitled "ELECTRODED SHEET", copending U.S. application Ser. No. 11/609,220, filed Dec. 11, 2006, entitled "WIRE-BASED FLAT PANEL DISPLAYS", and copending PCT Patent Application Number PCT/US2006/061872, filed Dec. 11, 2006, entitled "WIRE-BASED FLAT PANEL DISPLAYS, which all claim one or more inventions that were disclosed in one of the following provisional applications:

1) Provisional Application Number Provisional Application No. 60/749,446, filed Dec. 12, 2005, entitled "ELECTRODE ADDRESSING PLANE IN AN ELECTRONIC DISPLAY";
2) Provisional Application No. 60/759,704, filed Jan. 18, 2006, entitled "ELECTRODE ADDRESSING PLANE IN AN ELECTRONIC DISPLAY AND PROCESS";
3) Provisional Application No. 60/827,146, filed Sep. 27, 2006, entitled "TUBULAR PLASMA DISPLAY";
4) Provisional Application No. 60/827,152, filed Sep. 27, 2006, entitled "ELECTRODED SHEET"; and
5) Provisional Application No. 60/827,170, filed Sep. 27, 2006, entitled "WIRE-BASED FLAT PANEL DISPLAYS".

The benefit under 35 USC §119(e) of the United States provisional applications is hereby claimed, and the aforementioned applications are hereby incorporated herein by reference.

FIELD OF THE INVENTION

The invention pertains to the field of electronic products, in particular creating an electroded plane in an electronics product to apply power to the plane or to remove power from the plane.

BACKGROUND OF THE INVENTION

Within the electronic display space there is a group of displays that create an image by modulating an electro-optic material. An electro-optic material is defined as a material that changes state in an electric field. Some of these materials can be passively addressed or simply addressed by sandwiching the electro-optic material between two orthogonal arrays of electrodes. However, this passive addressing scheme requires that the electro-optic material has a threshold or its optical properties have an abrupt change over a small change in applied voltage. Most liquid crystal (LC) materials have a steep enough threshold that allows them to be passively addressed. If the electro-optic material does not have a voltage threshold or its threshold is not steep enough (the voltage to totally modulate the material has to be less than twice the voltage of where the material's electro-optic properties start to change), then the electro-optic material has to be actively addressed. Active addressing means that a switch, like a transistor, that has a voltage threshold is used to place the voltage across the electro-optic material. Other active addressing switches that have been used are diodes, plasmas, and micro-electro-mechanical systems (MEMS). Active addressing is also used in cases that require video rate images because passive addressing requires that a line at a time addressing scheme is used and therefore the speed to update the image is limited to the number of lines in the display times the minimum response time of the electro-optic media.

There are several different types of electro-optic materials. The most well known and widely used electro-optic materials are liquid crystal molecules. In the liquid crystal family, a vast range of molecules could potentially be used to create the electro-optic modulated material. Some of these liquid crystal molecules include, but are not limited to, twisted nematic, cholesteric-nematic, dichroic dye (or guest-host), dynamic scattering mode, smectic, and polymer dispersed. Most of these liquid crystal molecules require other films, such as alignment layers, polarizers, and reflective films.

Another type of electro-optic material is electrophoretic material. Electrophoretic material is a suspension of small charged particles in a liquid solution. If the particles have a similar density as the liquid solution, they are not affected by gravity. Therefore the only way to move the particles is using an electric field. By applying a voltage potential across the electrophoretic solution, the charged particles are forced to move in the suspension to one of the contacts. The opposite charge moves the particles in the other direction. The electrophoretic suspension is designed such that the particles are a different color than the liquid solution or there are two different colored particles with opposite charge states.

Another type of electro-optic material is a twisting ball or Gyricon material. It was initially called twisting ball material because it is composed of small bichromal spheres, one side coated black, the other white with opposite charges on the two halves. Therefore, when the twisting ball material is placed in an electric field, the bichromal spheres all rotate to display one optical property of the material and when the opposite voltage is applied, the material displays the other colored state. This Gyricon material can also be made in a cylindrical form.

Research Frontiers Incorporated has developed another electro-optic material that they call a suspended particle device (SPD) which consists of microscopic particles in a liquid suspension. These microscopic particles are elongated in one direction and, when randomly orientated, block light. When a voltage is applied across the electro-optic material, the particles align and transmit light.

Most of these electro-optic materials do not have a voltage threshold and must be actively addressed. Some of the liquid crystal materials use an active transistor back plane to address the displays, but these types of displays are presently limited in size due to a complicated and costly manufacturing process. Transmissive displays using liquid crystal materials and a plasma-addressed back plane have been demonstrated in U.S. Pat. No. 4,896,149, herein incorporated by reference, however, these plasma-addressed back planes are also limited in size due to availability of the thin microsheet to create the plasma cells.

One potential solution for producing large size displays is to use fibers/tubes to create the plasma cells. Using tubes to create a plasma-addressable plasma cell was first disclosed in U.S. Pat. No. 3,964,050, herein incorporated by reference. One potential issue in producing large plasma-addressed tubular displays is creating the top column electrode plate. This plate has to be composed of an array of lines to address that set the charge in the plasma tubes. When addressing a thin electro-optic material like a LC or electrophoretic material, these electrode lines have to be wide enough to spread the charge across the width of the entire pixel. The lines also have to be conductive enough to set the charge in the plasma tube so the display can be addressed at video rates. A traditional patterned indium tin oxide (ITO) transparent conductor works fine for smaller panels where processing the panel is easy and the lines are short, however to address very large panels, the ITO lines are not conductive enough and patterning of the lines becomes very expensive.

One method to solve this problem has been proposed in U.S. patent publication no. 2006-0193031, "Electrode Enhancements for Fiber-Based Displays", filed Sep. 28, 2005, and herein incorporated by reference. In that application, fiber containing an electrode is used to form the column electrode plane. The electrode is composed of a wire electrode, which carries the bulk of the current and a transparent conductive electrode, which is connected to the wire electrode and is used to spread the voltage across the surface of the fiber.

Connecting a higher conductive metal film electrode to a transparent conductive film to spread the voltage of the electrode is also traditionally used in the top electrode plate of a plasma display (PDP). The top PDP plates use a 50 µm wide by about 1 µm thick Cr/Cu/Cr stack to carry current and a thin ITO coating to spread the effect of the voltage, hence spreading the firing of the plasma. These electrode coatings are evaporated or sputtered and then photolithograph is used to pattern them and they are then etched into lines using a wet etch or a reactive ion etch (RIE).

Photovoltaic cells also use conductive metal lines connected to transparent conductive coatings to collect the current from the photovoltaic device. The use of wire connected to a transparent conductive coating has been disclosed by Nanosolar in U.S. Pat. Nos. 6,936,761 and 7,022,910, herein incorporated by reference, for solar cell applications.

SUMMARY OF THE INVENTION

The present invention includes a sheet in an electronic display composed of a substrate containing an array of wire electrodes. The wire electrodes are preferably electrically connected to patterned transparent conductive electrode lines. The present invention also includes methods of making an electroded sheet. The wire electrodes are used to carry the bulk of the current. The wire electrodes are capable of being extended away from the substrate and connected directly to a printed circuit board. A transparent conductive electrode (TCE) is used to spread the charge or voltage from the wire electrode across the pixel. The TCE is a patterned film and, in most display applications, must be at least 50% transparent, and is preferably over 90% transparent. The TCE is preferably composed of a transparent conductive polymer, nanotubes, or a PVD material like ITO. The TCE must form a good electrical connection with the wire electrode (low interface resistance) and must be electrically connected to the wire electrode along most of the length of the electrode. The TCE material does not have to have a high conductivity because it only needs to be conductive enough to spread the charge or voltage across the pixel width. The substrate that houses the wires/TCE stripes is preferably polymer, silicone, or glass.

In order for the electroded sheet (eSheet) to be used in most display applications, the electroded surface is preferably flattened.

BRIEF DESCRIPTION OF THE DRAWINGS

FIG. 6b schematically shows the wires embedded in the polymer film using the process shown in FIG. 6a.

FIG. 7b schematically shows the wires with TCEs with polymer film after the process of FIG. 7a.

FIG. 8b schematically shows the wires with TCEs with polymer film after the process of FIG. 8a.

FIG. 9b schematically illustrates placing wire electrodes over the patterned transparent conductive electrodes in FIG. 9a.

FIG. 10b schematically illustrates placing wire electrodes coated with a conductive coating over the patterned transparent conductive electrodes in FIG. 10a.

FIG. 15d schematically illustrates the thermal polymer in FIG. 15c flat against the electroded surface.

FIG. 21b is a close-up image of FIG. 21a.

FIG. 37a is an image of an array of plasma tubes connected to an eSheet to form the panel structure in a tubular plasma display.

FIG. 37b is an image of an array of plasma tubes with a red, green and blue color filter coating connected to an eSheet on one side of the tube array to form a tubular plasma display panel and demonstrating that the tube array can be rolled.

FIG. 37c is a photograph of an image on a tubular plasma display.

FIG. 37d is a photograph of an image on a tubular plasma display.

DESCRIPTION OF THE PREFERRED EMBODIMENT

The present invention includes a sheet in an electronic display composed of a substrate containing an array of wire electrodes. The wire electrodes are preferably electrically connected to patterned transparent conductive electrode lines. The present invention also includes methods of making an electroded sheet. The wire electrodes are used to carry the bulk of the current. The wires are preferably formed using a standard wire forming process; they are free standing entities and are not evaporated or deposited on the substrate. The wire electrodes are capable of being extended away from the substrate and connected directly to a printed circuit board.

A transparent conductive electrode (TCE) is used to spread the charge or voltage from the wire electrode across the pixel. The TCE is a patterned film and, in most display applications, must be at least 50% transparent, and is preferably over 90% transparent. The TCE is preferably composed of a transparent conductive polymer, nanotubes, or a PVD material like ITO. The TCE must form a good electrical connection with the wire electrode (low interface resistance) and must be electrically connected to the wire electrode along most of the length of the electrode. The TCE material does not have to have a high conductivity because it only needs to be conductive enough to spread the charge or voltage across the pixel width. The substrate that houses the wires/TCE stripes is preferably made of polymer, silicone, or glass. Use of a thin polymer or silicone substrate yields a light, flexible, rugged sheet that can be curved, bent or rolled.

In order for the electroded sheet (eSheet) to be used in most display applications, the electroded surface is preferably flattened. The electroded sheet may be used as an addressing plane in a passive or actively addressed display. Alternatively, it may be used as a sustainer layer or column addressing layer in a tubular plasma display. The electroded sheet may be used to capacitively address an electro-optic material or capacitively set-up the charge in a panel. The electroded layer may also be used as current carrying stripes to address materials such as electrochromic materials or organic light emitting materials. An electroded sheet can supply power to a line or plane in a device, including, but not limited to, a display, an eSign, a lamp, a touch screen, a battery, a printer, a speaker, a heater, a sensor, a ribbon cable, or a transmitter. An eSheet can also remove power from a line or plane in a device, such as a solar cell, fuel cell, battery, EMF/EMI shielding, sensor, or antenna.

Electroded Sheet eSheet

Figure 1:
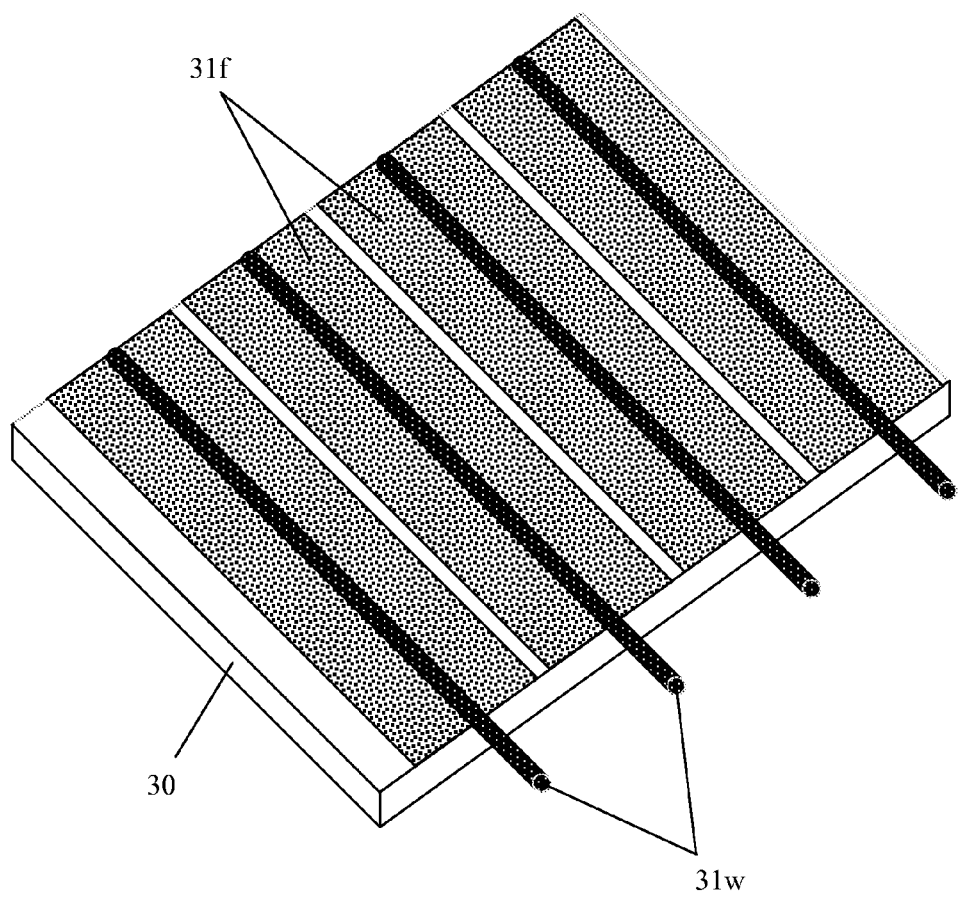
FIG. 1 schematically shows an array of wire electrodes electrically connected to transparent conductive lines on a substrate.

An electroded sheet or eSheet is composed of a substrate 30 containing an array of wire electrodes 31w electrically connected to patterned transparent conductive electrode 31f lines, as shown in FIG. 1. The wire electrodes 31w, which are defined as a highly conductive thread-like or fiber-like material herein, are used to carry the bulk of the current along the length of the lines in the eSheet. The wires are formed using a standard wire forming process; they are free standing entities and are not evaporated or deposited on the substrate. The wire electrodes 31w are capable of being extended away from the substrate 30 and connected directly to a printed circuit board. The transparent conductive electrode (TCE) 31f is used to spread the charge or voltage from the wire electrode 31w across a pixel or row of pixels. The TCE 31f is a patterned film that, in most display applications, must be at least 50% transparent, and is preferably over 90% transparent. The TCE 31f must form good electrical connection with the wire electrode 31w (low interface resistance) and must be electrically connected to the wire electrode 31w along most of the length of the electrode. The TCE material does not have to have a high conductivity because it only needs to be conductive enough to spread the charge or voltage across the pixel width. The substrate 30 that houses the wires/TCEs stripes is preferably made of polymer, silicone or glass. Use of a thin polymer or silicone substrate 30 yields a light, flexible, rugged eSheet that may be curved, bent or rolled.

Using a wire combined with a TCE to form the electrode stripes allows for very high speed addressing of a very large display. The wire electrode, which is used to carry the bulk of the current along the length of the line, has a low resistive drop because it can be composed of a highly conductive material, like copper, and also has a large cross-sectional area compared to a metal film electrode (R=ρl/A). In order to get a metal film electrode with a low resistivity, the metal has to be deposited using a physical vapor deposition (PVD) process like e-beam evaporation or sputtering, then patterned and etched, which is very costly. Reasonable conductivity may be alternatively achieved using a screen printed silver paste; however, the silver paste has to be fired at elevated temperatures (~400° C.) to achieve any real conductivity, which is much too high a temperature for most polymers. Most metal conductive coatings that may be economically applied to polymer substrates have only slightly better conductivity (~5Ω/□) compared to the most conductive ITO films (~10Ω/□).

Controlling the addressing of a large display requires that the voltages applied to the electrodes be uniformly brought up to voltage along the entire length of the line especially if grayscale addressing is required. The lines have resistance along their length and are capacitively coupled to the orthogonal electrodes. The time for the far end of the line to come up to 98% of the total voltage is τ=4RC. Assuming a 3'×6' display at 20 dpi is used to address a 5 μm thick liquid crystal with an average dielectric constant of 15, then the total line capacitance is 62 nF. If the line is formed using a highly conductive transparent material with a sheet resistance of 100Ω/□ then the resistance of the entire line would be 144 kΩ and the line would take 8.9 ms to come up to 98% of the total voltage. If a 0.002" diameter copper wire is used to carry the current along the length of the electrode, the line resistance would be reduced to 15Ω and take less than 1 μs to come up to voltage.

The wire electrode may be composed of any composition; however using a low resistivity base material yields the most conductive wire. One potential issue with a highly reflective colored material like copper is that it changes the color of the electroded layer. One method of removing this reflective copper color is to coat the wire electrode with a black absorbing film. This black absorbing layer has to be electrically conductive so it can make good electrical connection to the transparent conductive electrode (TCE). The TCE is preferably composed of one or more of many different materials including, but not limited to, 1) a conductive polymer, such as that sold by H.C. Starck called Clevios™ or AGFA called Orgacon®, which also goes by the names of Poly(3,4-ethylenedioxythiophene) poly(styrenesulfonate) or [—$CH_2CH(C_6H_4SO_3H)$—]$_m$[—$CH_2CH(C_6H_4SO_3)$—]$_{0.33n}$/[$C_6H_4O_2S$—]$^{0.33+}$n or PEDT/PSS or PEDOT/PSS; 2) a nanotube or nanorod coating, such as composed of a single wall carbon nanotube or multiwall carbon nanotubes; or 3) a physical vapor deposited (PVD) film, such as indium tin oxide (ITO) or zinc oxide doped with fluorine (ZnO:F). There are many different types of TCE films that may be used. The above films are listed as examples only and are not intended to be an exclusive listing of all the different TCE films.

There are many different methods of applying the TCE coatings. The TCE coatings may be sprayed using a traditional spraying system, however, for some of the TCE coatings, like the nanotube solutions, it would be advantageous to use an ultrasonic sprayer to help break the nanotubes apart as they are sprayed. The TCE coating may also be sprayed using an airbrush, which is useful in that its spray opening may be very well controlled to only let small particles through, hence controlling any agglomerates. Alternatively, the TCE coatings may be printed, which would allow for a low cost method of patterning the lines. Some examples of the printing process include, but are not limited to, transfer printing, screen printing, inkjet printing, and intaglio printing. If a TCE slurry solution is used, then the TCE coating may alternatively be brush coated, dip coated, spin coated, or extruded. If the TCE coating is a hard coating, like ITO, then a physical vapor deposition (PVD) process is required, for example processes including, but not limited to, e-beam evaporation, sputtering, CVD, and arc spraying.

The TCE coating has to be patterned into lines to electrically isolate one wire with TCE from its adjacent electrode. If a precision printing process is used, then the TCE coating may be easily patterned during the deposition process. If a directional coating process like spraying or some of the PVD processes is used to deposit the TCE film, then a shadow mask may be used to pattern the TCE film into lines. The TCE coating may alternatively be patterned by applying an additional patterned coating, like photoresist, to protect the TCE during an etching process. The patterning and etching process may use several different masking films and methods of applying the masking films and may use a wet or dry etching process to pattern the TCE into lines. The TCE coating may alternatively be patterned into lines using a lift-off process, where prepattern lines are placed on the substrate at the points where the TCE is to be separated. Then, after the TCE film is deposited, the prepatterned lines are removed separating the TCE film into lines. The prepatterned lines may be a polymer, like photoresist, or hard lines like wire, fiber or thread that is removed once coated, which is very similar to a shadow mask. The TCE film may alternatively be cut into lines using a scraping tool or cut with a laser. The TCE film could also be cut by forcing wedge shaped line objects down into the coating. Adjacent TCE coatings may alternatively be electrically isolated by coating the film along the separation lines with a material that reacts with the TCE to destroy the conductive nature of the film. The conductive nature of the TCE film may also be destroyed using heat from a laser beam. There are many different methods of depositing a patterned transparent conductive electrode (TCE), the above methods are listed as examples only and are not intended to be an exclusive listing of all the different coating and patterning methods.

eSheet Structures

Figure 2A:
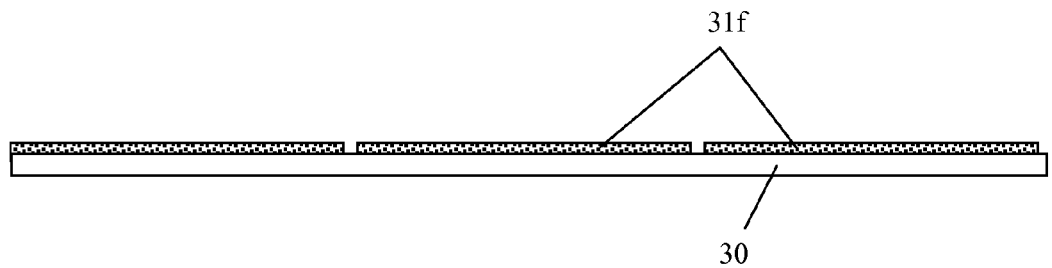
FIG. 2a schematically shows a cross-section of a substrate with an array of transparent conductive lines on a substrate.
Figure 2B:
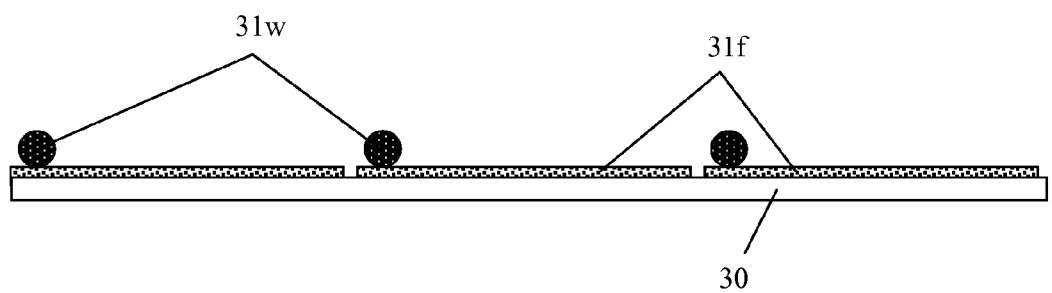
FIG. 2b schematically shows a cross-section of the structure in FIG. 2a with wire electrodes added to the transparent conductive lines.
Figure 2C:
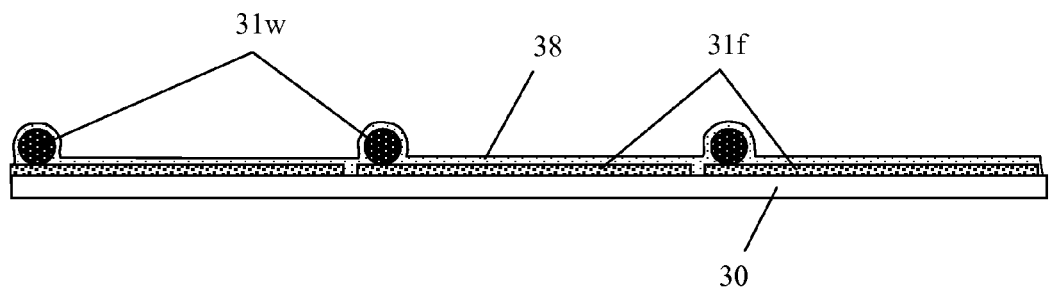
FIG. 2c schematically shows a cross-section of the structure in FIG. 2b with a lockdown film across the wire electrodes.

FIG. 2 shows a method of forming the electroded sheet where the wires 31w and the TCEs 31f are placed on a thin polymer or glass substrate 30 and locked down onto the substrate with a film or coating 38. This electrode configuration allows for electrical communication with the rest of the display through the thin polymer or glass substrate 30. This structure requires a voltage drop across the thin substrate 30, but if the thickness of the substrate 30 is very uniform, then the electric field is very uniform across the pixel and panel. FIG. 2a shows the first step in the process where the TCEs 31f are deposited in a pattern on the substrate 30. FIG. 2b shows wire electrodes 31w applied to the TCEs 311f. A lock down coating 38 is applied over the electrodes to hold them in place, as shown in FIG. 2c. Note that the patterned TCEs 31f do not have to be wide lines, but may have structure associated with them, such as sometimes used in a sustainer plate for a plasma display like a tubular plasma display discussed below.

Figure 3:
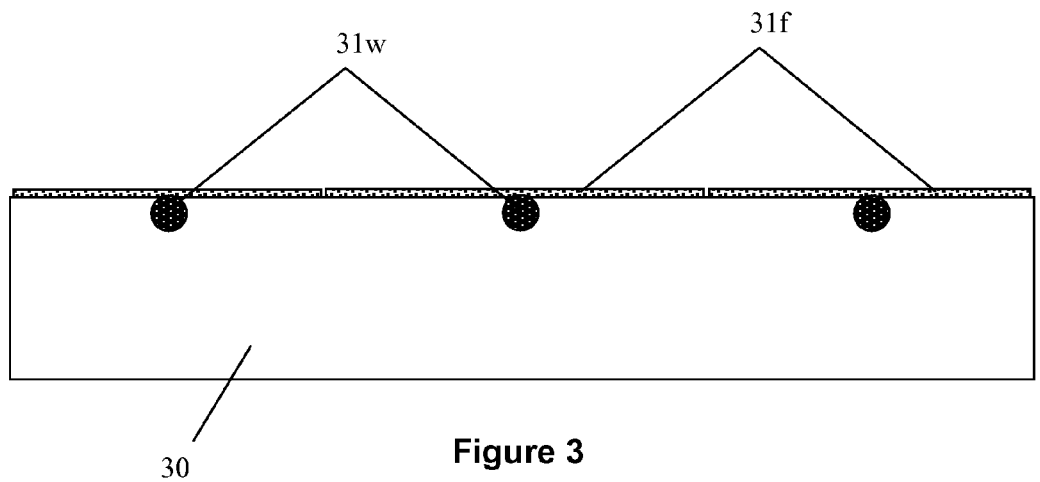
FIG. 3 schematically shows a cross-section of wire electrodes embedded in the surface of a substrate and electrically connected to transparent conductive electrodes (TCEs).

Some applications require that the electrodes are located on the surface that is in contact with the electro-optic material to either supply current to the electro-optic material, such as an electrochromic device or an organic light emitting display (OLED), or to maximize the voltage across the electro-optic material, like in a liquid crystal (LC) display. It is also imperative in most of these displays that the surface of the electroded sheet be flat. Therefore, the wire electrodes 31w have to be embedded into the surface of the substrate 30. FIG. 3 shows an example of an electroded sheet where the wire electrodes 31w are embedded into the surface of the substrate 30 and TCEs 31f are applied to the surface of the substrate 30 and electrically connected to the wire electrodes 31w. Although the substrate 30 may be glass, it is much easier to embed wire into the surface of a plastic plate or sheet.

Figure 4:
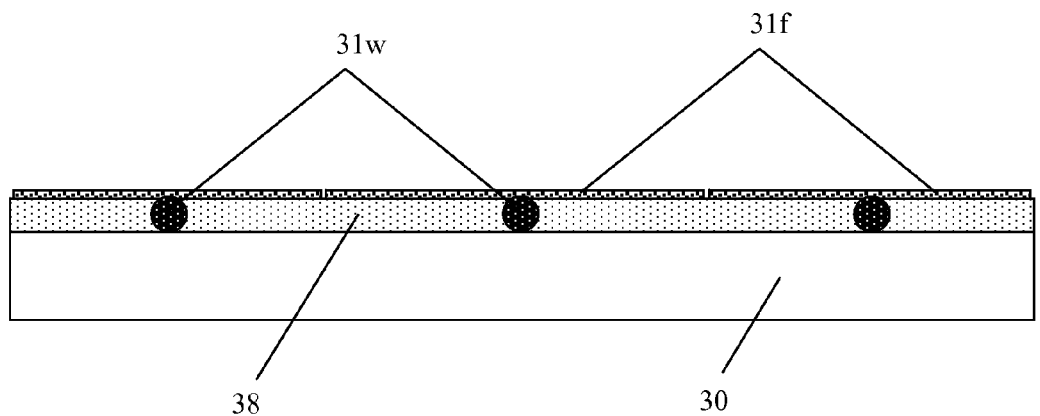
FIG. 4 schematically shows a cross-section of wire electrodes embedded in the surface of a polymer film on a substrate and the wire electrodes electrically connected to TCEs.

FIG. 4 show another example of wire electrodes 31w embedded into a substrate. In this case, a substrate 30 is coated with a polymer layer 38 containing wire electrodes 31w, which are connected to the TCE stripes 31f. The polymer layer 38 locking the wire electrodes 31w to the substrate may be formed using many different processes. The wires 31w may be extruded with the polymer layer 38 directly onto the surface, the wires 31w could be arrayed on the surface and coated with the polymer layer 38, or the substrate 30 could contain the polymer layer 38 and the wire electrodes 31w could be simply pushed into the polymer layer 38. The polymer layer 38 could be a free standing substrate and not require a second substrate 30. If a substrate 30 is required, then the substrate 30 may be composed of glass, however, if a flexible, rugged electroded sheet is required then it is advantageous to use a polymer substrate. One low cost, readily available flexible material is a polymer coated polyethylene terephthlate (PET, sold by DuPont under the trademark Mylar®) film.

Figure 5:
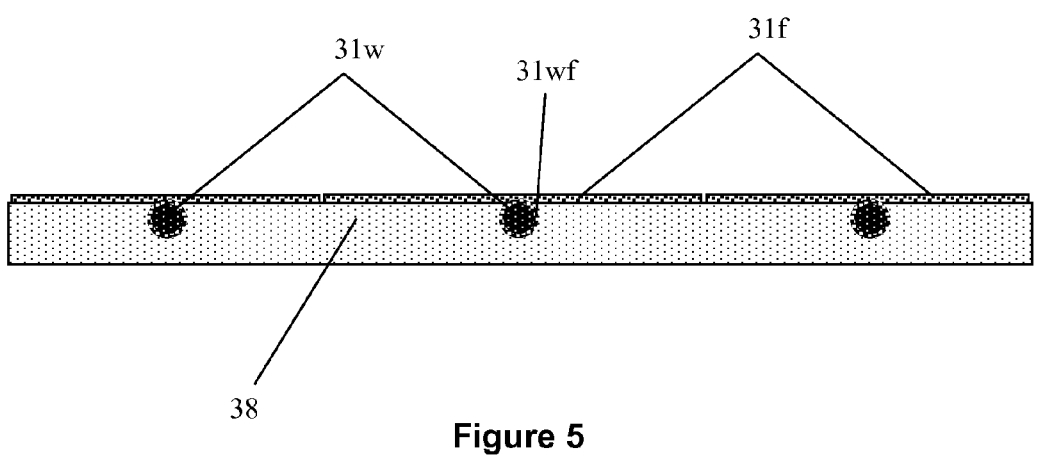
FIG. 5 schematically shows a cross-section of a structure similar to that in FIG. 4 where the wire electrodes are coated with an electronically conductive film.

FIG. 5 shows the wire electrodes 31w coated with a conductive coating 31wf in one embodiment of the present invention to lower interface resistance between the wire 31w and the TCE 31f. This wire conductive coating 31wf may be formulated to have a lower interface resistance with the wire electrode 31w. Adding nanotubes or nanorods to the wire conductive coating 31wf helps connect the wire electrode 31w to the transparent conductive electrode 31f. The wire coating 31wf may alternatively be black or absorbing to remove any reflection from the wire electrode 31w. For example, adding a black conductive coating to a copper wire 31w removes the "copper" tint in the layer. A wire coating 31wf also helps the wire 31w adhere to the polymer film 38. The wire electrode, which may have any cross-sectional shape including, but not limited to, round, oval, square, rectangular, or triangular shape, may also have surface structure to help it stick to polymer film 38.

eSheet Processes

FIG. 6 represents a method of creating an electroded sheet by forcing an array of wire electrodes 31w into a polymer coated 38 substrate 30 and then spray coating 31s TCE 31f lines onto the wires 31w using a mask 69. FIG. 6a shows forcing the wires 31w into the surface of the polymer film 38. Two flat glass plates 10a and 10b are sandwiched around the wires 31w and polymer coated 38 substrate 30. By applying force to the plates and heat to soften the polymer film 38, the wires 31w may be pushed into the polymer film 38 surface. Some examples of applying force to the plates 10 include, but are not limited to, using a ram, a pressurized bladder or a vacuum bag.

Figure 6A:
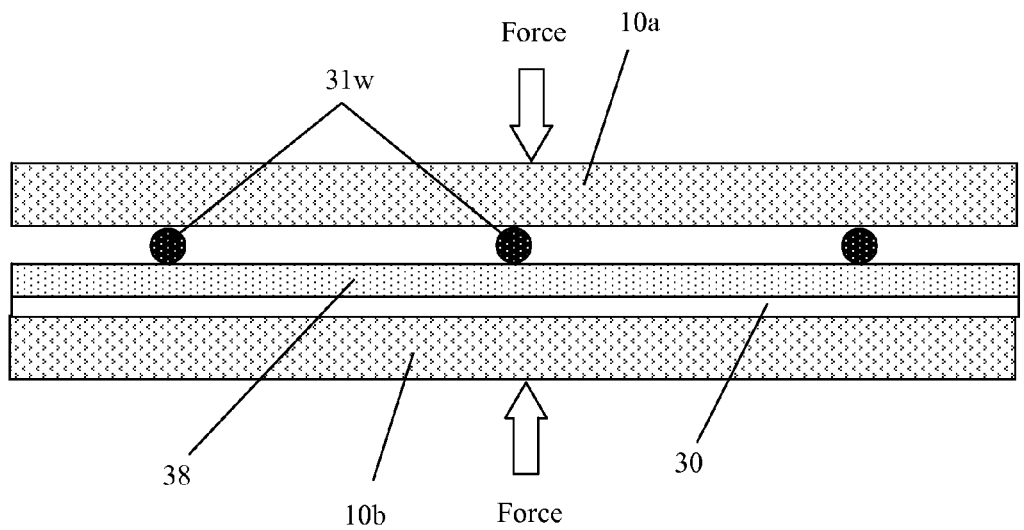
FIG. 6a schematically shows a method of using glass plates to force wires into the surface of a polymer coated substrate.
Figure 6B:
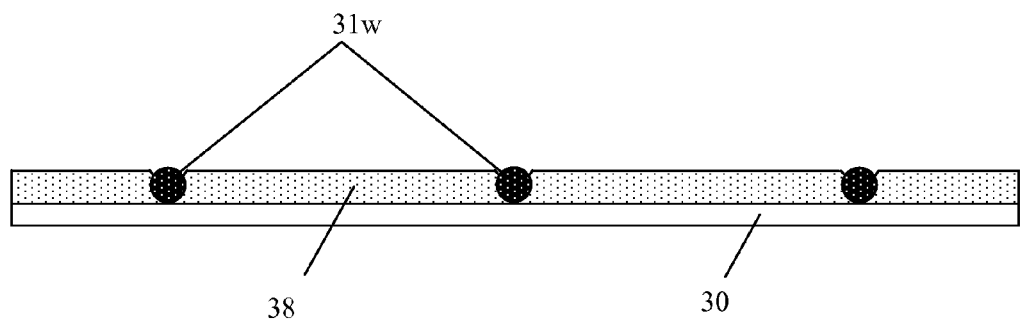

One advantage of using glass plates 10 to push the wires 31w into the surface of the polymer film 38 is that the glass plates produce a very flat surface with the wire electrode 31w and the polymer film 38 all in the same plane, as shown in FIG. 6b. This very flat surface provides for a well controlled electro-optic cell gap. Several different methods could be used to push the wire electrode 31w into the polymer 38 surface. The wires 31w and coated 38 substrate 30 may be pulled through a die or they may be pulled through or across rollers. The entire process may alternatively be done in a roll-to-roll process.

One advantage of using a polymer film 38 on a higher temperature substrate 30 like PET is that the PET substrate 30 will not soften during the wire 31w embedding process and thus acts as a backstop for the wire electrodes 31w. Therefore, the maximum final depth of the wire electrodes 31w into the polymer film 38 is limited to the total thickness of the polymer film (minus the extra volume that the wires displace). Therefore, if the diameter of the wire electrodes 31w is larger than the thickness of the polymer film 38, then the wire electrodes 31w are not totally embedded into the polymer film 38. These protruded wire electrodes 31w may be used to form spacers for an electro-optic material when the electroded sheet is placed against a second substrate.

Figure 6C:
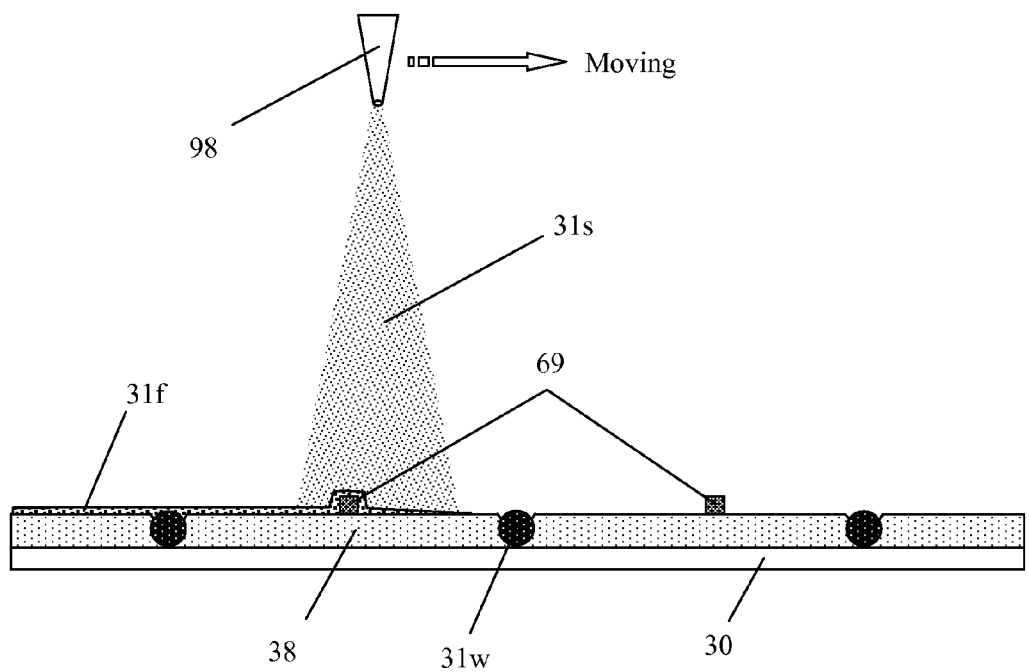
FIG. 6c schematically shows a process of patterning TCEs on the surface of a substrate.
Figure 6D:
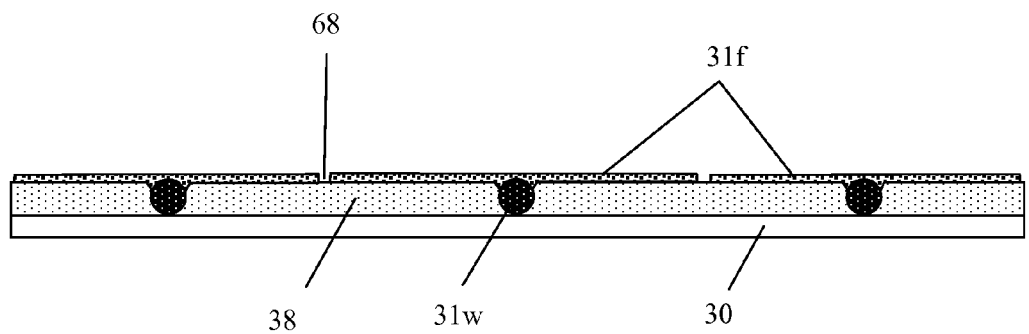
FIG. 6d schematically shows the final electroded sheet with the wire embedded in a polymer and electrically connected to TCEs.

Once the wires 31w are forced into the surface of the polymer film 38, transparent conductive electrode (TCE) lines 31f are patterned along the length of the wire electrodes 31w. FIG. 6c shows a method of using a sprayer 98 to spray 31s a transparent conductive material onto the wire electroded surface. The transparent electrode material 31f is shadowed or blocked from depositing on the surface using a shadow mask 69. Some examples for the shadow mask include, but are not limited to, wire, fiber, monofilament, or even a thread, which is preferably coated to reduce the "hair" on the sides of the thread. It is also advantageous to wrap the wire 31w embedded substrate 30 with the shadow mask 69 onto a curved surface to keep the shadow mask 69 tight against the surface of the polymer film 38 during the spraying 31s process. When the shadow mask 69 is removed, it creates openings 68 in the TCE 31f material, hence patterning it into lines and electrically isolating each electrode line from its adjacent electrode counterpart, as shown in FIG. 6d. Once the wire electrodes 31w are embedded into the surface of the polymer film 38, any process may be used to deposit and pattern the TCEs 31f.

An alternative method of shadow masking coats the wire 31w exposed polymer surface 38 with the TCE 3 if and uses a laser to ablate the TCE in the isolation region 68 to form patterned TCE stripes 31f. Laser etching the TCE 31f between the wire electrodes 31w will require that the laser pulse is very well controlled such that the surface of the polymer substrate 38 is not etched away. One method to create a well etched or isolated region laser etches the TCE 31f over the wire electrode just off the peak where the polymer substrate 38 has wrapped around the wire 31w. Cutting through the TCE 31 fat this location will provide a backstop (the wire electrode 31w) to stop the laser beam from etching through the eSheet substrate 38. The wire 31w backstop will allow for a much higher laser power resulting in faster etch rates. The wire electrode 31w at the base of the isolation region will also provide an electrode to support an electric field for any electro-optic material that is subsequently placed against the eSheet surface and switched.

Figure 7A:
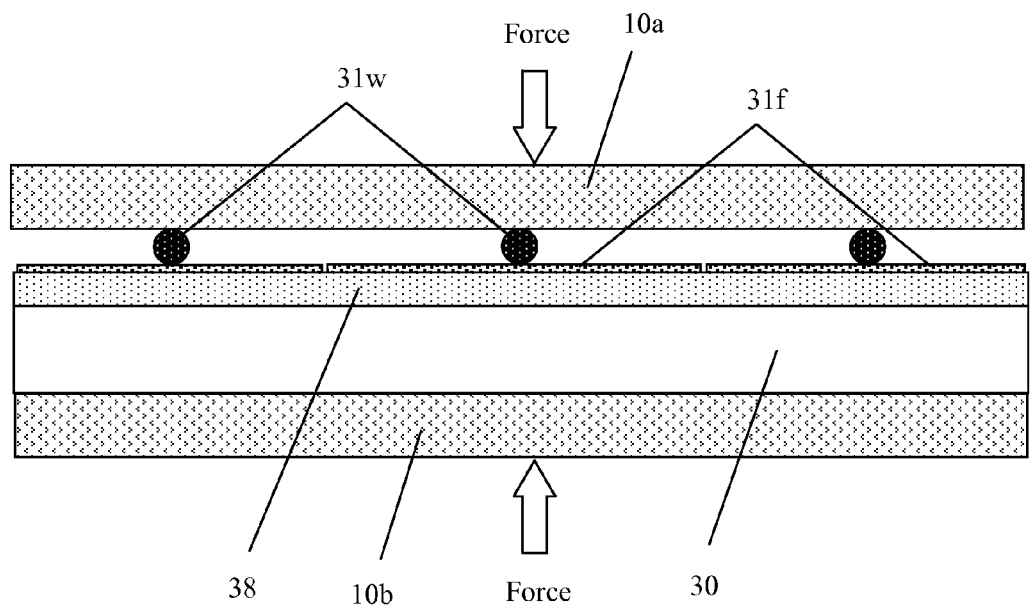
FIG. 7a illustrates a method of placing wire electrodes over TCEs and forcing them to flow into the surface of a polymer.
Figure 7B:
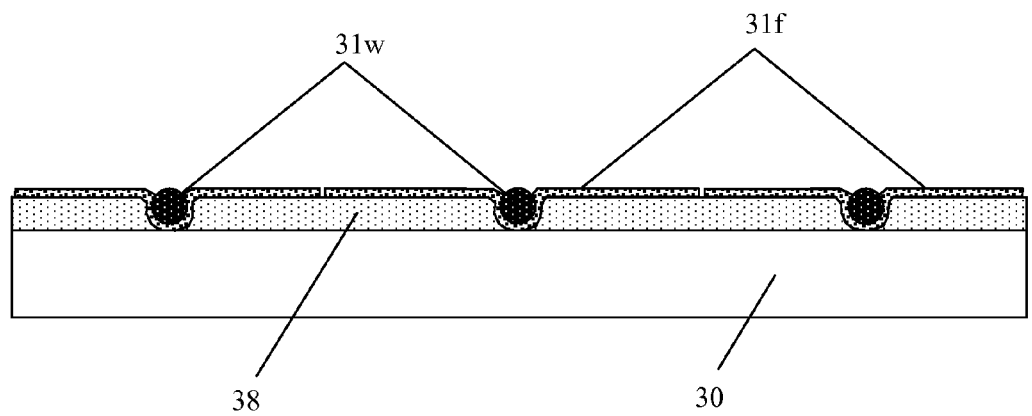

FIGS. 7 and 8 show methods of creating the electroded sheet which are similar to that explained in FIG. 6 except the TCEs 31f are placed under or over the wire electrodes 31w before they are pushed into the surface of the polymer film 38. FIGS. 7a and 7b show a method of placing the patterned TCEs 31f under the wire electrodes 31w as they are forced into the polymer film 38 coated substrate 30. This method of forming the electroded sheet requires that the TCE 31f coating is thermoformable or can flow. Some conductive polymer films are thermoformable and the nanotube coatings are flowable to some degree, however most of the PVD films like ITO tend to break up when forced to flow.

Figure 8A:
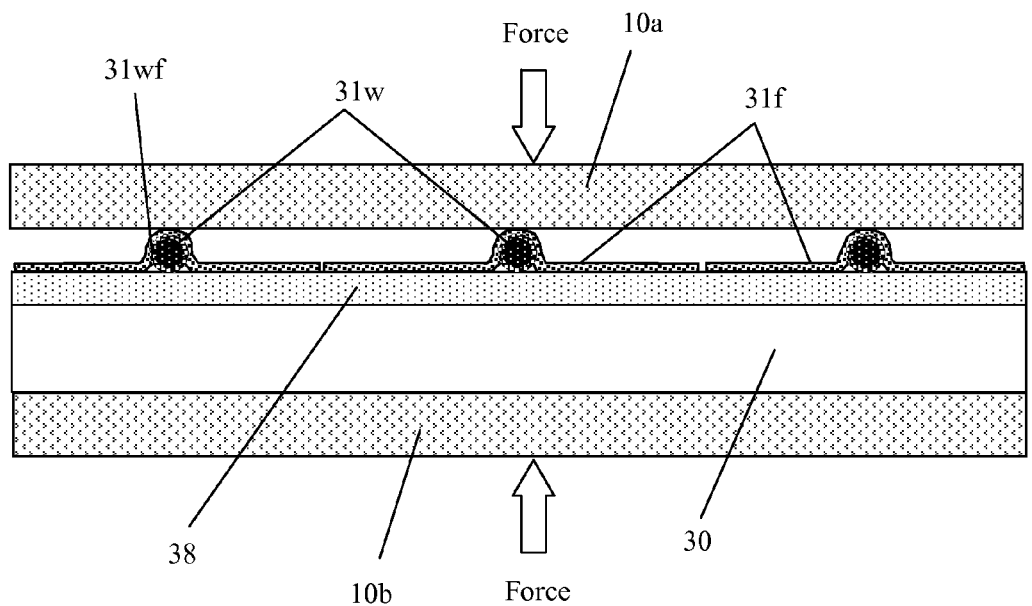
FIG. 8a illustrates a method of placing TCE lines over wire electrodes and forcing them to flow into the surface of a polymer.
Figure 8B:
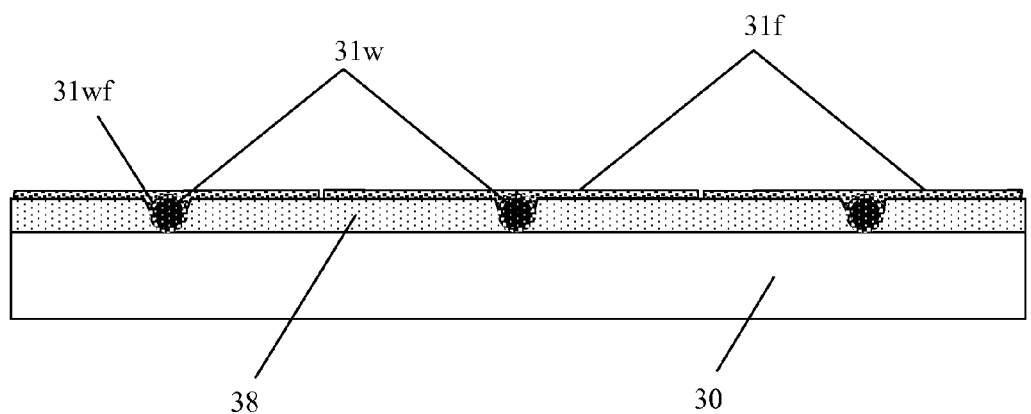

FIGS. 8a and 8b show a method of covering the wire electrodes 31w with patterned TCEs 31f and forcing them to flow into the surface of polymer film 38. Coating the wire electrodes 31w with a conductive film 31wf helps keep the wires 31w electrically connected to the TCEs 31f during the flowing process. Also if the TCE 31f is composed of carbon nanotubes, then when the flat glass plate 10 pushes against the nanotube coating any nanotubes sticking up will be either forced flat or into the polymer film 38, such that they do not protrude into electro-optic material and affect the local electric field in the electro-optic layer after display assembly.

Patterned Plate Process

Another method of forming the Wire in Sheet (WiS) structure wraps a plate with the electrode wire and presses a substrate into the wire electrodes. This process is very similar to that explained above in FIGS. 6 and 7. FIGS. 9 and 10 show the method of applying the transparent conductive electrode (TCE) stripes 31f to a flat plate 10a then aligning the wire electrodes 31w over the TCE stripes 31f and then placing the substrate 38 or 77 into the electrodes 31w and 31f.

Figure 9A:
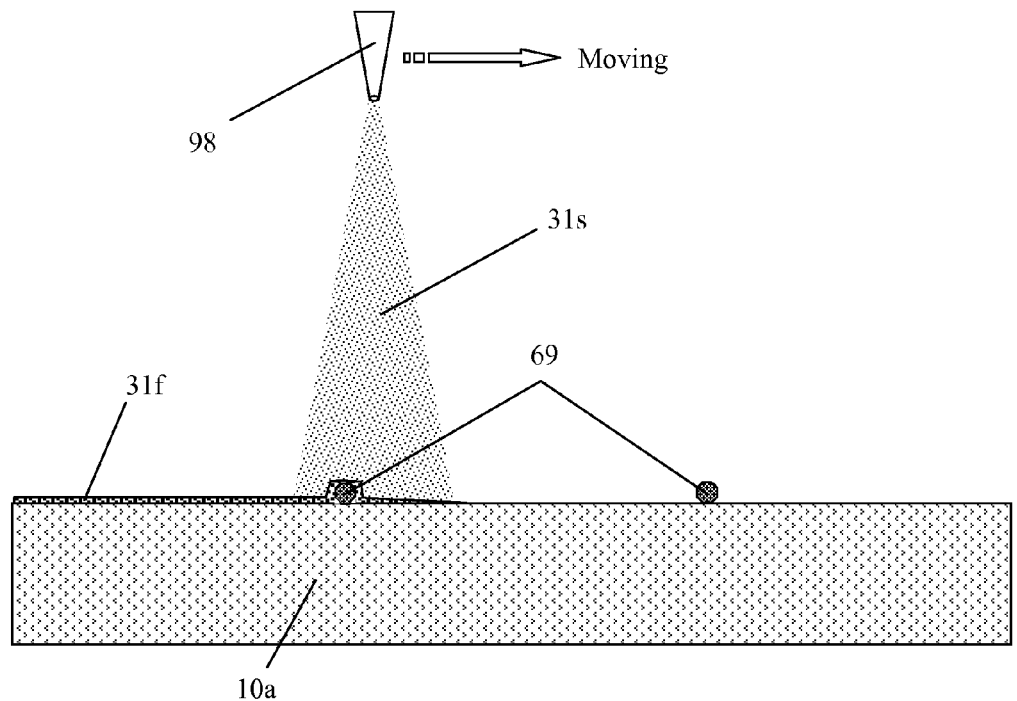
FIG. 9a schematically illustrates patterning transparent conductive electrodes on a flattening plate.
Figure 9B:
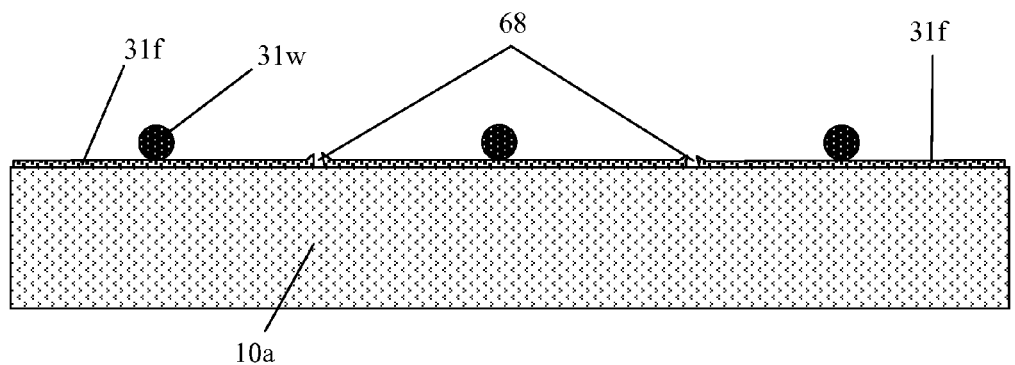
Figure 9C:
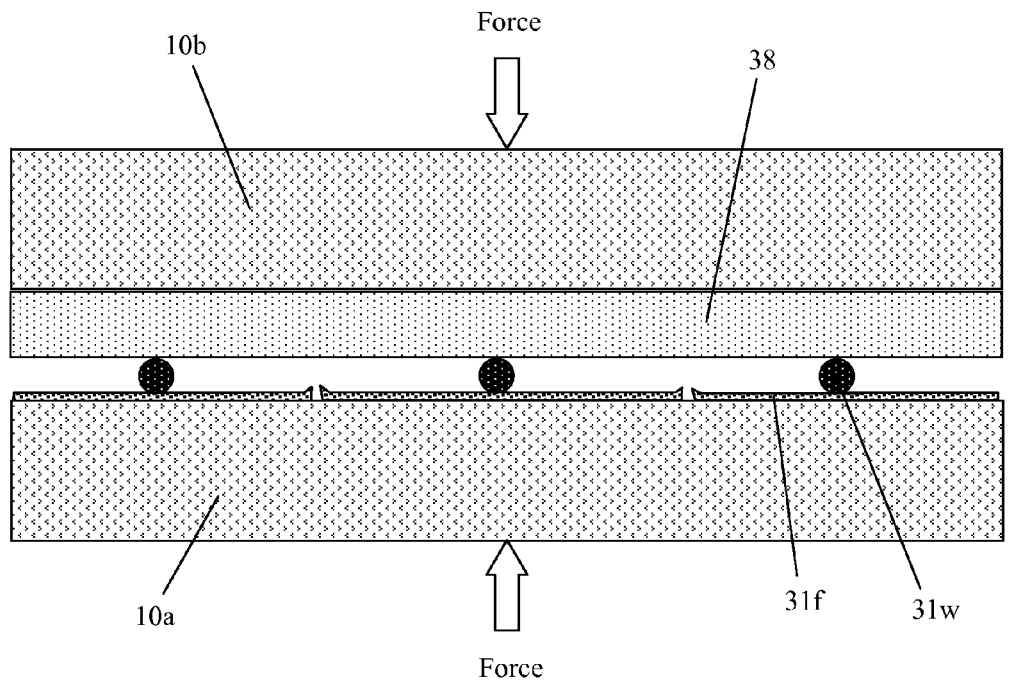
FIG. 9c schematically illustrates forcing a thermal polymer to flow around the wire electrodes and down to the transparent conductive electrode surface.
Figure 9D:
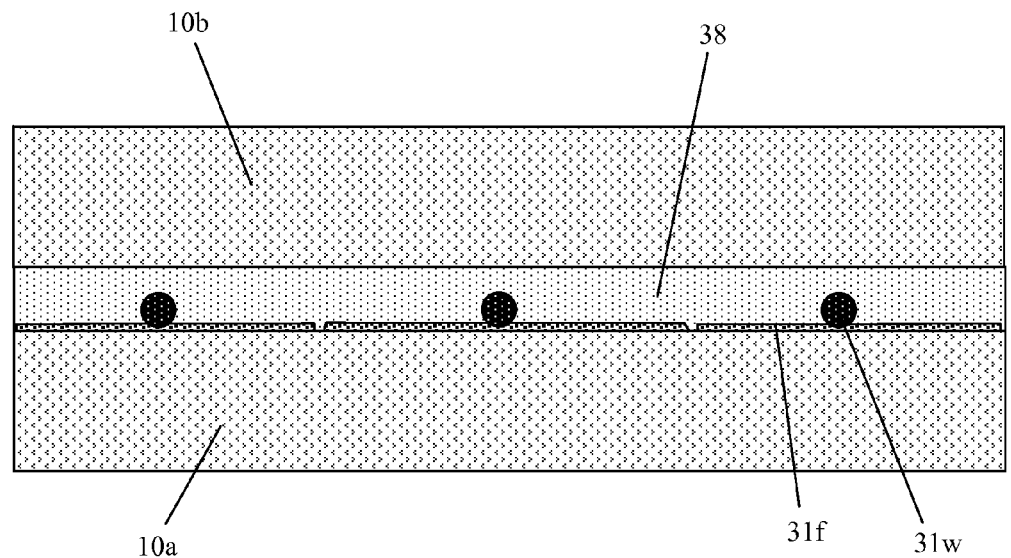
FIG. 9d schematically illustrates the thermal polymer in FIG. 9c flat against the electroded surface.
Figure 9E:
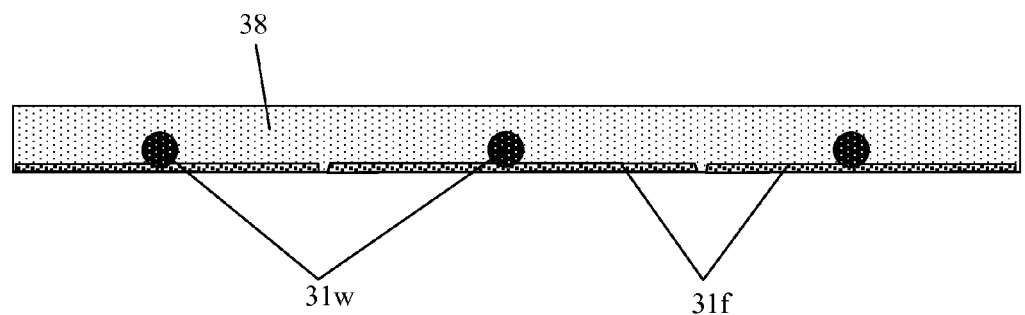
FIG. 9e schematically shows the finished eSheet after the flattening plates are removed in FIG. 9d.

FIG. 9a shows a method of patterning TCE stripes 31f on a flat plate 10a. The method shown in FIG. 9a uses a spraying process; however any method of patterning TCE stripes 31f on a flat plate 10a may be used. Many of these TCE stripe 31f deposition and patterning processes were discussed above. To form the patterned TCE stripes 31f in FIG. 9a, masking lines 69 are placed on the surface of a flat plate 10a, such as a glass plate coated with a release layer. The surface of the plate 10a is then sprayed 98 with the transparent conductive electrode material 31s. Removing the masking lines 69 creates an opening 68 in the transparent conductive electrode film to form patterned TCE stripes 31f, as shown in FIG. 9b. Wire electrodes 31w are then arrayed and aligned over the TCE stripes 31f and a thermal formable polymer substrate 38 is placed over the wire electrodes 31w. A second plate 10b is plated over the polymer substrate 38 and heat and force is applied to the top 10b and bottom 10a plates, as shown in FIG. 9c. A vacuum will have to be pulled in the electrode region in order for the polymer substrate 38 to flow around the wire electrodes 31w and down tight against the TCE stripes 31f without any bubbles getting trapped in the interface, as shown in FIG. 9d. The eSheet, shown in FIG. 9e, is totally formed after the top and bottom plates 10b and 10a are removed after the thermal forming steps.

Surface structure can be added to the electroded sheet surface during the thermal forming step by using a plate 10a or 10b with the inverse of the desired structure. Using a textured or stimpled surface on the top plate 10b will form an antiglare surface on the non-wire side of the electroded sheet. A lens array could also be formed in the surface of the eSheet by using a top plate 10b with the molding lens array formed in the surface. If the electroded sheet is used for a liquid crystal display then the liquid crystal alignment layer can be formed into the eSheet surface on the transparent conductive electrode side of the eSheet. Other textures can be formed in the electroded side of the eSheet for use in liquid crystal displays to assist the liquid crystal materials to latch into different states. One such structure or anchoring layer is used in BiNem® displays presently being developed by Nemoptic.

Figure 10A:
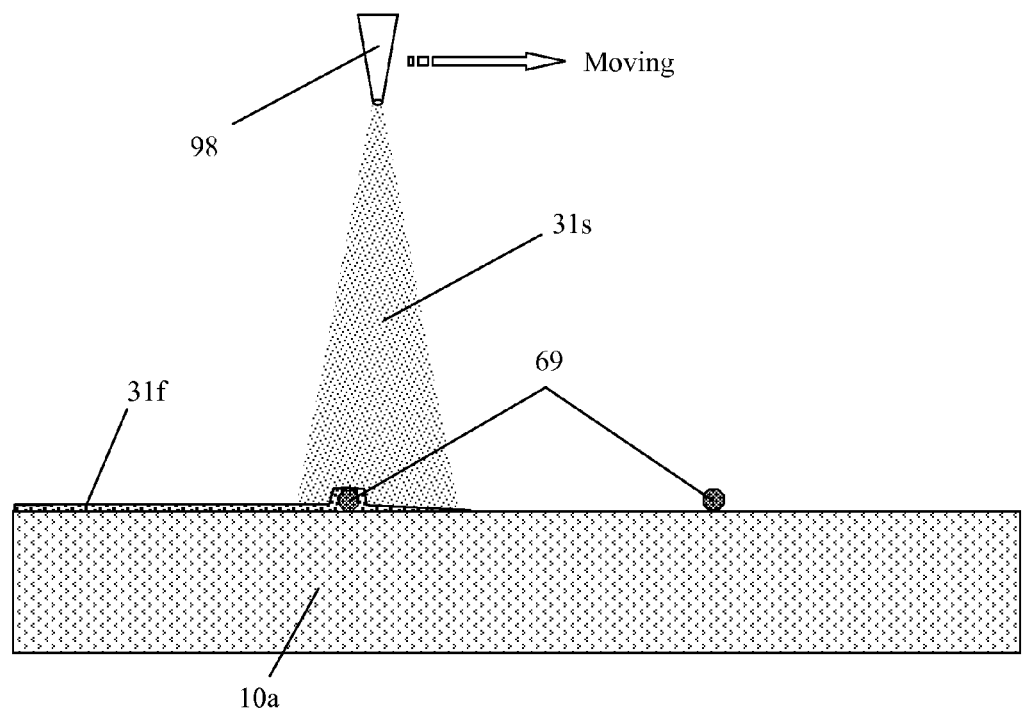
FIG. 10a schematically illustrates patterning transparent conductive electrodes on a flattening plate.
Figure 10B:
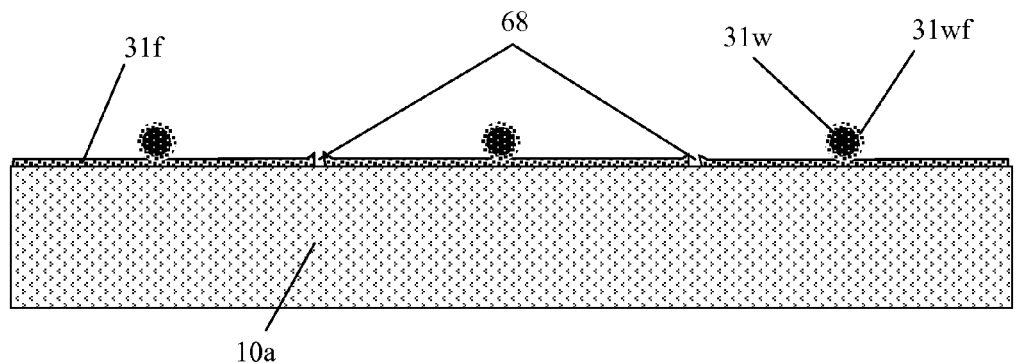

FIG. 10 shows another method of forming an electroded sheet starting by patterning transparent conductive electrode stripes 31f on a flat plate 10a, as shown in FIG. 10a. Although a line masking 69 and straying 98 technique is shown, virtually any process can be used to apply a pattern the TCE stripes 31f. After the TCE stripes 31f are formed, an array of wire electrodes 31w are arrayed over and aligned to the TCE stripes 31f, as shown in FIG. 10b. The wire electrodes 31w could be coated with a conductive coating 31wf to assist in forming a stronger electrical bond to the TCE stripes 31f. The conductive coating 31wf could also be black to remove any reflection or color from the wire electrodes 31w. The substrate material 77 could be then applied over the electrodes 31w and 31f, as shown in FIG. 10c. In this example, the substrate material 77 is very fluid and as the substrate material 77 is applied to the surface of the electrodes 31, it flows around the wire electrodes 31w and down to the TCE stripes 31f. The substrate material 77 could be composed of any material that can flow and then set-up to form a solid eSheet substrate base. The substrate material 77 may be a thermal polymer that is applied at elevated temperatures and forms a solid substrate upon cooling. The substrate material 77 may be a thermal set material, such as an epoxy, that sets-up under heat or a chemical reaction. The substrate material 77 may be a UV curable material that is set-up under ultraviolet light. The substrate material 77 may alternatively be a silicone-based material. FIG. 10c shows the substrate material 77 being poured out of a container 79 onto the electrodes 31. There are many different methods of applying the substrate material 77 and molding it to the electrode 31 surface. Some of these methods include, but are not limited to, applying a film of the material 77 through a slot or rollers, rolling or doctor-blading, screen printing, or spraying. A vacuum may need to be applied to the forming eSheet during or after the substrate material 77 is applied to remove any trapped air from the substrate 77—electrode 31 interface. Once the substrate material 77 is applied to the electrode 31 surface, as shown in FIG. 10d, it can be removed from the flat plate 10a to form an eSheet, as in FIG. 10e. An additional rigid or flexible sheet may be attached to the surface of the substrate 77 for better mechanical support, chemical or UV protection, or any other added benefit, such as a lens array.

One advantage of the patterned plate process, explained above and shown in FIGS. 9 and 10, is that the alignment between the wire electrodes 31w and the TCE stripes 31f are preformed on the plate 10a. Therefore the alignment is not done after the wires 31w are embedded in the polymer substrate 38, which tends to shrink and change shape during the wire embedding process making it difficult to subsequently align the TCE stripes 31f to the embedded wire electrodes 31w. Another advantage is that the eSheet is formed in a single thermal or curing cycle and does not require a post flattening process step.

Drum Process

The above examples all explain methods of pushing the wire electrodes 31w into a polymer substrate 30 or a polymer film 38 or vise versa. Pushing the wire electrodes 31w into the substrate 30 or 38 with a plate 10 creates an electroded substrate 30 or 38 where the wire electrodes 31w are even with the top of the substrate and the plate 10 creates a very flat surface. However, the plate 10 is in contact with the polymer surface 30 or 38, which may create contamination or cause the polymer substrate 30 or 38 to stick to the plate 10. Another method of placing the wire electrodes 30w into the polymer surface is to force the wire electrodes 31w to flow into the polymer 30 or 38, such as tensioning wires 31w on a curved polymer 30 or 38 surface.

Figure 11:
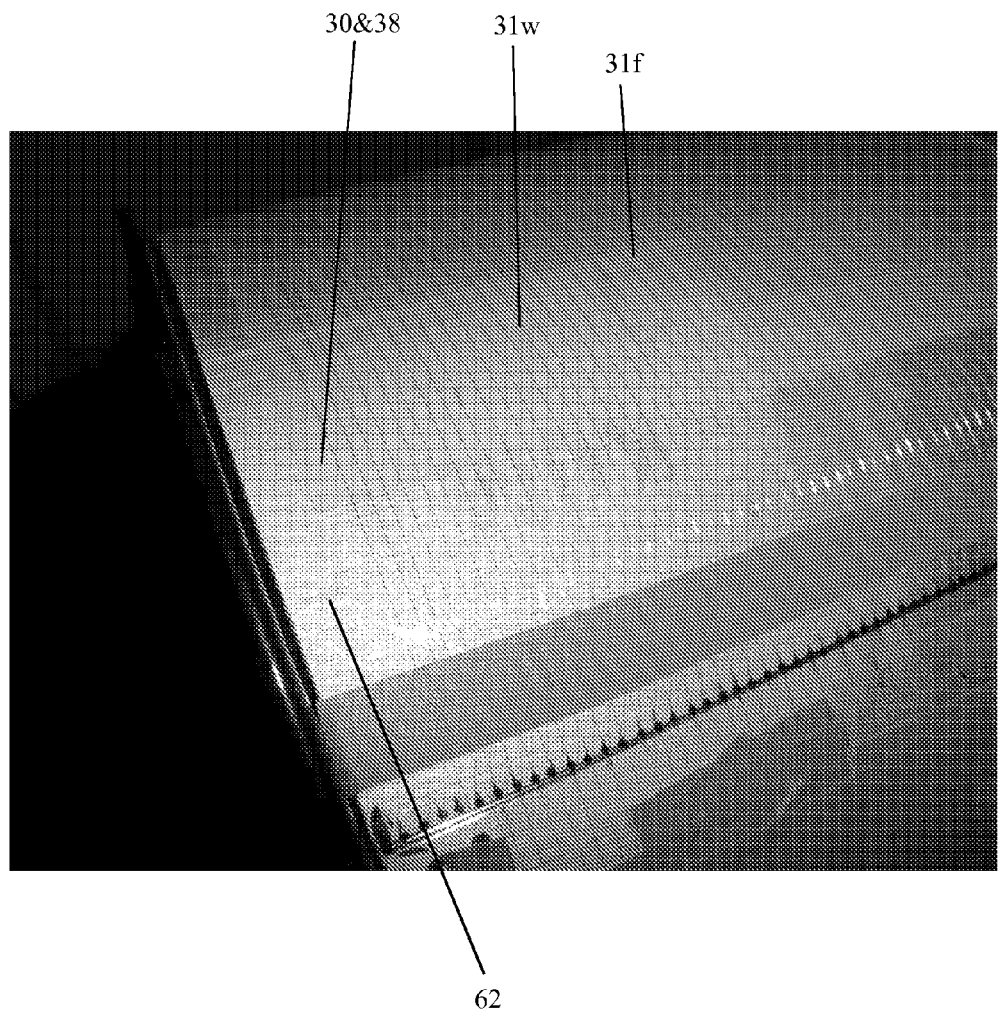
FIG. 11 is a photograph of a drum showing the process of embedding wires into a polymer coated PET sheet.

FIG. 11 shows a method of using a drum 62 to force a polymer 38 coated substrate 30 out into wrapped wires 31w. The drum 62 is wrapped with a polymer 38 coated substrate 30 (like a PET substrate) with the polymer coating 38 facing outward. The wire electrode 31w is then wrapped around the drum 62 across the surface of the polymer 38 coated PET substrate 30. The wrapped drum 62 is then heated to soften the polymer coating 38. During the temperature change, the drum 62 and the wire 31w expand. Choosing a drum 62 material that has a higher expansion coefficient than the wire 31w places the wire 31w under tension and forces the wire 31w into the surface of the polymer 38. The effective length of the wire 31w on the drum 62 after the increase in temperature $\Delta T$ as a result of the expansion of the drum is given by $$L_w(\Delta T_D) = \pi[d_D(1+CTE_D\Delta T)+2t_s+2r_w] \qquad \text{Equation 1}$$

where $d_D$ is the diameter of the drum 62, $CTE_D$ is the coefficient of thermal expansion of the drum 62, $t_s$ is the thickness of the PET substrate 30 and $r_w$ is the radius of the wire electrode 31w. The effective length of the wire 31w on the drum 62 after the increase in temperature $\Delta T$ as a result of the expansion of the wire is given by $$L_w(\Delta T_w) = \pi[(d_D+2(t_s+t_f)+2r_w)(1+CTE_w\Delta T)] \qquad \text{Equation 2}$$

where $CTE_w$ is the coefficient of thermal expansion of the wire 31w and $t_f$ is the polymer film 38 thickness. Note that these equations assume that the wire electrode 31w has sunk through the polymer film 38 and is resting on the PET substrate 30 surface. If the effective length of wire 31w as a result of wire expansion (Equation 2) is longer than the effective length of wire 31w as a result of drum 62 expansion (Equation 1) then the wire 31w does not sink into the PET substrate 30 unless the wire 31w is sufficiently tensioned when wrapped onto the drum 62. To calculate the length of the wire 31w before the wire 31w sinks through the polymer film 38 leading to the maximum stress on the wire 31w, the thickness of the polymer film 38 should be added to the substrate 30 thickness $t_s$. The total stress on the wire 31w after the increase in temperature $\Delta T$ and sinking into the PET substrate 30 surface is simply given by Youngs Modulus of the wire material, $YM_w$, times the strain ($\Delta L/L$) or $$\text{Stress}_{\Delta T} = YM_w[L_w(\Delta T_D)-L_w(\Delta T_w)]/L_w(\Delta T_w) \qquad \text{Equation 3}$$

Note that the diameter of the drum 62, the change in temperature, ΔT, and the difference in expansion coefficient between the drum 62 and wire 31w materials have the largest effects on the wire 31w stress at the elevated temperature.

As the temperature increases, the drum 62 expands to tension the wire 31w and the polymer film 38 softens such that the wire 31w sinks into the polymer film 38. The wire 31w stops once the wire 31w reaches the PET substrate 30, which does not soften at the elevated temperatures. Choosing a polymer film 38 thickness equal to the diameter of the wire 31w places the surface of the wire 31w and the surface of the polymer 38 coated PET 30 at the same level. However, when the wire 31w is forced into the polymer film 38 it displaces the same volume of polymer 38 material. Since there is no plate pressing down on the surface, small mounds of polymer material 38 push-up on the sides of the wires. These polymer mounds may be flattened during a post flattening process. A transparent conductive electrode (TCE) 31f may be patterned onto the wire electrodes 31w after they are embedded into the polymer film 38. Since the wire 31w containing polymer 38 substrate 30 is already wrapped on a drum 62, the simplest process to pattern the TCE 31f is to use a wire masking process. A second wire or a thread mask 69 may be wrapped onto the drum 62 between the wire electrodes 31w. Wrapping the wire or thread mask 69 under tension places it very tight onto the polymer film 38. Spraying the drum 62 with the TCE 31f and unwinding the wire or thread mask 69 creates a patterned TCE 31f. Note that any areas on the polymer 38 coated PET 30 may be masked before spraying the TCE 31f to create non-coated areas.

If a slot is placed across the surface of the drum 62 and the polymer 38 coated PET 30 is not placed across the slot, then a circuit board could be plugged into the wire electrodes 31 and soldered into the wires 31w. Therefore, when the wires 31w are finally cut a wire 31w electroded sheet with TCE 31f connected to a printed circuit board is formed off of a single drum 62.

The wire may alternatively be tensioned on the drum 62 using many other different methods. The drum 62 may be composed of two or more pieces and the pieces could be forced outward to place tension on the wire 31w. Force on the wire 31w may alternatively be applied be pushing or pulling the wires 31w. For example, a slot may be placed in the drum 62 and a printed circuit board may be connected into the wires 31w and pulled toward the center of the drum 62 in part tensioning the wires 31w.

Arced Plate Process

Figure 12:
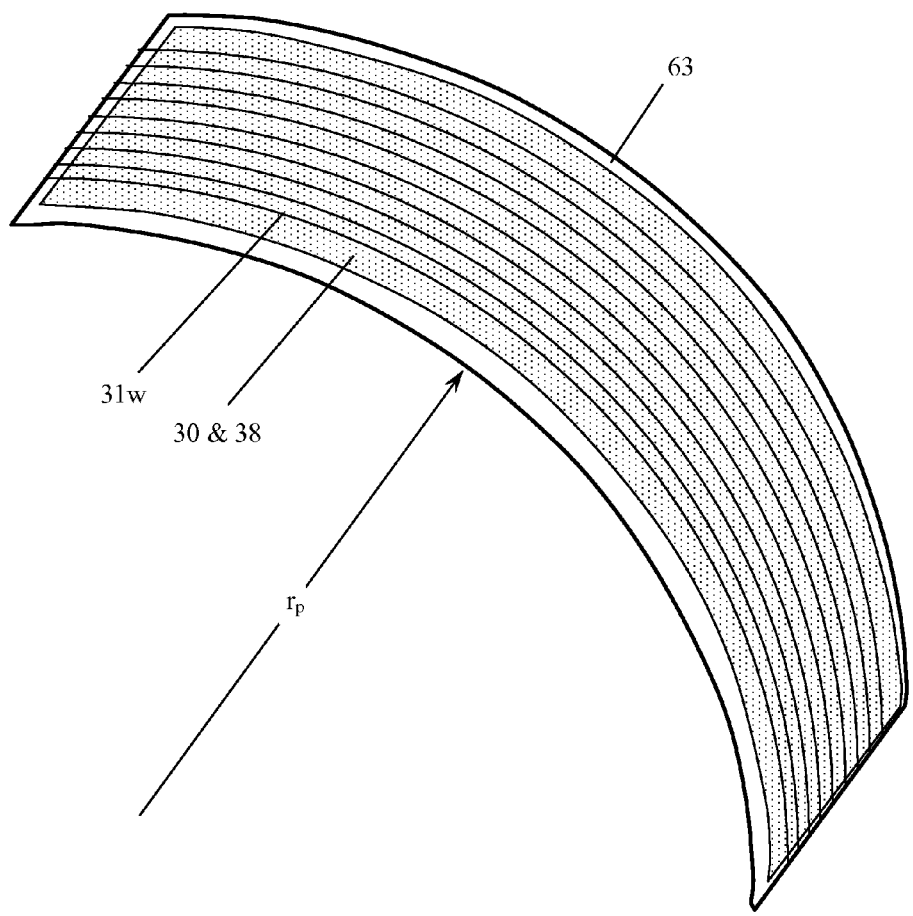
FIG. 12 schematically illustrates the process of bending a sheet to force wires to flow into a polymer coated substrate.

FIG. 12 shows a method of using a bent plate 63 to force a polymer 38 coated substrate 30 out into wrapped wires 31w. This method uses a process similar to the drum process explained above in FIG. 11. A polymer 38 coated PET substrate 30 is placed on a plate 63 and wrapped with the wire electrode 31w on a set pitch. Note that printed circuit boards with an edge connector may be attached to the ends of the plate 63 to set the pitch of the wire 31w and allow for direct connection to the drive electronics. After the wire 31w is wrapped around the plate 63, the plate 63 may be bent away from the wires 31w, which allows the wires 31w to be strung extremely straight. The plate 63 may then be bent toward the wires 31w to a given radius of curvature, $r_p$. Bending the plate places tension on the wire electrodes. The amount of tension or stress on the wires 31w is given by $$Stress_{bend} = YM_w\{[(r_p+t_s+r_w)/(r_p-r_w)]-1\} \qquad \text{Equation 4}$$

where $r_p$ is the radius of curvature of the plate. The plate 63 may be bent in many different ways. Some examples include, but are not limited to, bending the plate 63 over a mandrel or drum, pushing the center out of the plate 63, squeezing the plate 63 from the top and bottom, or sagging the plate. After the plate 63 is bent, the plate 63 is placed in an oven and the increased temperature used to soften the polymer 38 places an additional stress on the wire due to the difference in thermal expansions between the plate 63 and wire 31w materials. This stress is identical to that explained above in Equations 1-3 except the diameter of the drum, $d_D$, is replaced by twice the radius of curvature of the plate, $2r_p$. Therefore, the total stress on the wire 31w is the combination of the two stresses. Note that the total stress placed on the wire 31w has to stay well below the yield stress of the wire 31w material to guarantee that the wire 31w does not break. Two or more plates 63 may alternatively be used in this process. The plates 63 have their perspective polymer 38 coated PET substrates 30 and are placed back-to-back (or in a polygon). Therefore, when the wire 31w is wrapped on the plates 63, two or more separate electroded polymer sheets are produced during the process.

After the wire electrodes 31w are embedded into the polymer 38 coated PET substrates 30, the TCE 31f may be patterned onto the wire electrodes 31w. A similar process to that just explained to embed the wire 31w into the polymer 38 could be used. The plate(s) 63 may be flattened and a wire or thread mask 69 may be wrapped around the plate(s) 63 between the wire electrodes 31w. The plate(s) 63 may be bent to spring the wire or thread mask 69 straight and then the plate(s) 63 may be bent to tension the wire or thread mask 69. After the surface of the wire 31w electroded substrate 30 is sprayed with a TCE 31f, the wire or thread mask 69 may be unwound to create a patterned TCE 31f. The printed circuit boards may be soldered onto the wire electrodes 31w to create an electroded sheet with attached electronics for an information display.

Maskless TCE Coating Process

Figure 13:
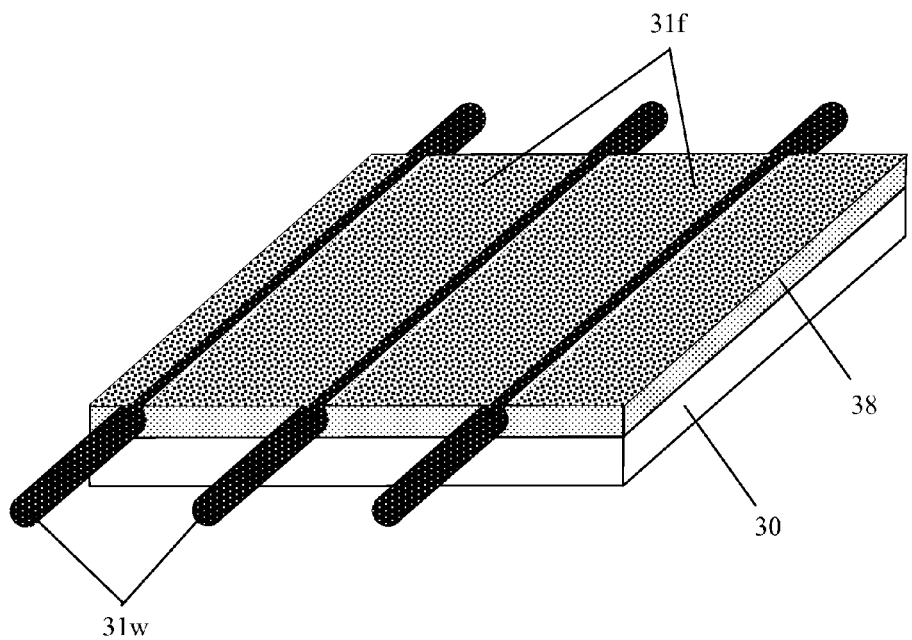
FIG. 13 schematically represents an electroded sheet formed using a maskless process.

FIG. 13 shows a schematic of a section of the electroded sheet. The electroded sheet includes a base material 30 such as PET, coated with a polymer 38, into which the wire electrodes 31w are embedded. Note that the eSheet substrate could also be a single polymer sheet 38. A transparent conductive electrode (TCE) coating 31f is applied to the surface of the polymer 38 and wires 31w. The TCE coating 31f is patterned such that each stripe only contacts one wire 31w, with a small area of no coating next to the adjacent wire 31w. This will allow for current to pass through an individual wire 31w, spread the charge to the side through the TCE 31f, stopping just before it reaches the adjacent wire 31w. In this manner, individual lines may be addressed by attaching the individual wires 31w to a circuit board and separately addressing them as required for the specific images.

FIG. 14 shows the method of making an electroded sheet using a "maskless" process. FIG. 14a shows wire electrodes 31w arrayed on the surface of a polymer substrate 38/30. The structure in FIG. 14a is preferably obtained by wrapping a PET 30/Polymer 38 sheet (preferably preshrunk) on a drum (of higher thermal expansion than the wire) of sufficient diameter to give the length and width of electroded sheet desired. The sheet is wrapped such that the PET 30 is against the drum. The wire 31w is wrapped around the covered drum, controlling the tension on the wire 31w, and traversing either the wire 31w or the drum to give the desired spacing between the wires 31w. The beginning and the end of the wire 31w is secured to the polymer or drum for subsequent processing.

The wire 31w may be wrapped using guides or any other means desired to control the spacing and uniformity.

Figure 14A:
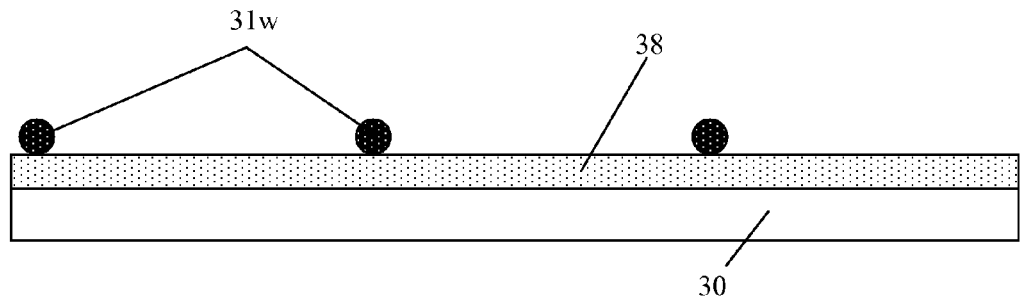
FIG. 14a is a schematic of a PET/Polymer sheet with wires positioned on the polymer prior to embedding into the polymer.

An alternate method to form the structure in FIG. 14a places the PET 30/Polymer 38 sheet on a stiff plate, and wraps back and forth across the sheet with guides/pins at either end to hold the wire 31w and give the proper spacing. Tension in the wire 31w must be controlled. The beginning and the end of the wire 31w is attached to the polymer or plate by tape or any other means. The wrapped stiff plate is then placed in a fixture and bent to a radius to put the desired tension on the wires 31w and hold them 31w tight to the plate.

Figure 10C:
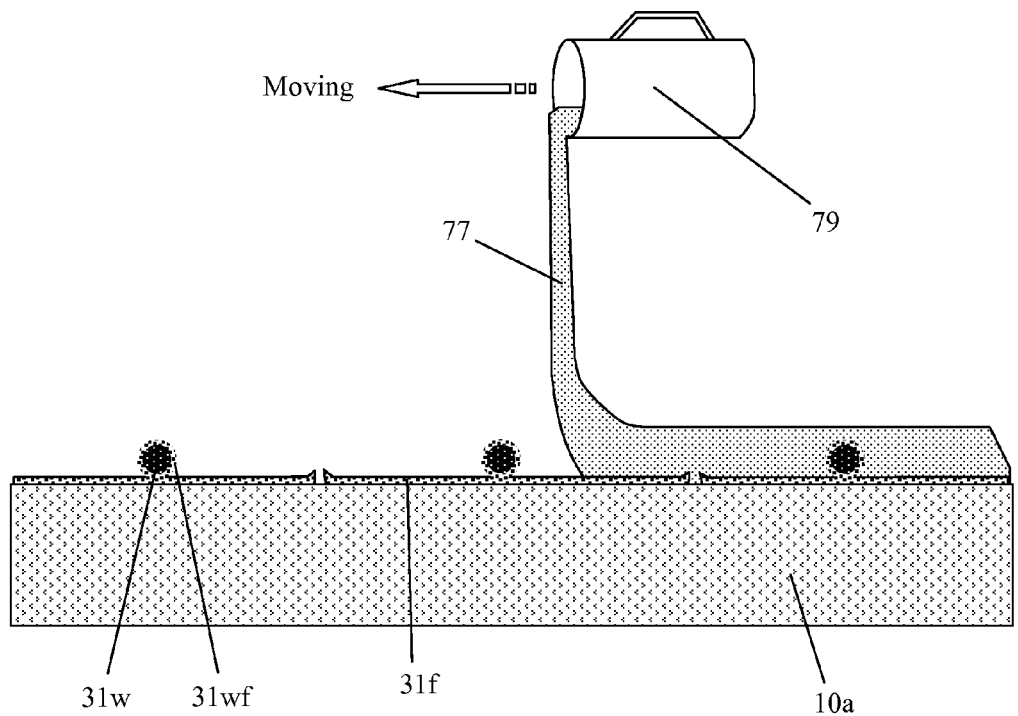
FIG. 10c schematically illustrates applying the eSheet substrate over the wire and transparent conductive electrodes.
Figure 10D:
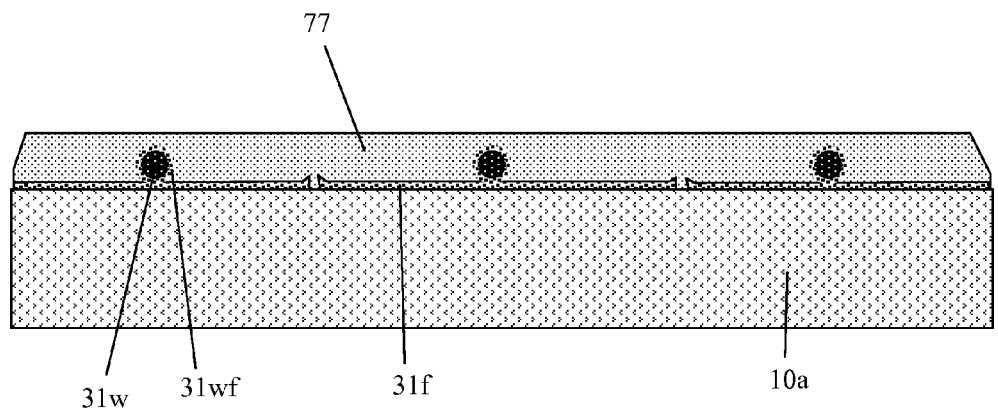
FIG. 10d schematically illustrates the finished eSheet formed on a flat plate.
Figure 10E:
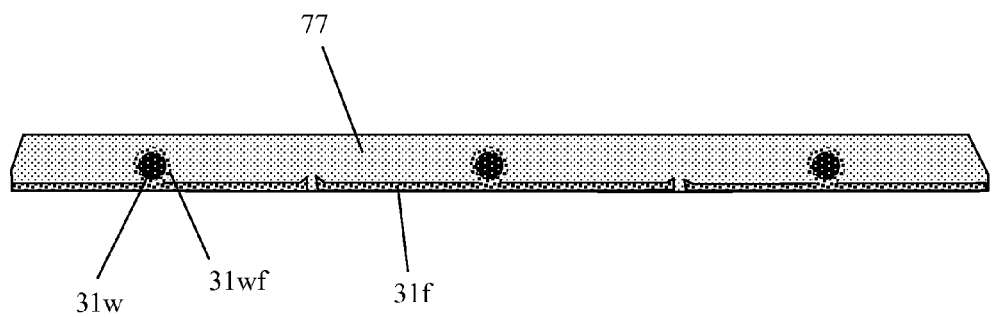
FIG. 10e schematically shows the finished eSheet after the flattening plate was removed from FIG. 10d.

Another alternate method to form the structure in FIG. 14a coats the wire electrode with a conductive polymer coating, such as a carbon nanotube loaded polymer coating similar to that shown in article 31wf in FIG. 10c, and attaches the coated 31wf wire 31w to the polymer substrate 38. Attaching the wire electrodes 31w to the polymer substrate 38 will create a free-standing wire 31w substrate 38 where tension on the wire electrodes 31w is not required to hold the wire tight against the substrate 38. Coated 31wf wire 31w may be wrapped on the substrate 38 while on a drum or arced plate and heat, chemical or radiation, such as UV, may be applied to bond the coated 31wf wires 31w to the polymer substrate 38. After the wires 38 are bonded to the substrate 38, it may be removed from the drum or arced plate and coated in a flat format.

Figure 14B:
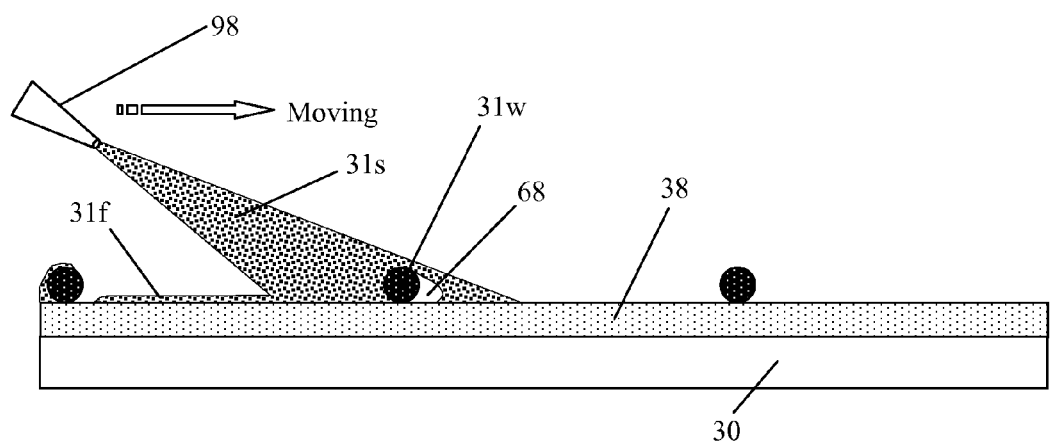
FIG. 14b is a schematic of the process used to coat the electroded sheet with a transparent conductive electrode.

FIG. 14b shows the sheet in FIG. 14a being coated with the transparent conductive material 31f. The wrapped drum or radiused plate is sprayed with a TCE coating 31s at an angle across the wire electrodes 31w. Any area not to be coated is preferably masked off before spraying. The substrate 38/30 containing wire electrodes 31w is positioned so the spray nozzle 98 is at one end of the sheet and positioned to spray at an angle (preferably 1° to 89°) relative to the substrate and normal to the wire electrodes 31w. The preferable spray angle is just shy of 45 degrees. The wires 31w act as a mask 68 preventing coating on one side of the wire 31w. The TCE spray nozzles 98 move across the polymer surface 38 and down the length of the substrate (or the substrate moves under a stationary nozzle) at the speed and spacing necessary to give the desired coating thickness. Multiple coats may be required to achieve the required conductivity and uniformity of the TCE 3 if. The traverse speed of the nozzle 98, concentration of the TCE, spray pressure, distance between the nozzle 98 and the substrate, and air flow around the sprayed part, among other parameters, all affect the coating concentration and uniformity of the TCE coating 31f on the substrate 38/30 and wire electrodes 31w.

Figure 14C:
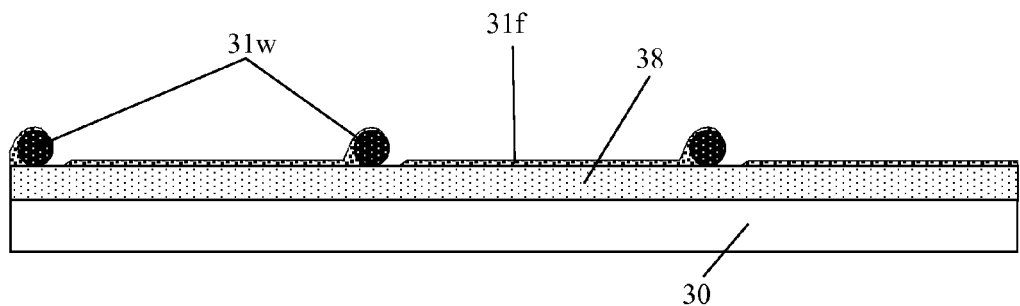
FIG. 14c represents the substrate containing wire electrodes coated with a TCE film using a maskless process.

FIG. 14c shows the substrate 38/30 containing the wire electrodes 31w from FIG. 14b after spray coating the TCE 31f at an angle. The transparent conductive electrode 31f is preferably uniformly coated on the polymer 38 and one side and top of the wire electrodes 3 if. The wires 31w have served as a shadow mask to create patterned TCE stripes 31f and now they 31w are ready to be embedded into the polymer surface 38.

Figure 14D:
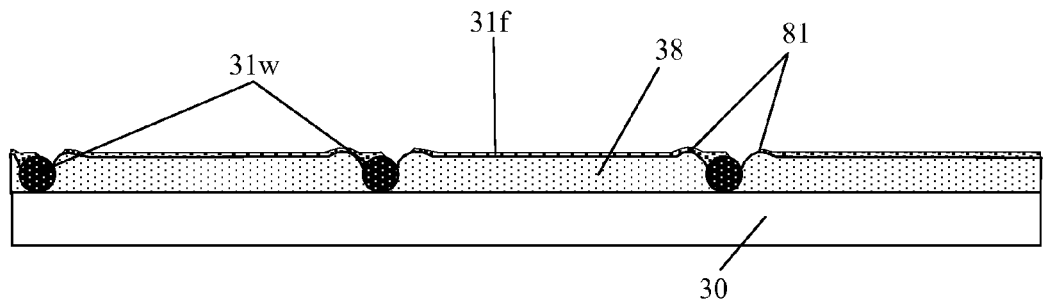
FIG. 14d shows a schematic of the wires embedded into the surface of the polymer substrate.

FIG. 14d shows the sheet from FIG. 14c after embedding the wires 31w into the polymer 38. The wires 31w are embedded into the polymer 38 by placing the drum (or bent plate) with the wire coated electroded sheet into an oven at a temperature above the softening point of the polymer 38. The temperature is chosen to maximize the conductivity of the transparent conductive polymer 31f and provide the proper tension on the wires 31w to allow them to embed into the polymer 38 down to the surface of the PET 30. Note the wires 31w are embedded into the surface using a contactless process so as not to disturb the electrical connection between the wire 31w and the TCE 31f. Once embedded, the drum or plate with the electroded sheet is cooled slowly to prevent stresses in the electroded sheet. The polymer layer 38 holds the wires 31w in place. After embedding, there may be some shorts across the uncoated area near the wires 31w. These shorts may be burnt open by applying a voltage across adjacent wires 31w.

The wire electrodes 31w have to be under tension, such that there is a normal force that presses them 31w against the polymer substrate 38/30 during the entire coating and embedding processes. The normal force, caused by the tension in the wires 31w, has to be large enough to hold the wires in place during the spraying process step and has to be large enough to completely embed the wires into the polymer surface 38. After the wires 31w are coated with the TCE 31f, they could be pressed into the surface using a roller or plate, however the roller or plate would disrupt the coating on top of the wires. If a plate is used, then either the drum containing the TCE coated wires would have to be rolled across it or the TCE coating would have to be strong enough to hold the wires onto the polymer surface when the electroded sheet is removed from the drum or arced plate.

Figure 14E:
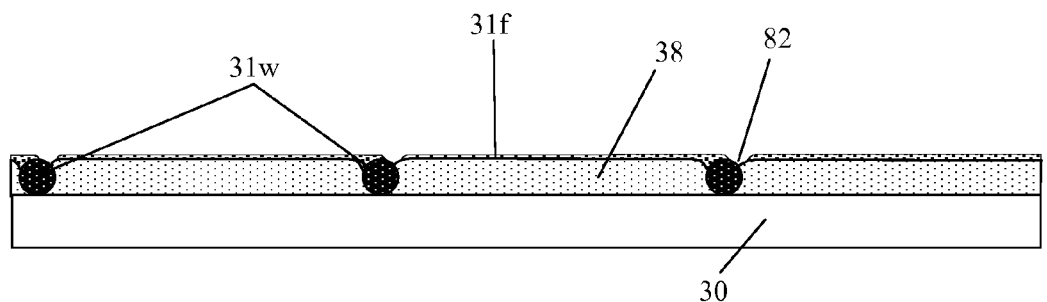
FIG. 14e shows a schematic of the electroded sheet after flattening the surface.
Figure 14F:
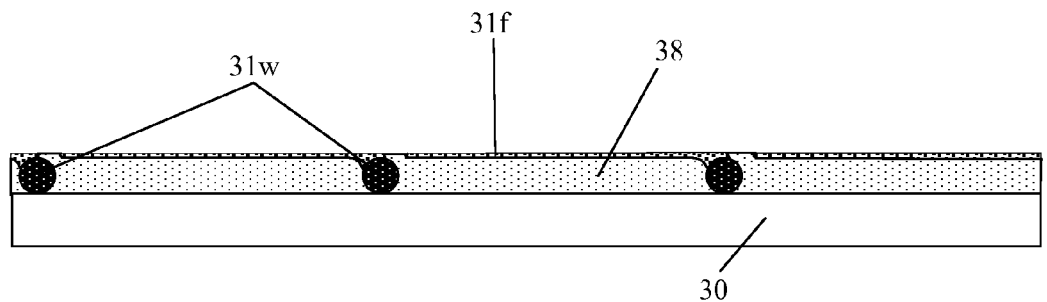
FIG. 14f shows a schematic of the electroded sheet after flattening the surface at a higher temperature.

In some display applications, especially those involving a liquid crystal material, it is imperative to flatten the surface of the electroded sheet. When the wire electrodes 31w are embedded into the polymer 38 surface, the wire electrodes 31w have to displace the same amount of polymer 38 as the volume of the wire electrodes 31w. This displaced polymer will form mounds 81 along side of the wire electrodes 31w. FIG. 14e represents an electroded sheet that has been run through a flattening process. The electroded surface is pressed against a flat non-stick surface (such as silicone coated glass) and upon heating the electroded sheet above the softening point of the polymer 38 causes the surface to flow. Pressure may be applied by placing the assembly in a vacuum bag or by using a pressure diaphragm against the PET surface 30. Flattening while under vacuum removes any air pockets that may cause defects or irregularities in the flattened surface. A soft flattening process, where the temperature is only raised slightly above the softening point for a short period of time flattens the mound 81 around the wires 31w, but the polymer does not flow enough to fill the voids 82 around the wires. In order to create a very flat surface, as shown in FIG. 14f, the viscosity of the polymer has to be low enough to fill the void or the pressure on the electroded sheet in the flattening machine has to be high enough to flow the polymer 38. Slow cooling of the electroded sheet after flattening minimizes the stresses in the sheet. After flattening, there may be some shorts along side the wires from where the wires shadowed the TCE 31f. These shorts may be burned open by applying a voltage across adjacent wires 31w.

Figure 14G:
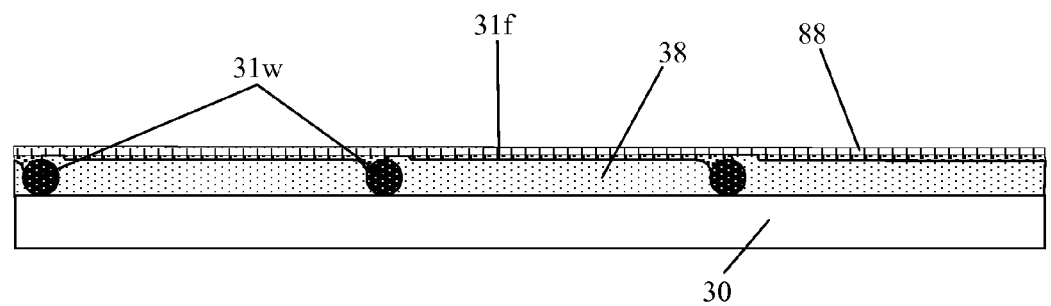
FIG. 14g shows the electroded sheet with a film applied to the surface.
Figure 15A:
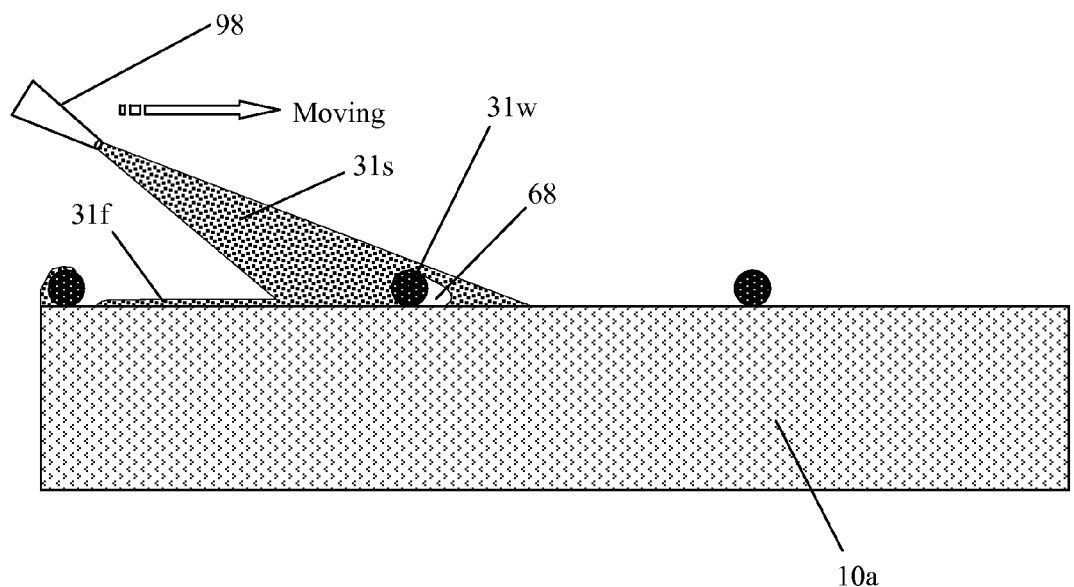
FIG. 15a schematically shows coating transparent conductive electrodes onto wire electrodes on a flat plate using a maskless process.
Figure 15B:
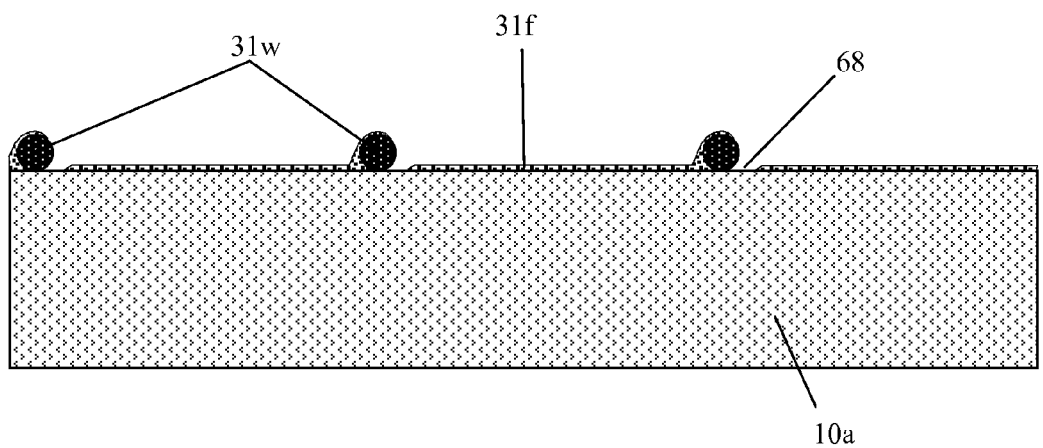
FIG. 15b schematically shows the transparent conductive electrode stripes attached to the wire electrodes on one side of the wire electrodes.
Figure 15C:
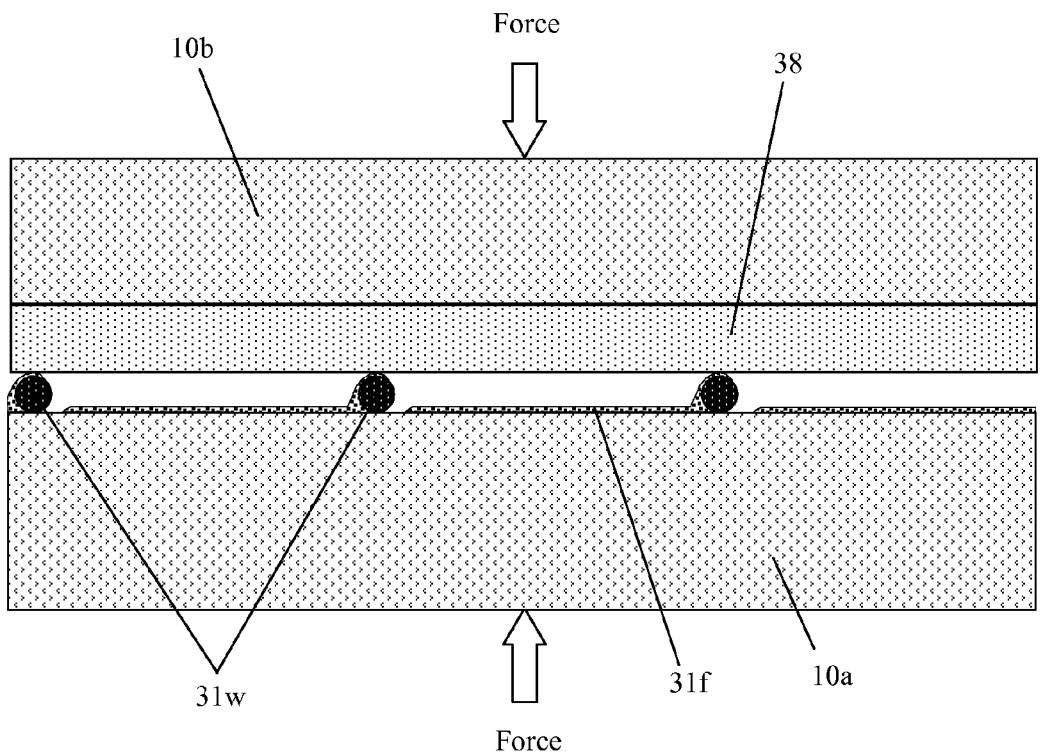
FIG. 15c schematically shows forcing a thermal polymer to flow down around the wire electrodes.
Figure 15D:
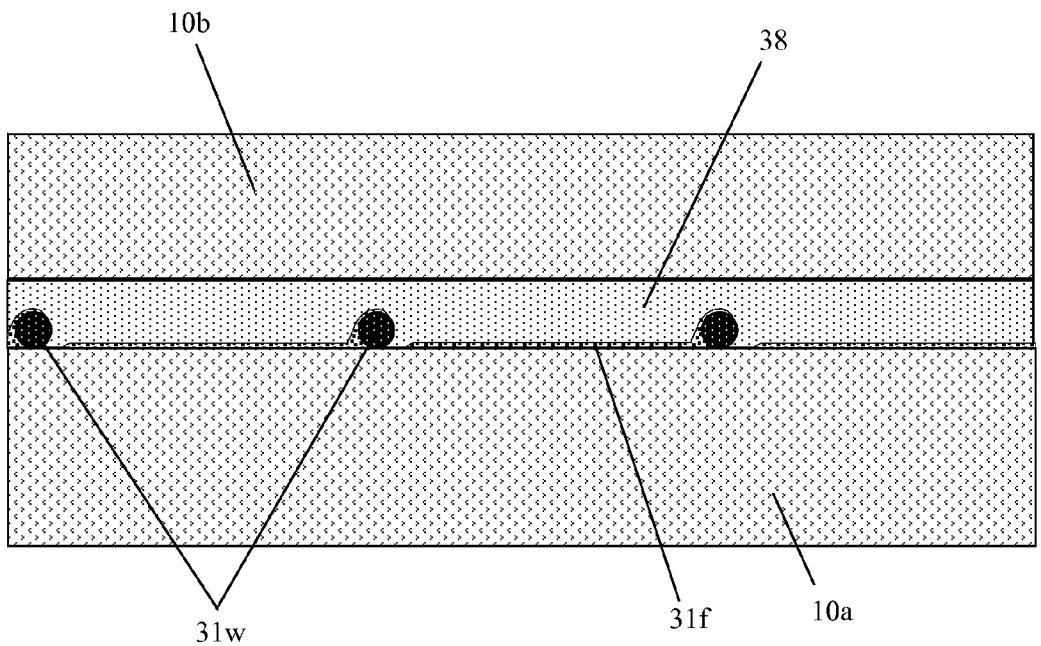
FIG. 15d schematically illustrates forcing a thermal polymer to flow around the wire electrodes and down to the transparent conductive electrode surface.
Figure 15E:
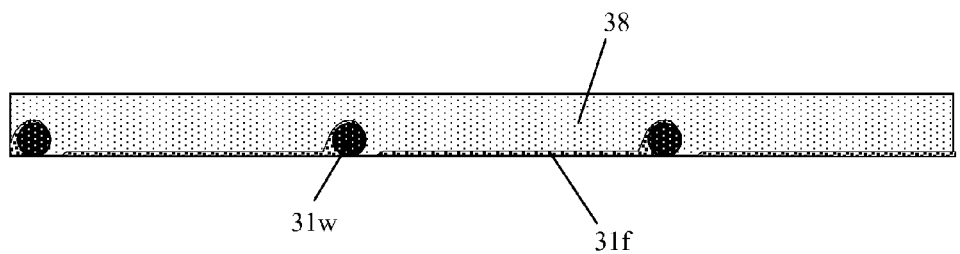
FIG. 15e schematically shows the finished eSheet after the flattening plates are removed in FIG. 15d.

FIG. 14g shows the electroded sheet with a film 88 applied to the surface. The film 88 may be applied before or after the flattening process step. The film 88 may be applied as a spray or sheet and is preferably a polymer or a silicone base material. The film 88 may also serve as a chemical or physical blocking layer or barrier for a subsequent display manufacturing process. The barrier 88 may be designed to stop the penetration of water or ions from the outside environment into an electrooptic layer, such as a liquid crystal or an emissive electrooptic material, like an organic light emitting material (OLED). Note ions coming through the electroded sheet tend to mask charge or voltage applied to a capacitor (switch) that is used to modulate a LC. Also if the electroded sheet is used for an OLED device, then a barrier film 88 to water has to be applied to the surface because water or oxygen tends to destroy the OLED material. A barrier film 88 may alternatively be used to stop ion migration from a component inside the panel into the electroded sheet. If an ionic electrooptic material is used, then the ions can randomly migrate around in the display. If the ions migrate to the other side of the electrode, where they are no longer in the presence of an electrostatic field, then they can not be moved. Therefore, these electrostatically immobile ions contain charges which create an electric field of their own and may cause addressing issues. Ions or other chemical materials may migrate from inside the panel through the electroded sheet to the outside environment if the proper barrier layer 88 is not applied to the electroded sheet. One example where a barrier is needed is to contain a corrosive material like is traditionally in an electrochromic display.

The barrier may also be placed on the flattening plate and transferred to the electroded sheet. The flattening plate may have a release coating on it and the barrier may be deposited on the release film for easy transfer. In fact, the wire electrodes 31*w* or the transparent conductive coating 31*f* may also be strung/deposited on a plate and transferred into the surface of the polymer substrate.

The film 88 may also be an adhesive layer to help the electroded sheet surface bond to another display component. The film modified electroded sheet surface may be used in many different display applications, including, but not limited to, a tubular plasma display, a plasma-addressed display, a liquid crystal display, an electrochromic display, an OLED, or any other electronic display.

FIG. 15 shows the maskless process using the pattern plate process shown above in FIG. 9. FIG. 15*a* shows that the transparent conductive electrode material 31*s* is sprayed onto a wire 31*w* masked flat plate 10*a* at an angle to create non-coated or electrically isolated lines 68 along side of the wire electrodes 31*w*. FIG. 15*b* shows the TCE stripes 31*f* coated onto the wire electrodes 31*w* and electrically isolated 68 at each wire electrode. A thermal formable polymer substrate 38 is then placed over the wire electrodes 31*w* and a second flat plate 10*b* is placed over the polymer substrate 38, as shown in FIG. 15*c*. Applying a compressive force to the stack under a vacuum and heating the system above the Vicate softening point of the polymer substrate 38 will allow the polymer to flow around the wire electrodes 31*w* and down on to the TCE stripes 31*f*, as shown in FIG. 15*d*. After cooling the system the plates 10*a* and 10*b* can be removed to form an eSheet, as shown in FIG. 15*e*. Although the maskless pattern plate process in FIG. 15 is described by embedding a thermal polymer sheet 38 into the electrode 31 surface, a similar maskless pattern plate process may be done where the substrate 77 may be applied similar to that described in FIG. 10.

Webbed Process

Figure 16:
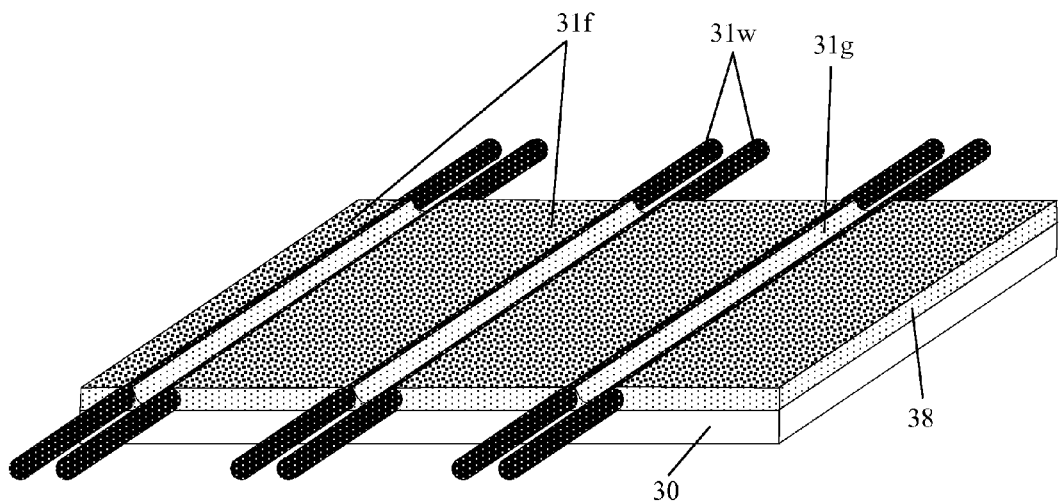
FIG. 16 schematically shows a section of the electroded sheet formed using a web process.

FIG. 16 shows a schematic of a section of an electroded sheet formed using a web process. The electroded sheet includes a polymer substrate with wire electrode pairs 31*w* and transparent electrode webs 31*f* coated between the wire electrode 31*w* pairs. The wire electrode 31*w* pairs are separated by small gaps 31*g* that are formed during the manufacturing process explained below. These small well defined gaps 31*g* are very advantageous when the electroded sheet is used as a sustainer plate in a tubular plasma display.

Figure 17A:
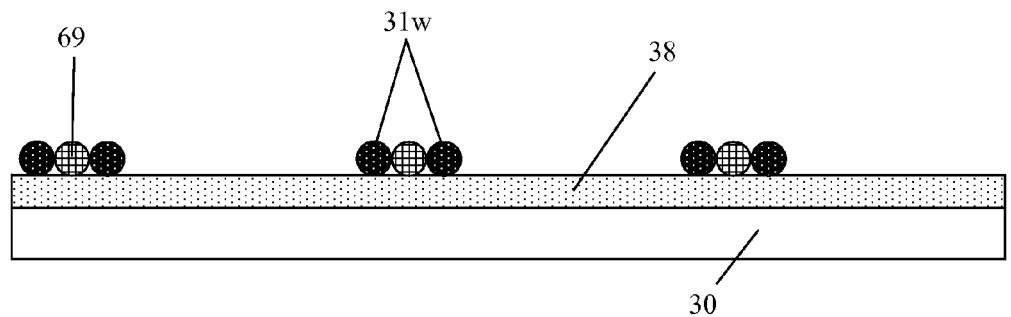
FIG. 17a schematically shows a polymer substrate with wires and masks positioned on the surface.

FIG. 17*a* shows the first step in forming a webbed electroded sheet by arraying wire electrode 31*w* pairs with masks 69 between the wire electrode 31*w* pairs on the surface of a polymer substrate 38/30. One method to form this webbed electroded sheet starts by wrapping a polymer 38/PET 30 substrate (preferably preshrunk) on a drum, where the drum has a higher thermal expansion than the wire. The polymer substrate 38/30 is wrapped such that the PET 30 is against the drum. The wire 31*w* (copper, steel, tungsten, or any other conductive metal) and mask 69 (wire, nylon, thread, fiber, or any other material that may be removed before or after embedding) are then wrapped around the substrate covered drum. The tension in the wire 31*w* and mask 69 are controlled and the wire 31*w* pitch is controlled by traversing either the drum or the wire/mask guiding tool. The wire 31*w* and mask 69 may be wrapped individually or together using guides or any other means desired to control the spacing and uniformity. The mask 69 does not have to be the same material as the wire, nor the same diameter. The mask 69 must be able to be easily removed from the polymer 38, and the diameter of the mask 69 controls the spacing or gap 31*g* between the wire electrode 31*w* pairs.

Alternatively the webbed electroded sheet is formed by placing the substrate 38/30 on a stiff plate and wrapping the wire 31*w* and mask 69 back and forth across the substrate between guides/pins at both ends of the plate. Tension in the wire 31*w* and mask 69 must be controlled. The beginning and the end of the wire 31*w* and mask 69 are attached to the polymer or plate by tape or any other means. The wrapped stiff plate is then placed in a fixture and bent to a radius to put the desired tension on the wires 31*w*. Note that the tension in the wires may be controlled by the radius of curvature of the plate; therefore the thermal expansion of the plate does not have to be higher than that of the wire electrodes.

Figure 17B:
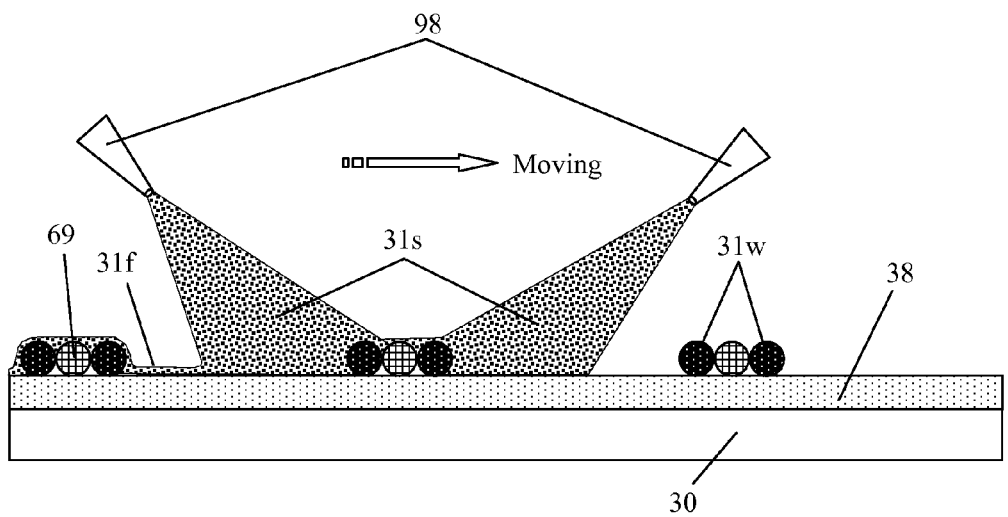
FIG. 17b schematically shows the spray process used to coat the transparent conductive electrode material on the wire masked polymer substrate.

FIG. 17*b* shows the sheet obtained in FIG. 17*a* being coated with the transparent conductive material 31*f*. A spray system 98 is used to coat the surface of the polymer substrate 38/30 and the wire electrodes 31*w*. The transparent conductive material must be sprayed 31*s* at a low angle and in both directions normal to the wire electrodes to assure that the TCE coating 31*f* covers the entire polymer surface 38, including under the edges of the wire 31*w*. The speed, step distance, angle and number of passes of the spray nozzles 98 must be controlled to achieve the electrical connection, conductivity and uniformity of the final TCE coating 3 if. The concentration of the TCE, spray pressure, distance between the nozzle 98 and the substrate, and air flow in the spray system also affect the concentration and uniformity of the TCE coating 31*f*.

Figure 17C:
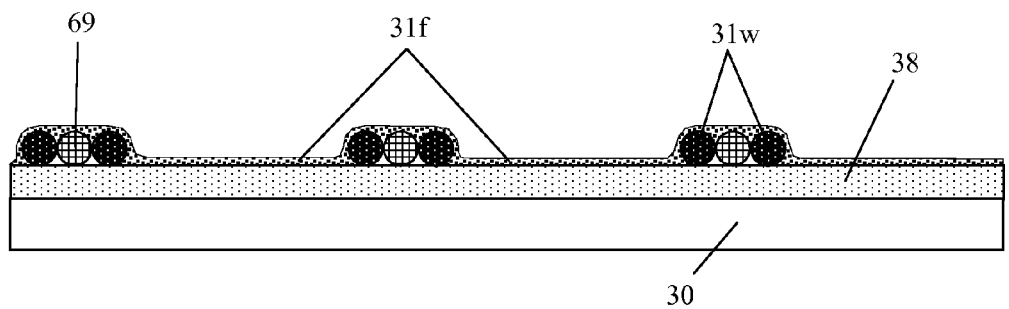
FIG. 17c schematically shows the electroded sheet after the coating process step.

FIG. 17*c* shows the substrate 38/30 containing the wire electrodes 31*w* from FIG. 17*b* after spray coating the TCE 31*f*. The transparent conductive polymer 31*f* is preferably uniformly coated on the polymer 38 and around the wire electrodes 31*f*. The coated electroded sheet is now ready to have the wires embedded.

Figure 17D:
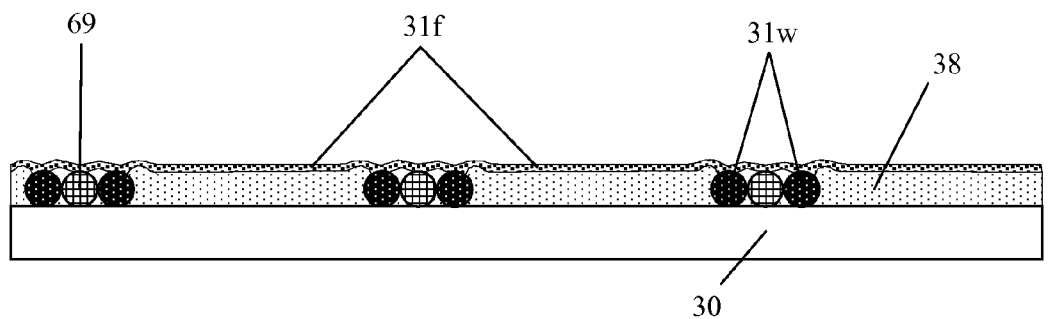
FIG. 17d shows a schematic of the wires and mask embedded into the polymer.

FIG. 17*d* shows the sheet from FIG. 17*c* after embedding the wires 31*w* and mask 69 into the polymer 38. The wires 31*w* and mask 69 are preferably embedded into the polymer 38 by placing the drum (or bent plate) with the coated TCE 31*f* into an oven at a temperature above the softening point of the polymer 38. The temperature is chosen to maximize the conductivity of the TCE 31*f* and provide the proper tension on the wires 31*w* to allow them to embed into the polymer 38 down to the surface of the PET 30. The thermal expansion of the mask 69 may be larger than the drum or plate and the mask 69 does not have to get embedded in to the surface of the polymer film 38. Once the wires are embedded, the drum or plate with electroded sheet is cooled slowly to prevent stresses in the electroded sheet. The polymer layer 38 holds the wires 31*f* in place. Note that the wire electrodes 31*w* and mask 69 may be embedded into the polymer 38 surface before the sheet is coated with the TCE 31*f*.

Figure 17E:
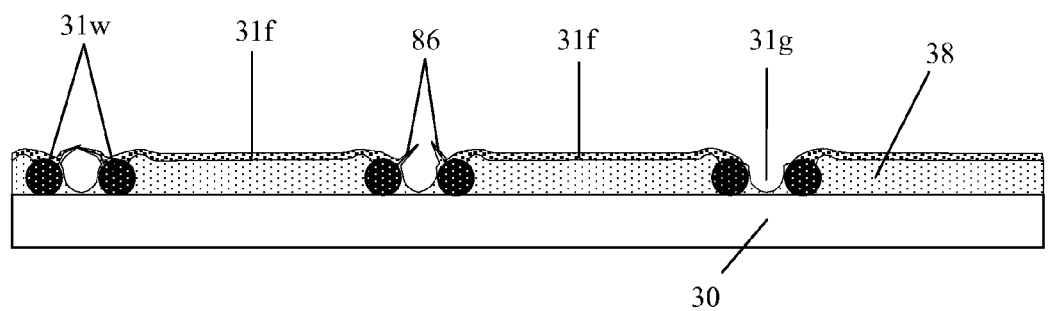
FIG. 17e shows a schematic of the wires embedded in the electroded sheet with the mask removed.

FIG. 17*e* shows the electroded sheet from FIG. 17*d* after the mask 69 is removed. After embedding, the mask 69 must be removed or stripped out of the polymer 38 surface. This must be done carefully such that the wires 31w are not pulled from the electroded sheet by the mask 69, and also such that any TCE 3 if or polymer 38 stripped with the mask 69 does not fall onto the electroded sheet. Stripping the mask 69 from the electroded sheet leaves some shorts 86 between the wires because of the polymer 38 and TCE 31f over the mask 69. These shorts 86 may be burned open by applying a voltage across adjacent wire electrode 31w pairs. Because the TCE 31f forms a web between wire electrodes 31w, no potential is applied across the TCE 31f coating, therefore causing no harm to the TCE 31f during the electrical short removal process. If a flat electroded sheet is desired then it is advantageous to burn these shorts 86 open after the flattening process step.

Figure 17F:
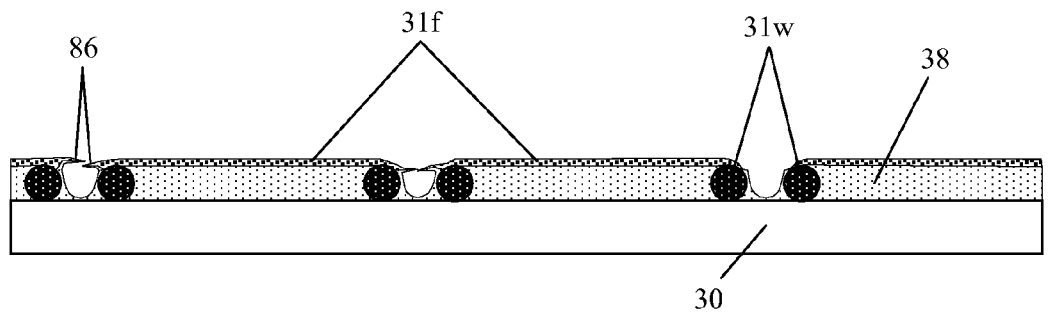
FIG. 17f shows a schematic of the electroded sheet after flattening the electroded surface.
Figure 17G:
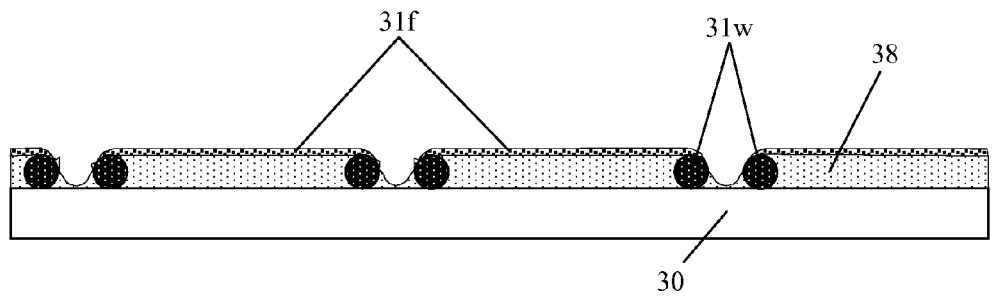
FIG. 17g shows a schematic of the electroded sheet after the transparent conductive electrode material has been burned out between the wire electrodes.

FIG. 17f shows the electroded sheet from FIG. 17e after the electroded surface is flattened. The electroded surface may be flattened by pressing it against a flat non-stick surface (such as silicone coated glass or a silicone coated high temperature plastic) while heating the electroded sheet slightly above the softening point of the polymer 38. Pressure is preferably applied by placing the assembly in a vacuum bag, or by using a pressure diaphragm (vacuum press) against the PET surface 30. Flattening under vacuum removes any air pockets that may cause defects or irregularities in the flattened surface. The time, temperature and pressure of the flattening process has to be controlled so the wire electrodes 31w do not move into the void 31g and come into contract. If the diameter of the wire electrodes 31w is the same as the thickness of the polymer 38 then the wires 31w are pinched between the flattening plate and the rigid lower PET 30 substrate and keeps them from moving together. Slow cooling of the electroded sheet after flattening minimizes the stresses in the electroded sheet. After flattening, there may be some shorts 86 across the area between the wires from where the mask 69 was removed. These shorts 86 may be burned open, as shown in FIG. 17g, by applying a voltage across adjacent wires 31w.

Figure 17H:
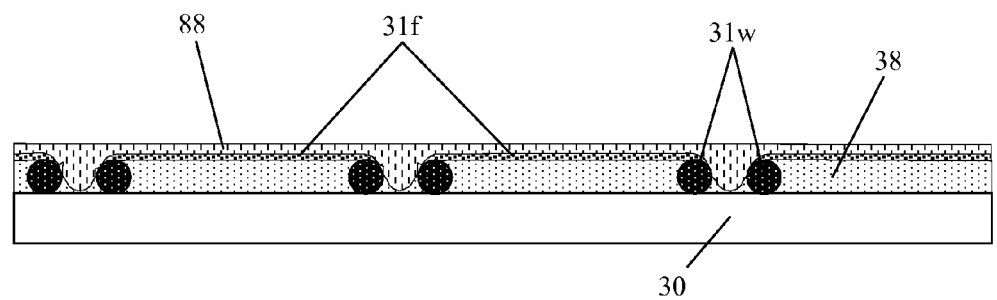
FIG. 17h shows the flattened electroded sheet with a planarizing layer applied to the surface.

A planarization layer 88 may be applied to the surface of the electroded sheet to remove the voids 31g formed between the pairs of wire electrodes 31w, as shown in FIG. 17h. This planarization layer 88 may be added before or after the flattening process step. If the planarization layer 88 is applied before the flattening process step and the softening point of the planarization layer 88 is lower than that of the polymer 38 substrate then the planarization layer 88 will flow into the void 31g before the polymer 38 substrate softens. The planarization layer 88 may also serve as an adhesive film to attach another display component to the electroded sheet. If the web-based electroded sheet is used as a sustainer plate in a tubular plasma display then leaving the void 31g between the pair of wire sustain electrodes 31w creates a region with a lower dielectric constant. Therefore, a smaller amount of the voltage drops directly between the wires, thus extending the electric field farther into the plasma tubes.

Heating the Wires Process

Some applications of the present invention require a chemically durable or higher temperature polymer substrate. In these types of applications the polyolefin 38 part of the substrate is not chemically durable enough or it softens at too low of a temperature. Therefore, it is desirable to have the wire electrodes embedded directly into the PET 30 substrate. However, some of the processes explained above, such as the drum or arced plate processes, can not be used. Pushing the wires into the surface using a flat plate is difficult because PET does not start to soften until about 200° C. and the viscosity curve is not very steep making it almost impossible for the PET to flow up around the wires before it melts at about 250° C. The PET could be melted and allowed to flow around the wires, but the wires would have to be held to the plate surface and not allowed to penetrate into the surface. This entire process would have to be performed in a vacuum at high temperatures, which makes the equipment very complicated and expensive.

One method of placing the wires into the surface at a low system temperature is to directly heat the wires. The wires may be directly heated using inductive, irradiative or resistive heating. Since the wires are made of metal they will suscept or absorb microwaves and may be inductively heated. If a high enough current flows through the wires, their temperature increases as a result of the resistive heating in the wire. The wires can also be irradiated with light (UV, visible or IR) to increase their temperature. In order for the wires to get embedded in the surface of the PET, the wires have to be heated enough to melt the PET. The base temperature of the PET may be elevated to reduce the amount of power applied directly to the wires in order to embed them into the surface of the PET. The most simple and efficient process of embedding the wires into PET is to use a vacuum bag or a vacuum press with a microwave heating chamber that may be tuned for the load. Wire electrodes may be wrapped around a very flat plate, such as glass, and PET substrates may be placed over the wire electrodes on both sides of the glass plate. The entire substrate with wires and PET sheets may be placed in a vacuum bag and a vacuum, preferably below 100 mTorr, may be pulled inside the bag around the wire electrodes. The vacuum bag may then be placed in an oven that has both a thermal heater and a microwave heater. The temperature of the vacuum bag with enclosed parts may be increased to about 150° C. and then the microwave may be applied to increase the temperature of the wires high enough (>260° C.) to melt the PET and sink into the surface. The elevated temperature of the base PET allows the melted PET material from under the wire electrodes to flow around the wires and out across the surface.

Manufacturing—Batch, Stamp and Extrusion Processes

There are many different methods of manufacturing electroded sheets. The example below discusses an extrusion, a batch and a stamping process.

Figure 18:
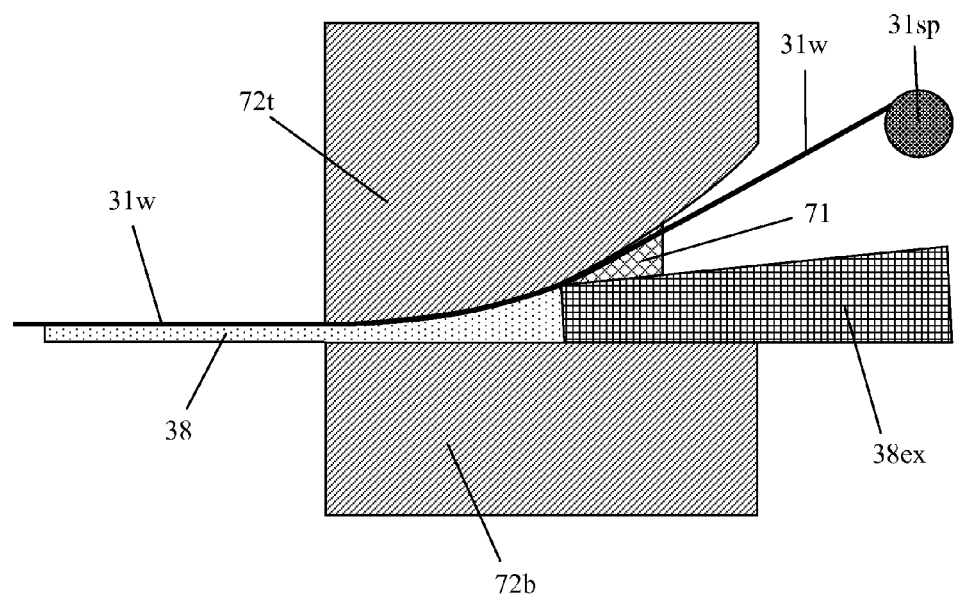
FIG. 18 schematically represents a polymer extrusion process where the wires are extruded into the surface of the eSheet.

FIG. 18 shows an extrusion process where the wire electrodes 31w are unspooled from wire spools 31sp and feed through wire guides 71 into the die of the extruder. Polymer is pushed out through the polymer extruder 38ex and flows around the wire electrodes 31w as it exits the extrusion die 72. The extrusion die is composed of a bottom part 72b and a top part 72t. The wire electrodes 31w ride tight against the inside upper surface of the top half of the extrusion die 72t. The inside surface of the top half of the extrusion die 72t will have to have a consistent arc and the wire electrode will have to be under slight tension in order for the wire electrode to be on the surface of the polymer substrate 38 during the extrusion process. An extrusion process is probably the lowest cost and highest through put process, however, it may not provide the flattest electroded surface. A non-flat electrode surface may not be a concern if the electroded sheet is subsequently patterned, coated with a transparent conductive electrode and post flattened.

Figure 19A:
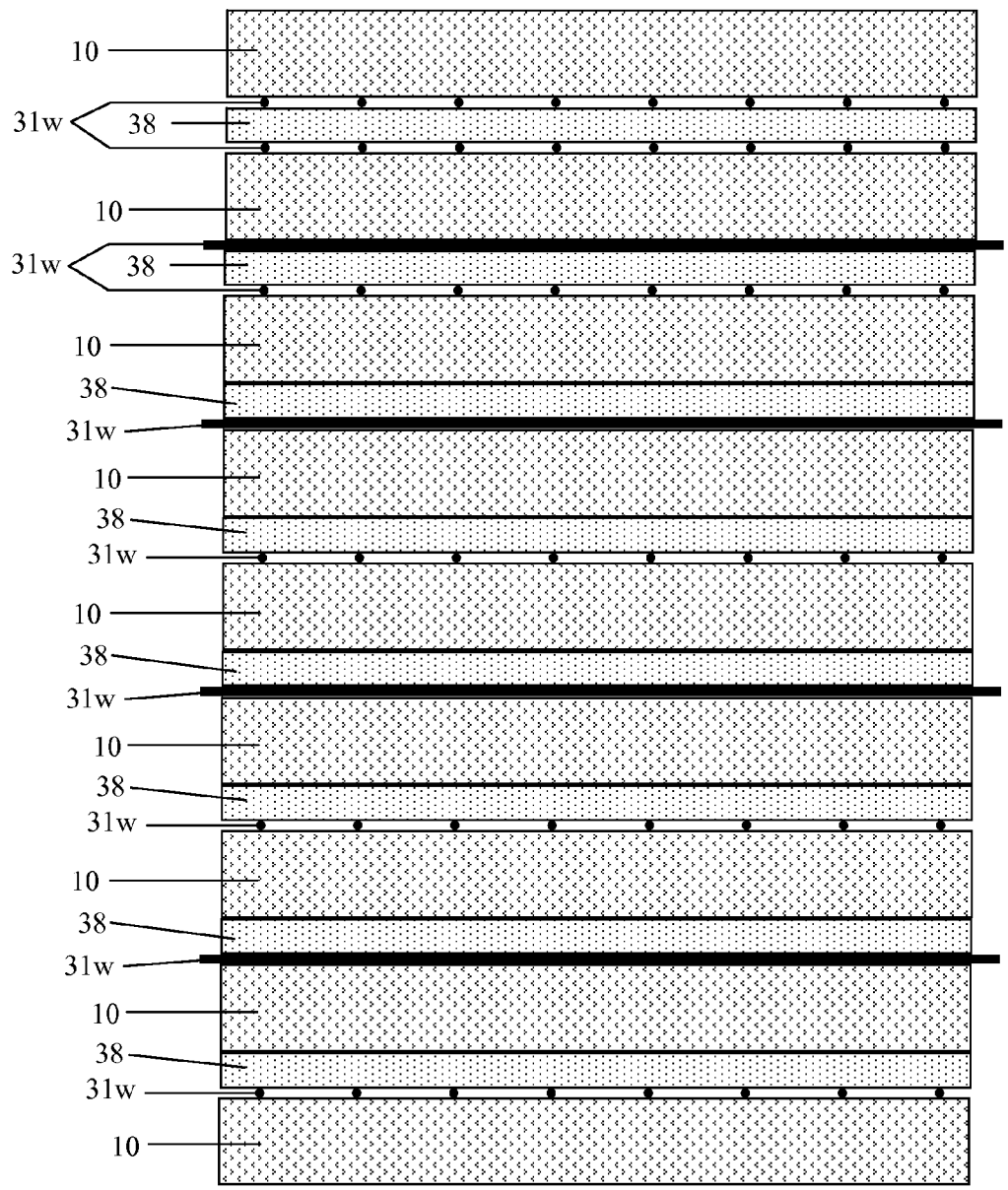
FIG. 19a schematically represents a batch process where more than one wire electrode array is being embedded in the thermal polymer at once.
Figure 19B:
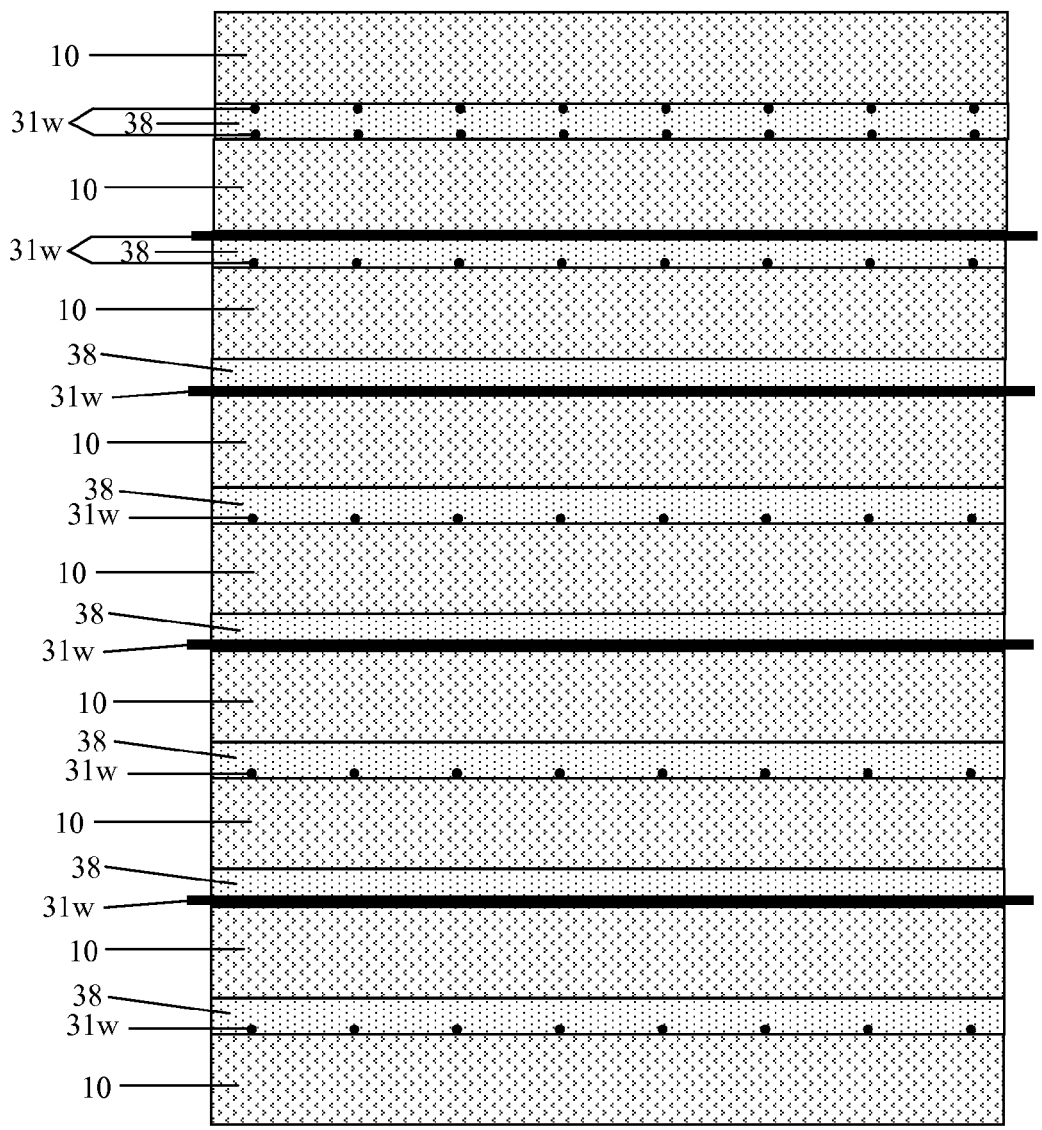
FIG. 19b schematically represents the batch process in FIG. 19a where the wire electrodes are embedded into polymer surface.

FIG. 19 represents a batch process. The batch process is similar to the processes explained above in FIGS. 6-9 and 15 except several eSheets are produced in a single thermal cycle. FIG. 19a shows a stack of eight separate polymer substrates 38 with wire electrodes 31w against at least one of the polymer 38 surfaces. Note that the top two polymer substrates 38 have wire electrodes 31w against both of the surfaces to create a double-sided eSheet. The top polymer substrate 38 has the wire electrodes 31w running parallel to each other on both sides of the substrate 38, whereas the second substrate 38 from the top has the wire electrodes 31w running perpendicular to each other. The wire electrodes 31w are arrayed on a set pitch and held tight during the wire embedding process in a wire gig (not shown). Pressure is applied to the top and bottom surfaces of the stack and the entire stack is heated to soften the polymer substrates 38 while under a vacuum. The vacuum should be kept below 10 Torr and it is preferably below 0.1 Torr to insure that no bubbles form in the interface between the polymer 38 and the flat plate 10. After heating the stack above the Vicate softening point of the polymer substrate 38 while under vacuum and applying pressure, the wire electrodes 31w are embedded into the polymer substrates 38, as shown in FIG. 19b. The stack can then be pealed apart and the eSheets can be removed from the flat plates 10.

Figure 20:
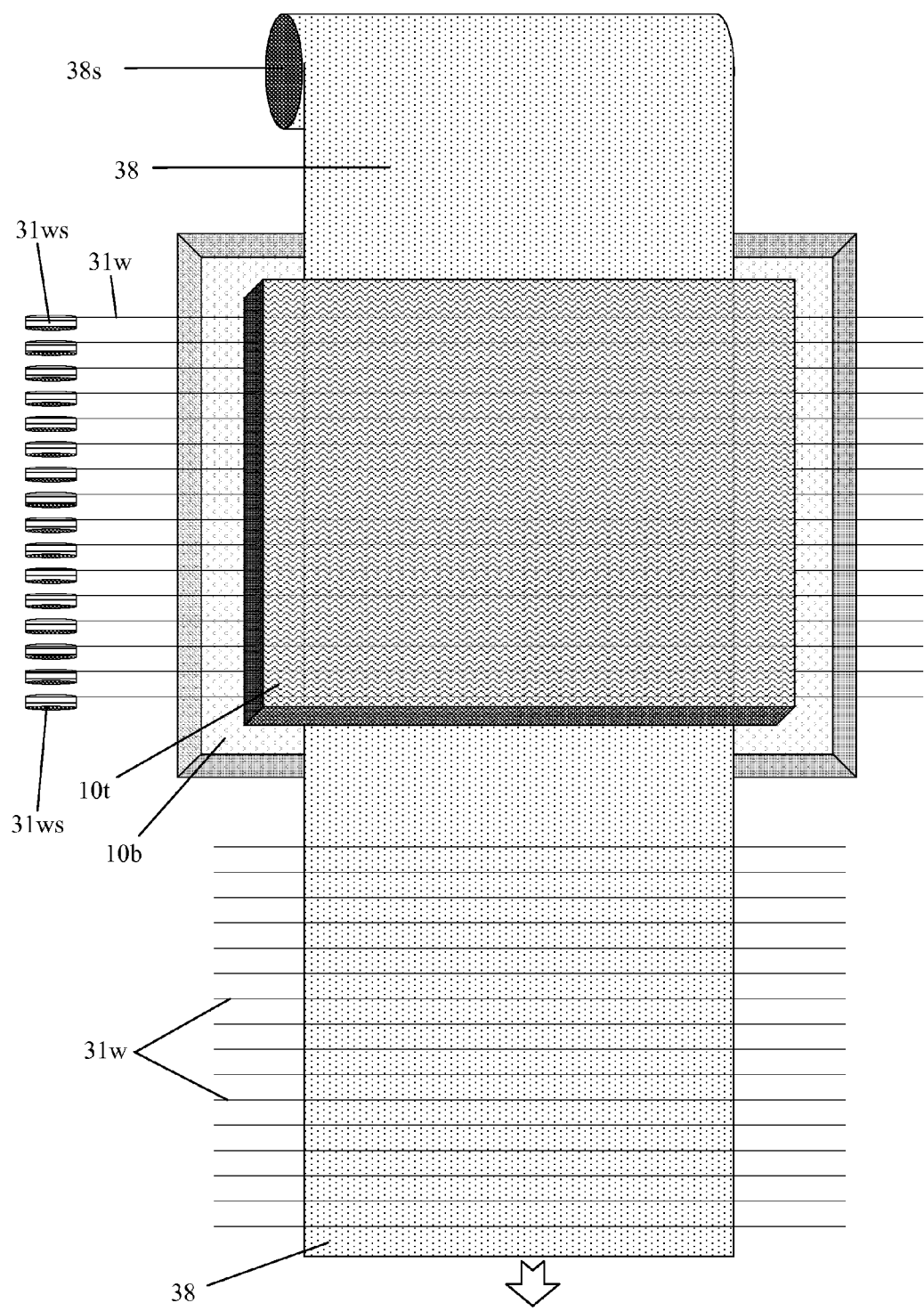
FIG. 20 schematically represents a stamping process to form the eSheets.

FIG. 20 represents a stamping process that can be done in a roll-to-roll process. A roll of polymer sheet 38s is rolled out of a bottom plate 10b and an array of wire electrodes 31w are unspooled from their wire spools 31ws across the polymer sheet 38. A top plate 10t is then pressed against the wire electrodes 31w and the wire electrodes 31w are forced into the surface of the polymer sheet 38. The temperature will have to be increased above the softening point of the polymer material 38 in order for the wire electrodes 31w to get embedded into the polymer sheet 38. One method of creating this increased temperature adds a heater to the top 10t or bottom 10b plates used add the force to embed the wires 31w. This entire stamping process will have to be done in a vacuum chamber to insure that no air is trapped between the polymer sheet 38 and the embedding plates 10. Once the wires 31w are pressed into the polymer 38 surface, the pressing plates are opened up, the wire electrodes are held and cut off, and the polymer sheet 38 is pulled through the press to the next stamping section. One or both of the stamping plates 10 may be replaced by a roller that is rolled along the wire electrodes 31w to embed them into the polymer 38 surface.

Surface Flatness

One issue for some of the electroded sheets discussed above is the flatness of the final surface. In some display applications, like a tubular plasma display, the requirements on the final surface flatness is not very stringent (less than about 25 μm) and most of the surface roughness may be compensated for in an adhesive layer used to attach the electroded sheet to the plasma tube array. However, other electronics displays, especially those including liquid crystals, require that the surface roughness is below 1 μm to achieve proper addressing and uniformity across the panel. Therefore, a post surface flattening process may need to be performed depending on the electroded sheet process. The final flattening step needs to be performed under a vacuum in order to remove any air in the electroded sheet/flattening plate interface. The pressure should preferably stay below about 200 mTorr to keep any bubbles from forming in the interface. The grooves along side the wire electrodes provide vacuum ports to remove any trapped air in the center of the electroded sheet. These vacuum ports may raise the required minimum vacuum to a couple of Torr.

Removing Electrical Shorts

One potential issue with creating any patterned electrode structure is shorts between the TCE lines. These shorts are easily found by applying an interlaced voltage to the wire electrodes, that is applying a voltage to all the even electrodes while keeping the odd electrodes at ground potential. If there is a short, current flows between the interlaced connected electrodes. If the voltage and current is high enough and the short is small enough then it may be "burned" open. If the current is regulated, the short area will sink all the current and heat-up. A thermal camera may then be used to spot the location of the short (the area of short will get hot from the current flow) and the short could be repaired, such as being burned open using a laser or scraped/scratched open.

Double-Sided eSheet

In cases where the electroded sheet has a very thin substrate 30, the electroded layer may serve as a double-sided addressing layer. However, in this case, the electro-optic material on the substrate 30 side would have a voltage drop through the substrate whereas an electro-optic material on the electrode side would be in direct contact with the electrodes. A true double-sided electroded sheet may be produced by adding an additional polymer layer 38 with embedded wire electrodes 31w connected to TCEs 31f on the non-electroded side of the substrate 30. If a process is used where the wire electrodes 31w are embedded directly into a single composition substrate 38 then the wire electrodes 31w could be embedded into both sides of the substrate 38 in a single process step. The second electroded layer may be parallel to the first or orthogonal to the electrodes on the other side of the substrate 30. These thin double-sided electroded sheets allow for the fabrication of very large color electronics signs made by stacking different color liquid crystal materials between the electroded sheets.

90 Degree Wire Connection

Figure 21A:
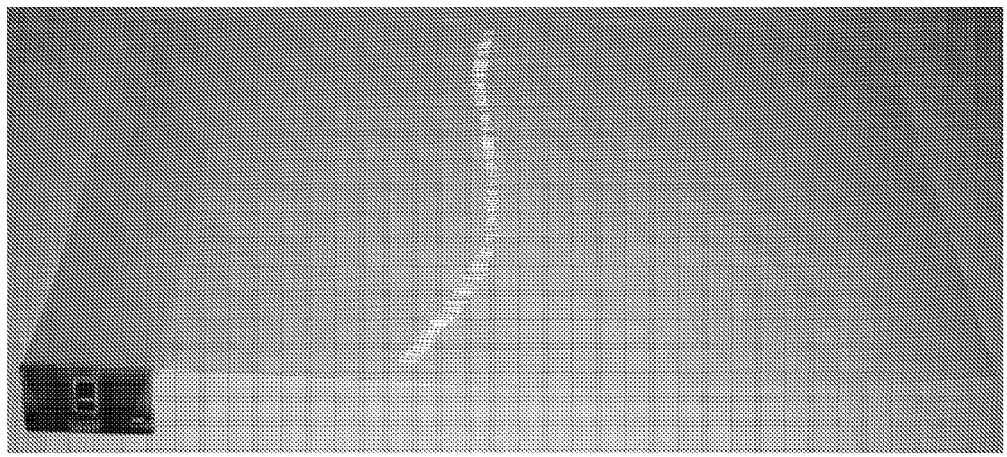
FIG. 21a is a photograph of an electroded sheet with the wire electrodes coming out orthogonal to the embedded wires in the main body of the panel.
Figure 21B:
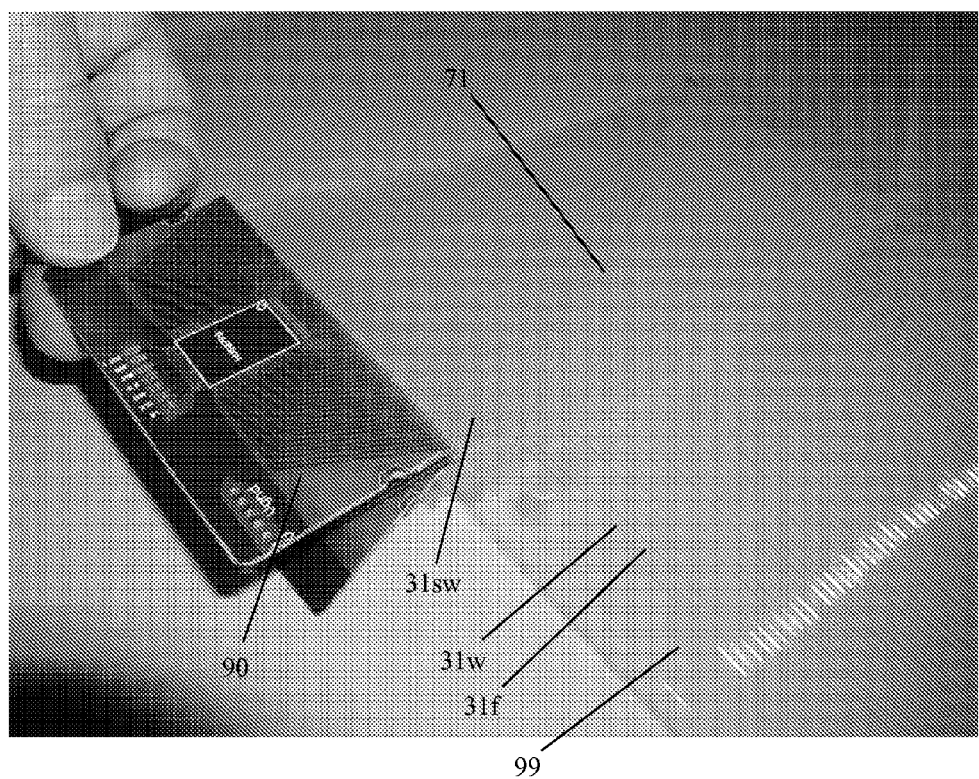

FIG. 21 shows a method of bringing the wire electrodes 31w out of the electroded sheet 99 orthogonal to the direction of the embedded of wires 31w in the main body of the panel. A locking film 71 is sealed across the embedded wire electrodes 31w at an angle on the edge of the electroded sheet 99. Note that the TCE coating 31f, patterned onto the embedded wire electrodes 31w, should be masked during deposition such that the end of the electroded sheet 99 is not coated where the locking film 71 is sealed. The embedded wire electrodes 31w are then stripped out of the surface of the polymer film 38 back to the locking film 71 and bent 90 degrees and soldered into a printed circuit board 90 on the edge of the electroded sheet 99. Assuming that the driver chip on the printed circuit board 90 has 64 outputs (like most standard chips), once 64 wire electrodes 31sw are stripped, bent and soldered, a second locking film 71 is placed over the stripped wires 31sw to electrically isolate them from the surface. A third locking film 71 is placed at an angle across the $2^{nd}$ bank of 64 wire electrodes 31w and they are stripped back to the locking film 71, bent 90 degrees and soldered into a $2^{nd}$ circuit board 90 stacked on top of the first circuit board 90. The wires 31w in the electroded sheet 99 may be stripped, bent and connected to the circuit board 90 in banks of 64 until all the wires 31w are brought out of the electroded sheet and connected to circuit boards. Note that the first bank of 64 wire electrodes 31sw are covered with n−1 layers of stripped wires 31sw, where n is the number of banks of wires 31w. To minimize the stiffness of the edge connector, very thin polymer coated 38 PET 30 may be used as the locking layers 71. Also, alternating banks of 64 wires 31w out both sides of the electroded sheet minimizes the bending force when the display is rolled. The wire electrodes 31 sw may alternatively be brought out all four corners of the electroded sheet 99, which allows for a solid edge connector on both orthogonal sides to the embedded wire electrodes 31w. Using two electroded sheets 99 with standard edge connected circuit boards 90 sandwiched around the orthogonal wire 31sw electroded sheet creates a double sided panel.

Figure 22A:
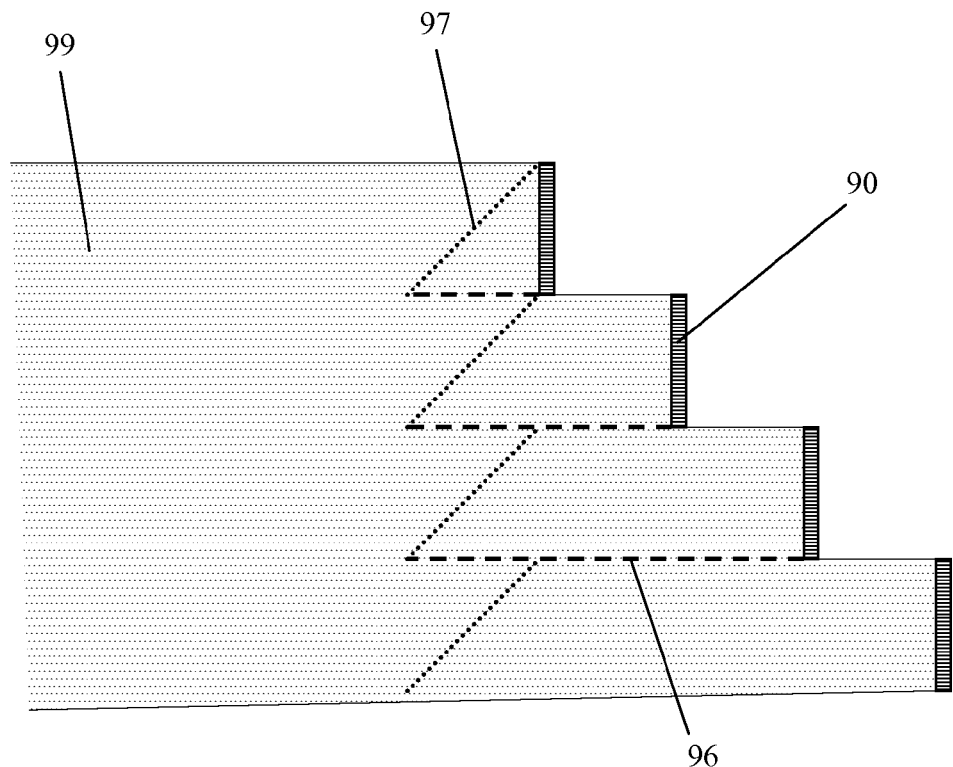
FIG. 22a schematically shows an end of an electroded panel with slices and fold lines.
Figure 22B:
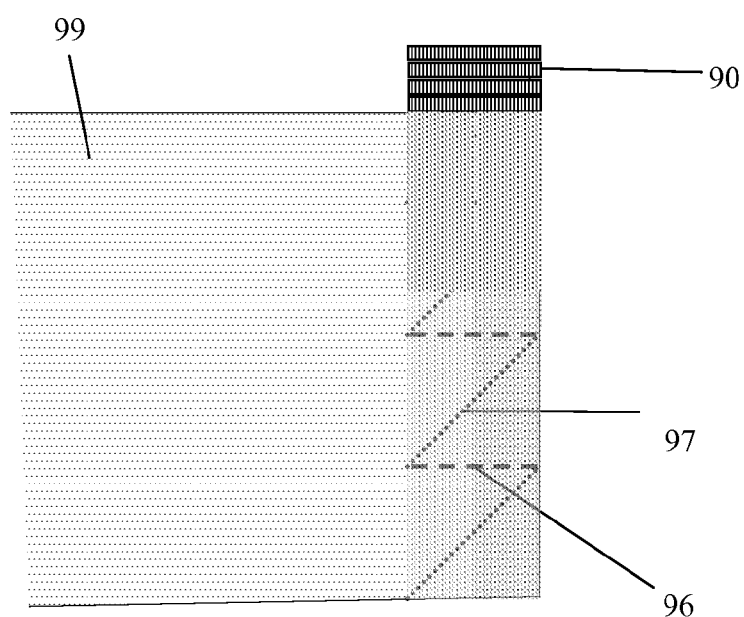
FIG. 22b schematically shows the electroded panel in FIG. 22a with the end folded such that the wire electrodes are coming out orthogonal to the wires in the main body of the panel.

FIGS. 22a and 22b show another method of bringing the wire electrodes 31w out of the electroded sheet 99 orthogonal to the direction of the embedded wires 31w in the main body of the panel. FIG. 12a shows the edge of the electroded sheet 99 with a staggered end in banks with the wire electrodes 31w connected to circuit boards 90. The staggered end is coated with a locking film 71 to electrically isolate the wires from the surface and sliced 96 back between the banks to the edge of the locking film 71. Folding each bank at their fold line 97 routes that bank 90 degrees such that the circuit boards 90 are all stacked on one corner of the electroded sheet 99 as shown in FIG. 22b.

Zigzag Electrodes

Figure 23:
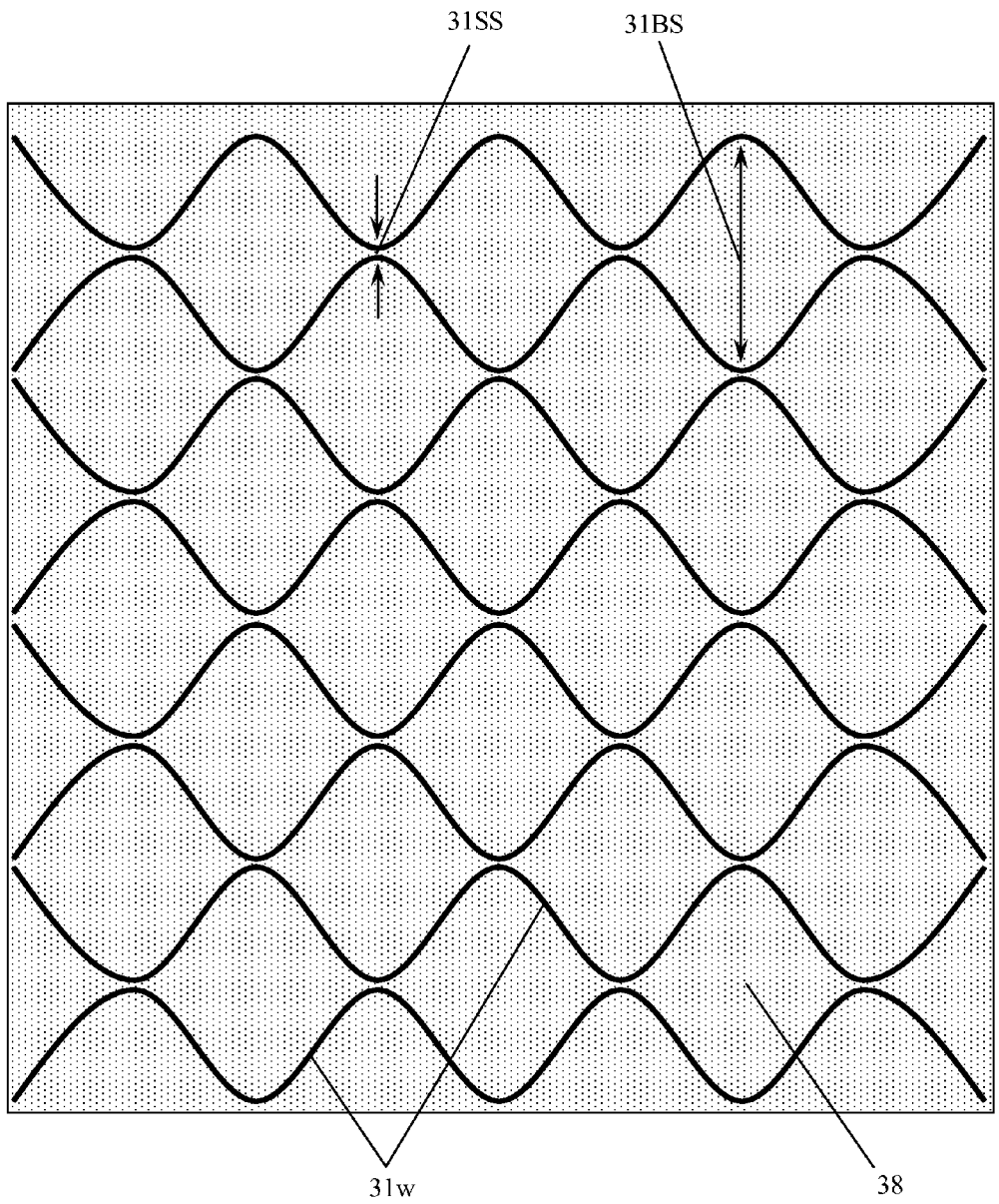
FIG. 23 schematically shows a planar view of an electroded sheet with the wires in a zigzag pattern.

Most of the above discussion concentrates on adding a transparent electrode coating to a wire electrode to spread the voltage across the row of pixels. There are some displays, such as a plasma display, that do not require the transparent coating and the spreading of the voltage, if required, can be achieved using more than one wire per electrode line. In plasma displays that use a surface discharge top electrode structure (presently all color PDPs use this structure), firing of the plasma is sustained using two closely spaced sustain electrodes. These closely spaced sustain electrodes create a high panel capacitance in large displays. To lower the panel capacitance, it is advantageous to only have the sustain electrodes closely spaced where the plasma is to be fired. Creating this closely spaced wire sustain electrode area 31SS followed by the sustain electrodes moving away from each other 31BS will form a zigzag pattern in the wire sustain electrodes 31w embedded in the surface 38 of the electroded sheet, as shown in FIG. 23.

One issue with the zigzagged electroded sheet is that, in order to achieve proper firing of the plasma in a tubular plasma display, the electroded sheet will have to be aligned to the plasma tube array. Each plasma tube will have to be aligned such that the centerline of the plasma tube is attached to the electroded sheet along the line of the close spacing 31SS of the wire electrodes 31w. It will be possible to fire the plasma in the plasma tubes and align each tube to the electroded sheet by maximizing the luminous of the plasma generated light. Note that no alignment is required in electroded sheets with straight wires.

Figure 24:
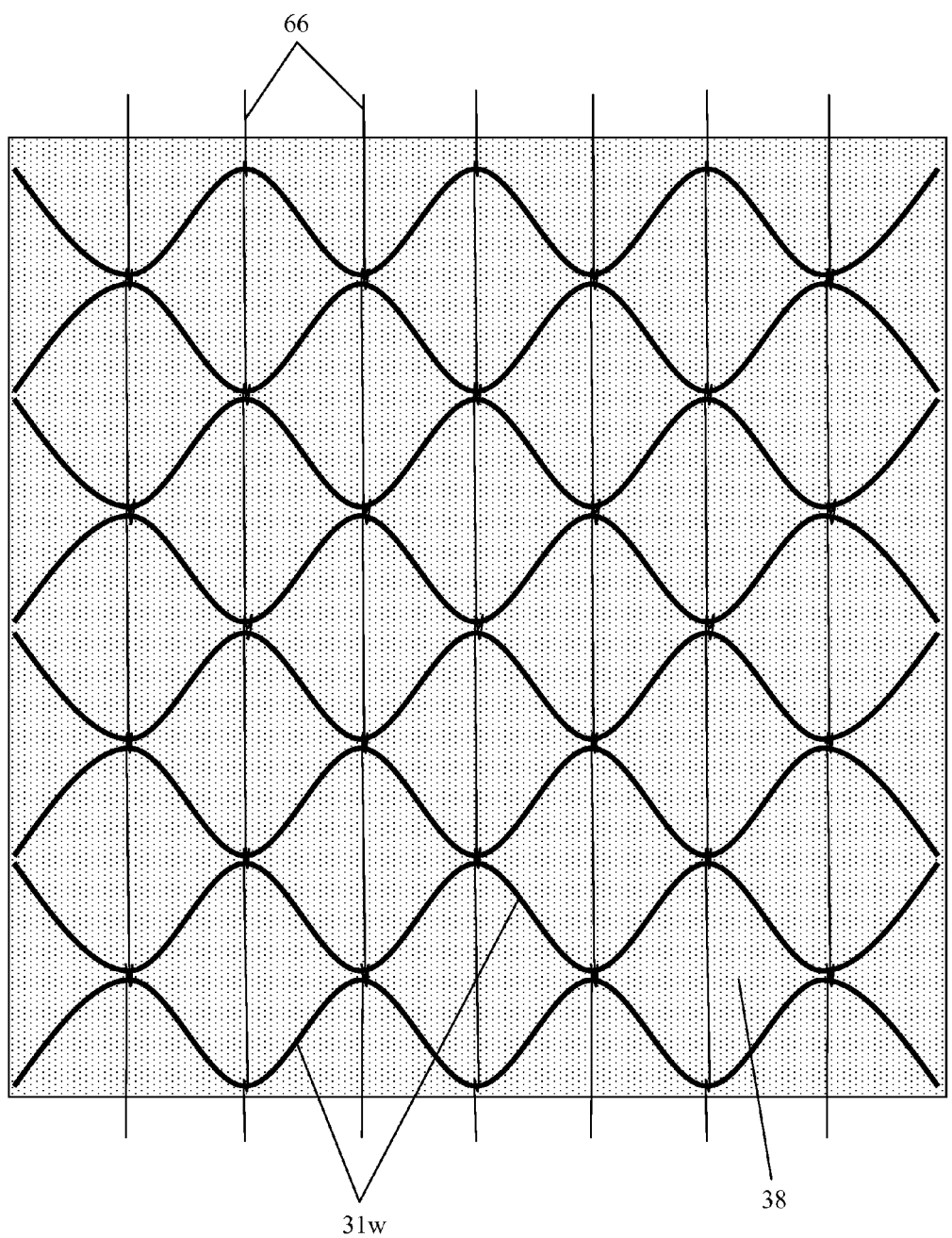
FIG. 24 schematically shows a planar view of an electroded sheet with the wires in a zigzag pattern formed by tying the wires into a mesh.

The zigzagged electroded sheet may be fabricated using several different techniques. FIG. 24 shows a method of forming the zigzag structure where the wire electrodes 31w are tied together using small thread-like material 66 to form a wire electrode mesh. The wire mesh can be stretched across the surface of the polymer substrate and embedded in the polymer surface 38. The thread-like material 66 can be removed, via heat or chemicals (liquid or gas), once the wires are held against the polymer surface 38 during the embedding process, so they do not move. If the thread-like material 66 is made out of a low melting point polymer, then the thread-like material 66 may be melted into the surface 38 of the electroded sheet. Melting the thread-like material 66 into the electroded sheet surface eliminates the requirement of removing the material 66 from the electroded sheet.

Figure 25:
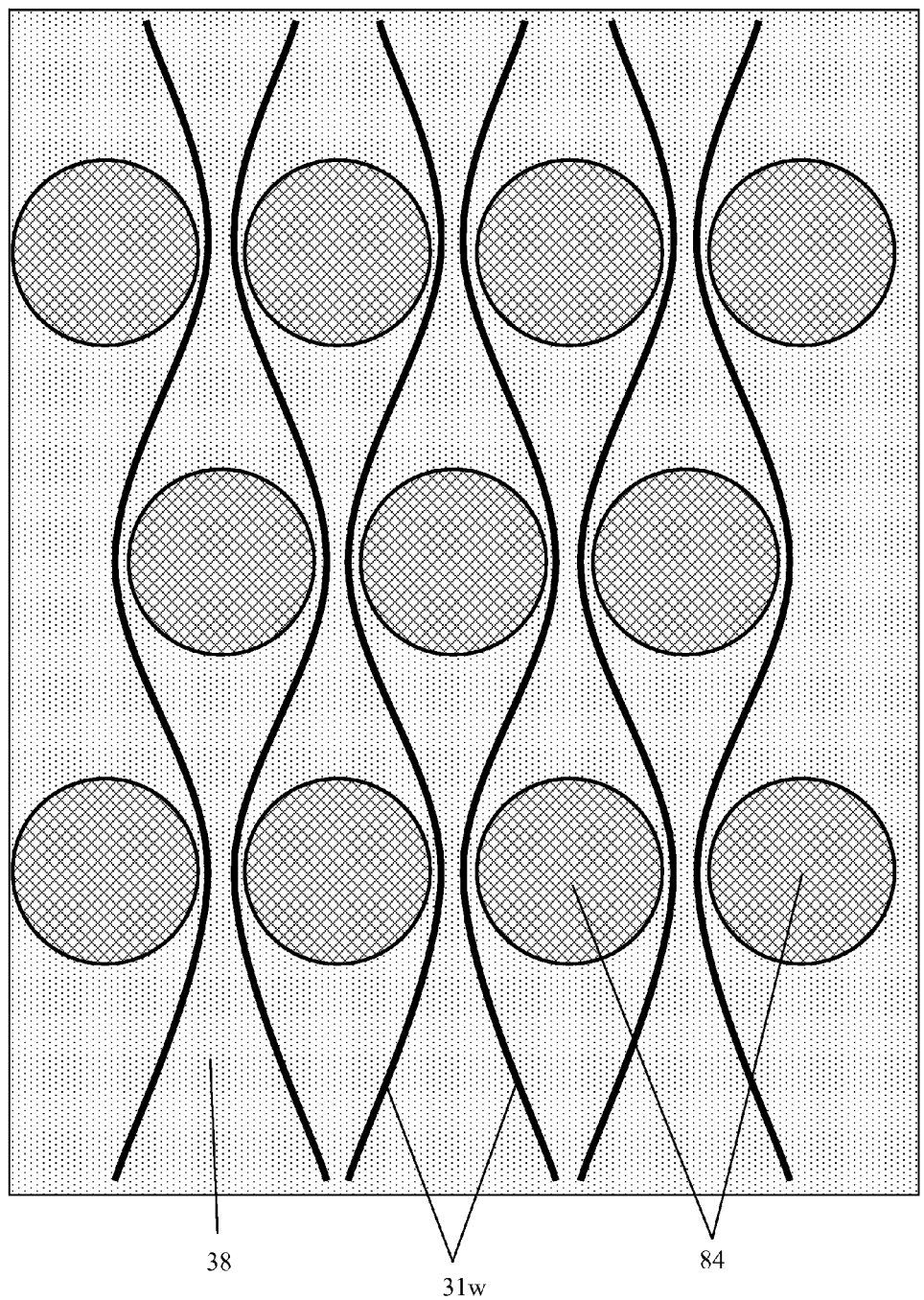
FIG. 25 schematically shows a planar view of an electroded sheet with the wires in a zigzag pattern formed using pins.

FIG. 25 schematically represents a method of using pins 84 to make the wire 31w zigzag structure. The wire electrodes 31w can be interleaved between rows of pins 84 and when the pins 84 are forced together the wires 31w will form around the pins 84 to form the zigzag pattern. The pins 84 on a carrier with the zigzag wires 31w can then be placed down onto a polymer substrate and the wires can be pushed out of the pin array 84 and into the polymer surface 38 to form an electroded sheet. A soft metal material, like copper, may be required in some of the zigzag forming processes, so it can be easily stretched and formed into the zigzag pattern. The surface of the wire electrodes can also be coated with a film, which may include carbon nanotubes, to spread the effective voltage away from the wire electrode or to remove a reflection from the wire.

Transparent Conductive Electroded Patterns

Figure 26:
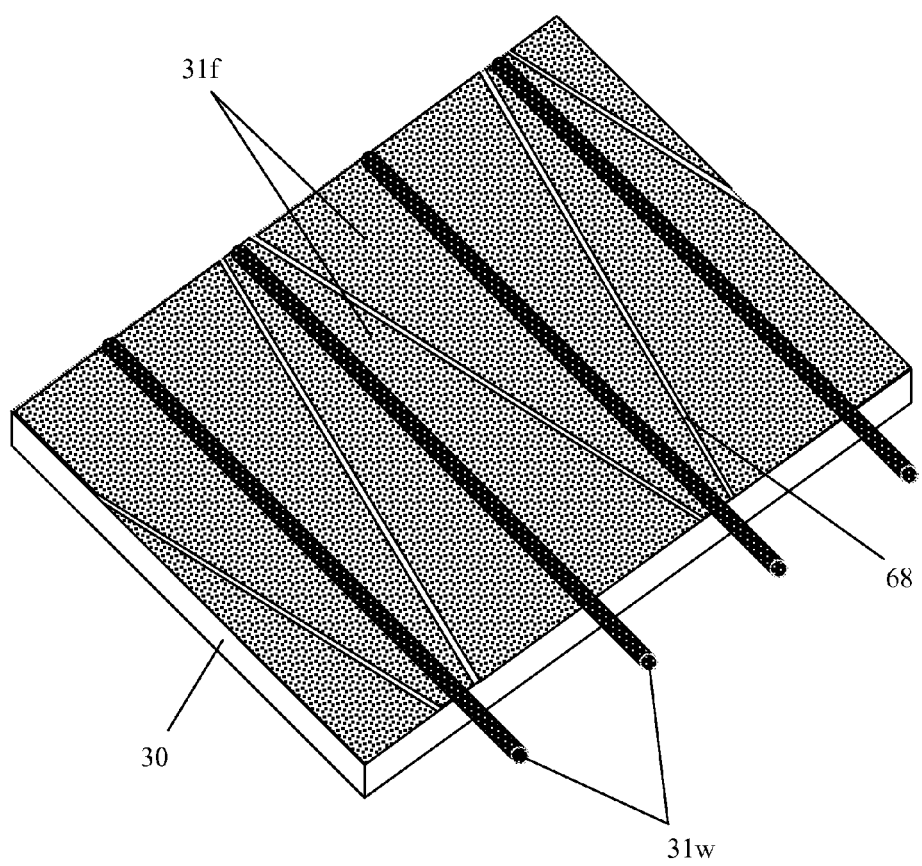
FIG. 26 schematically shows an electroded sheet where the isolation between adjacent transparent conductive electrode stripes is not parallel to the wire electrodes.
Figure 27:
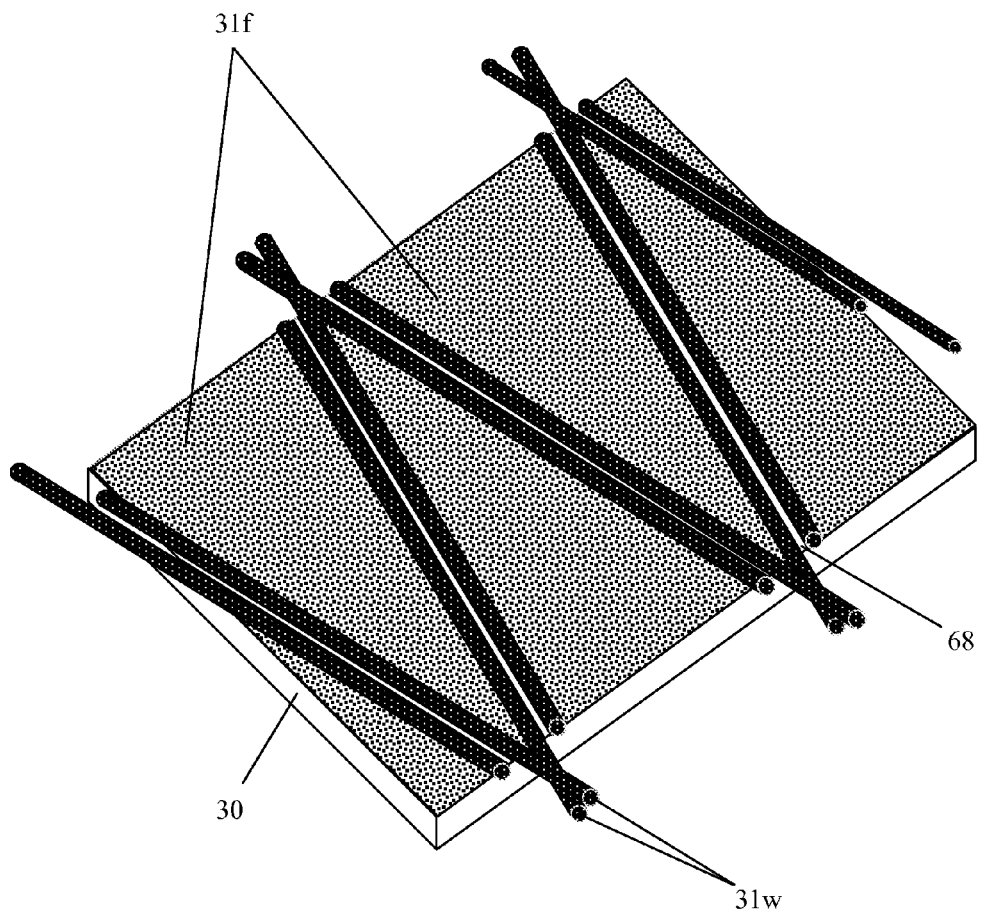
FIG. 27 schematically shows an electroded sheet with wedge shaped transparent conductive electrode stripes with the wire electrodes on the sides of the transparent conductive electrode stripes.

The transparent conductive electrode 31f in the eSheet can be patterned such that it is not rectangular and does not have a constant width over the entire length of the electrode line. FIG. 26 shows an eSheet where the transparent conductive electrode 31f forms a wedge shape from one side of the eSheet to the other side. Wire electrodes 31w extend the length of the eSheet; however the isolated regions 68 between adjacent transparent conductive electrode stripes are not parallel to the wire electrodes 31w. FIG. 27 shows a similar wedge shaped pattern, shown in FIG. 26, however the wire electrodes 31f are adjacent to the electrical isolation 68 regions. FIG. 27 shows a "webbed process" similar to that in FIGS. 16 and 17.

Figure 28A:
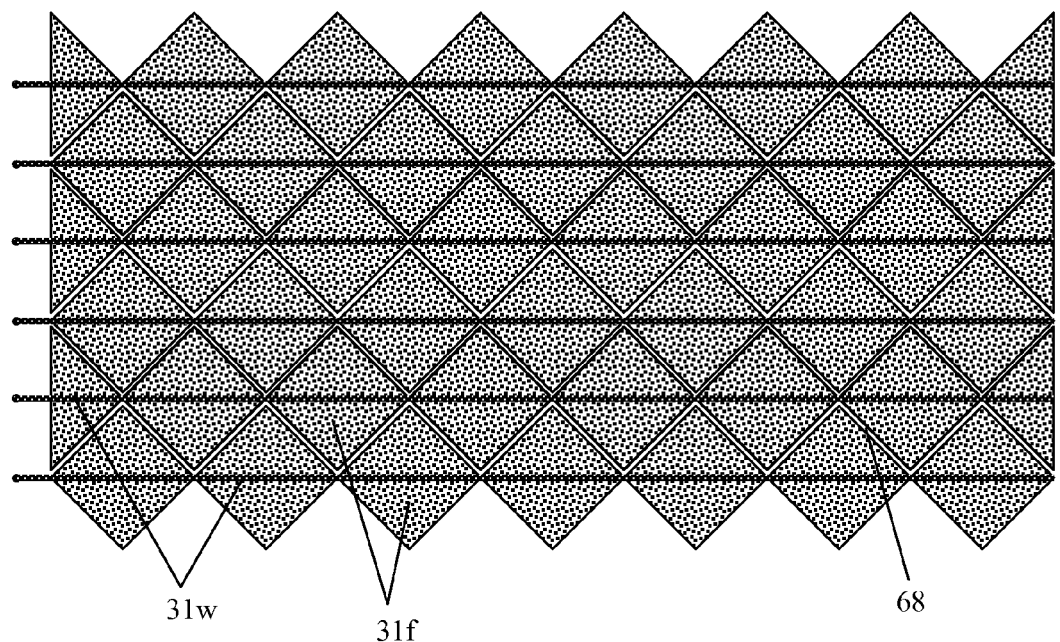
FIG. 28a shows a planar view of the electroded sheet with a sawtooth in the isolation region between transparent conductive electrodes.
Figure 28B:
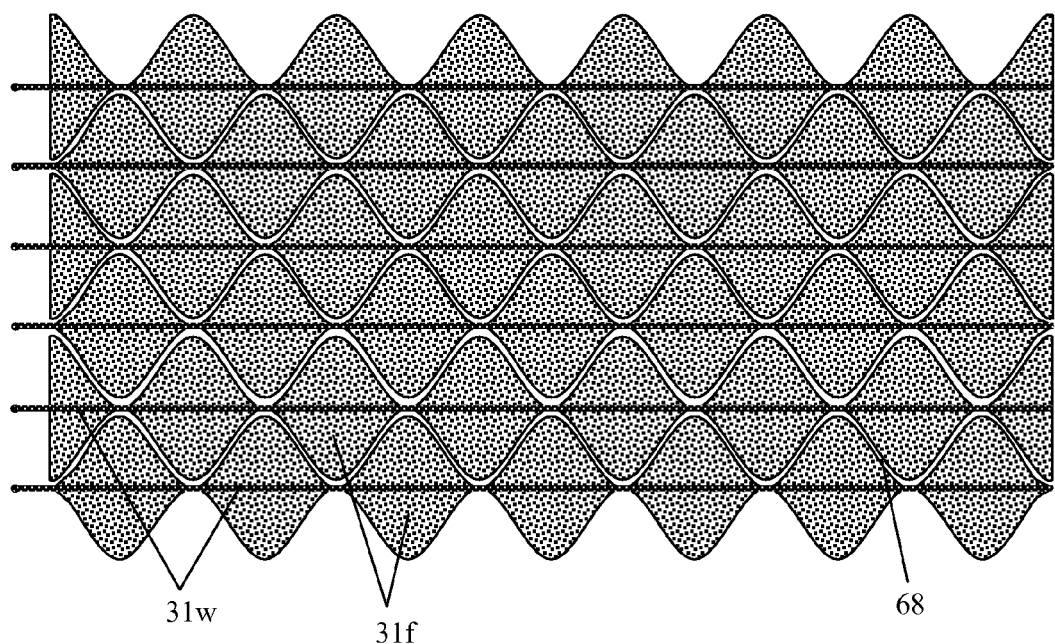
FIG. 28b shows a planar view of the electroded sheet with a zigzag in the isolation region between transparent conductive electrodes.

The transparent conductive electrode can also be patterned and take on many different shapes and sizes. The isolation region 68 between adjacent transparent conductive electrodes 31f may be non-straight or have a zigzag or a pattern associated with the isolation region 68. FIG. 28a shows the surface of an electroded sheet where the transparent conductive electrode (TCE) 31f is patterned in a "tiled" pattern where wire electrodes 31w are connected to the TCE 31f along the diagonal of the "tiled" TCE 31f pattern. FIG. 28b shows a similar pattern to FIG. 28a, however the edges of the pattern TCE 31f are rounded.

Creating an electroded sheet with shape or structure in each transparent conductive electrode stripe 31f may create a display that visually has a better image quality. A shaped TCE may provide the appearance of a higher resolution panel. A shaped TCE may also have different alignment criteria for aligning the different color panels in a Stacked eSheet eSign (SeS).

Figure 29:
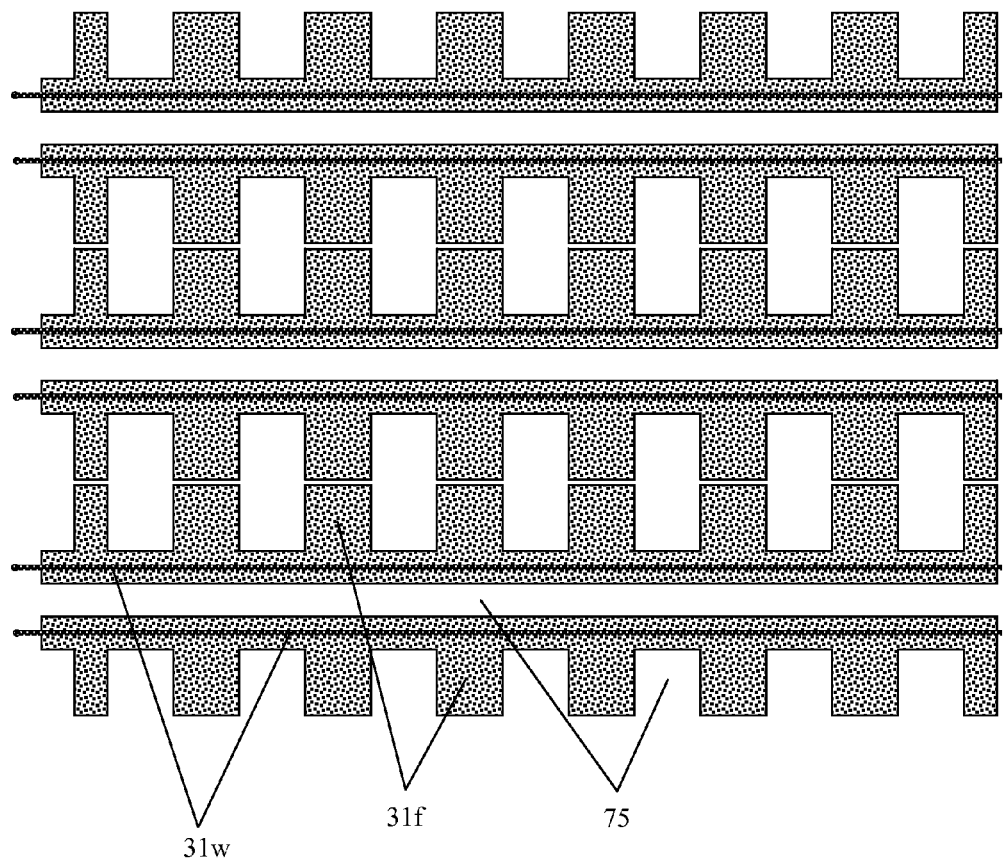
FIG. 29 shows a planar view of the electroded sheet with open or non-coated areas in the transparent conductive electrode coating.

The surface of the electroded sheet does not have to be covered entirely by the transparent conductive electrode 31f. There are some applications, such as a sustainer plate in a plasma display, where the transparent conductive electrodes 31f are patterned to create areas along the electrode with no conductive coating 75, as shown in FIG. 29.

Surface Structure and Lenses in eSheet Surface

Figure 30:
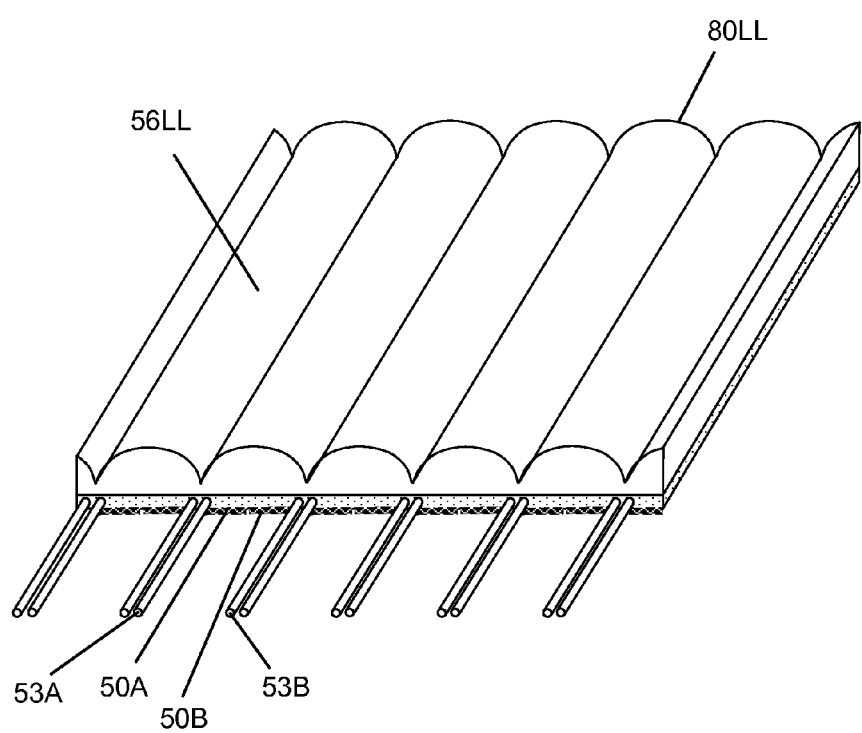
FIG. 30 schematically shows an electroded sheet with a lenticular lens embossed in the surface.
Figure 31:
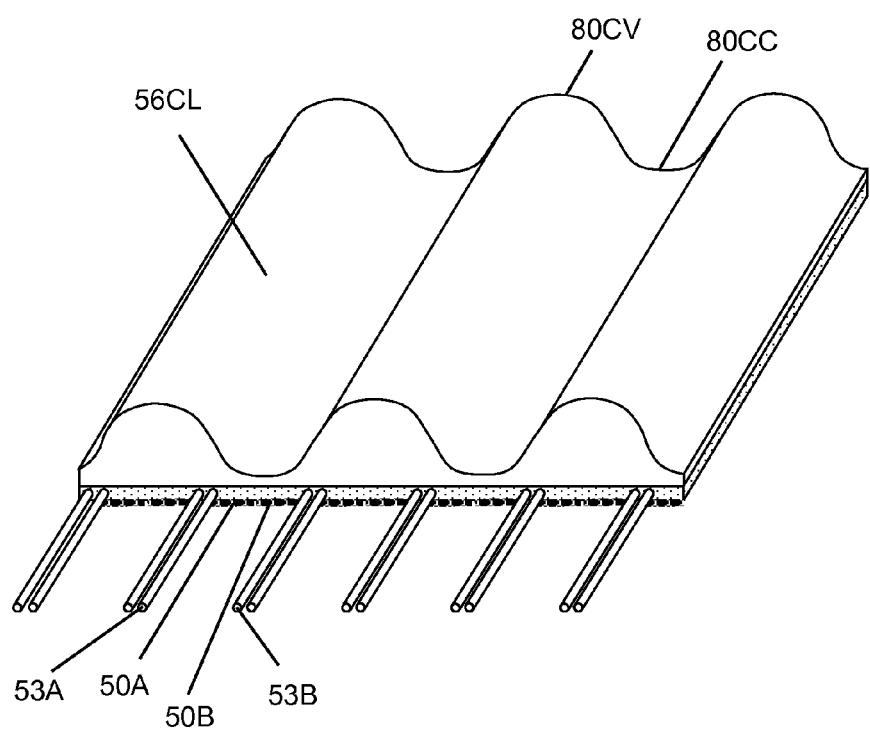
FIG. 31 schematically shows an electroded sheet with alternating convex and concave lenses embossed into the surface.

FIG. 30 shows a lens function to create multiple images or a 3-D image included in an electroded sheet. In this example, a lenticular lens 80LL is embossed into the electroded sheet 56LL. The lenses 80LL are aligned to the electrodes 53/50 in the electroded sheet 56LL. Note that there are two wire electrodes 53A and 53B attached to transparent conductive coatings 50A and 50B for each lens 80LL. These wire electrodes 53 and transparent conductive coatings 50 are preferably the same as the wire electrodes 31w and transparent conductive electrodes 31f discussed above. The lenses 80LL may be embossed into the surface of the electroded sheet 56LL or the lenses 80LL may be formed in a separate polymer sheet and bonded to an electroded sheet. Several different lens functions including concave 80CC and convex 80CV may be formed in the surface of an electroded sheet 56CL, as shown in FIG. 31. Fresnel-based lenses both in lenticular and circular form may be formed in the electroded sheets, however, if a circular or rectangular Fresnel-based lens is used, it also has to be aligned to the electrodes in the opposite direction, such as in a plasma tube array.

Other surface structure can be added to the electroded sheet surface during the thermal forming or post flattening step by using a flattening plate 10 with the inverse of the desired structure. Using a textured or stimpled surface on the top plate will form an antiglare surface on the non-wire side of the electroded sheet. A lens array could also be formed in the surface of the eSheet by using a top plate 10 with the molding lens array formed in the surface (explained above). If the electroded sheet is used for a liquid crystal display, then the liquid crystal alignment layer can be formed into the eSheet surface on the transparent conductive electrode side of the eSheet. Other textures can be formed in the electroded side of the eSheet for use in liquid crystal displays to assist the liquid crystal materials to latch into different states. These structures would serve as anchoring layers for the liquid crystal. One such structure or anchoring layer is used in BiNem® displays presently being developed by Nemoptic. Cholesteric liquid crystals could also use a textured surface for an anchoring layer to control the domain size and the pretilt angle of the liquid crystal.

Other eSheet Processes

Another method of the present invention patterns conductive electrode lines on a substrate and presses them or embeds them into the surface of the substrate to create a flat eSheet surface.

In order to get a conductive electrode to address long lines, the "metal" conductor, which could be a material including, but not limited to, metal, semimetal, semiconductor, carbon nanotubes, or carbon nanotube-like materials, will preferably have a large cross-sectional area to achieve a low resistance ($R=\rho l/A$, where $\rho$ is the conductivity of the base conductive material, l is the length of the electrode line and A is the cross-sectional area of the electrode, which is A=wt, where w is the width of the electrode and t is the thickness of the electrode). In order to not block much light, the width of the electrode should be narrow. To achieve a small line resistance a large area (A) is required, in turn leading to a necessity of having a thick conductive electrode. If a thick conductive electrode is deposited on the surface, then it will have to be embedded into the surface of the substrate in order to create a flat surface. Some methods of depositing the conductive electrode on the surface include, but are not limited to, printing (such as contact, inkjet, silkscreen, or intaglio transfer), physical vapor deposition (such as ebeam, sputtering, or chemical vapor deposition through a shadow mask or post patterning and removing (such as etching). In most displays like liquid crystal displays, the electro-optic material cell gap is small (around 5 μm), therefore a non-uniformity in the cell gap of only 1 μm will have an effect on the optical properties of the electro-optic media. If the non-uniformity of the surface flatness is a result of a conductive electrode, then the entire electric field local to the wire electrode through the electro-optic material will be dramatically altered and provide a very poor optical effect. Therefore, to create highly conductive lines on the polymer surface, the conductive electrodes will have to be embedded into the surface after they are formed.

Figure 32A:
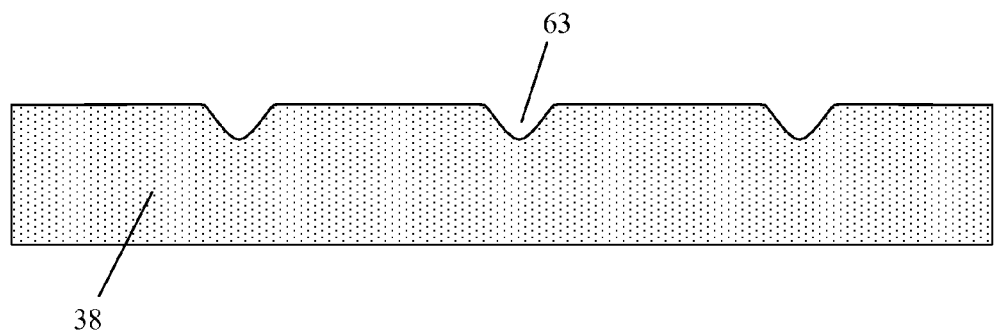
FIG. 32a schematically represents a substrate with embossed grooves.
Figure 32B:
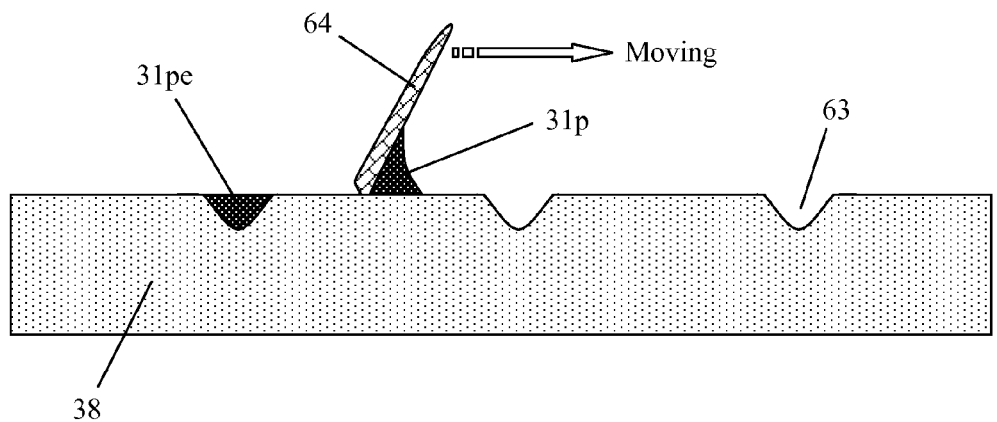
FIG. 32b schematically represents filling the embossed grooves with a conductive paste.
Figure 32C:
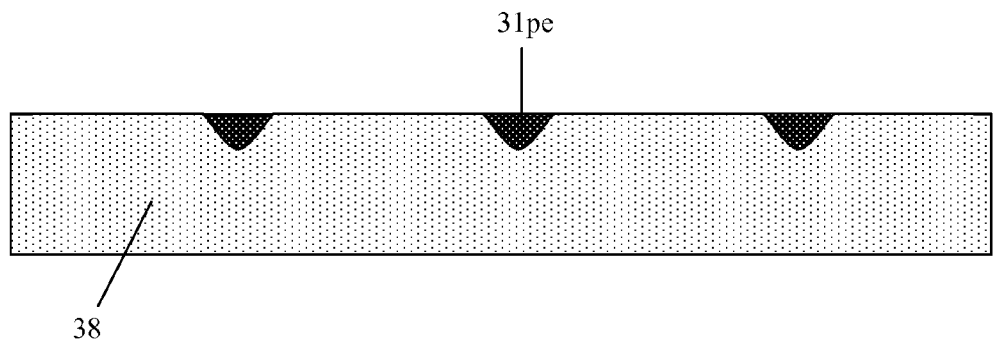
FIG. 32c schematically represents a substrate with filled grooves.

FIG. 32 shows another method of forming eSheets by embossing grooves or channels 63 in the surface of the substrate 38 and filling the grooves with a metal or conductive material 31*pe*. Grooves could be formed in the surface of a polymer substrate, shown in FIG. 32*a*, using many different methods. Some examples of forming the grooves 63 into the surface include, but are not limited to, rolling the grooves 63 into the surface using an embossing roller, pressing the grooves 63 into the surface using an embossing plate, etching the grooves 63 into the surface, or pressing wires or other fiberish material into the surface and removed. The conductive material 31*p* could be placed into the grooves using a multitude of different methods, including, but not limited to, rolling, doctor blading (shown in FIG. 32*b*), printing, or any other method that creates a smooth flat surface, as shown in FIG. 32*c*. After the conductive electrode material 38*pe* is placed into the grooved surface, the transparent conductive electrode 31*f* can be patterned over the conductive electrode to create an eSheet that is flat enough to support a thin electro-optic material, conductive enough to address long lines or large displays, and have the ability to spread the charge across the row of pixels to reliably address the entire pixel width.

Figure 33A:
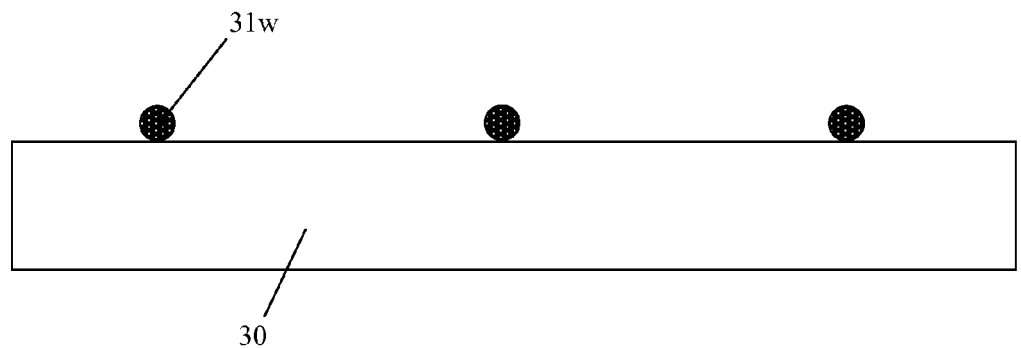
FIG. 33a schematically represents an array of wire electrodes on a substrate surface.
Figure 33B:
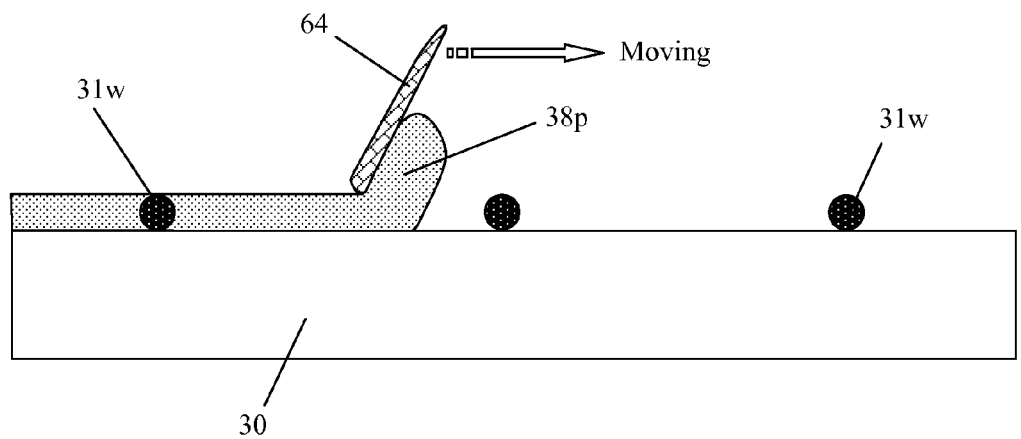
FIG. 33b schematically represents covering the wire electrodes with an eSheet substrate material.
Figure 33C:
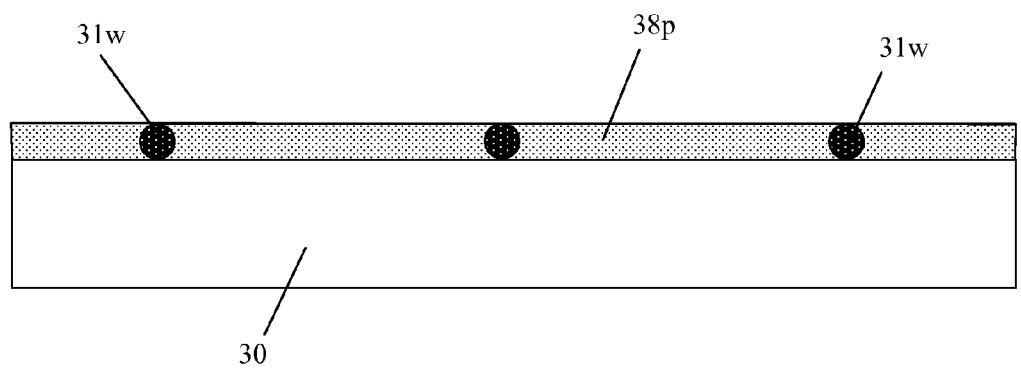
FIG. 33c schematically represents an electroded substrate.

FIG. 33 shows another method of forming eSheets by applying metal or conductive electrodes 31*w* to the surface of the substrate and applying a planarizing layer 38*p* to the substrate over the conductive electrodes to fill in the areas around the electrodes and form a flat surface. FIG. 33*a* shows the electrodes 31*w* initially placed on the surface of the substrate 30 as wire electrodes, however the electrodes 31*w* could be any conductive material like wires, paste, a physical vapor deposited material, etc. The substrate 30 could be polymer, glass, silicone, insulator coated metal or any other sheet or plate material. FIG. 33*b* shows the planarizing material 38*p* being applied to the substrate 30 surface over the electrodes 31*w*. The planarizing overcoat 38*p* could be polymer, silicone or any other material that could be used to fill the area between the conductive electrodes 31*w* and create a flat surface with electrically isolated lines. Some examples of applying the planarizing material 38*p* include, but are not limited to, using a roller, using a doctor blade 64 (as shown in FIG. 33*c*), or using a patterning process. Note that adding pressure or scraping hard across the top of the electrodes while applying the planaring material 38*p* fills the voids around the electrodes 31*w* and creates a flat surface. Some of the planarizing material 38*p* may have to be removed from the surface of the conductive electrodes 31*w* before applying the transparent conductive electrode material in order to make adequate electrical contact to the conductive electrode.

Figure 34A:
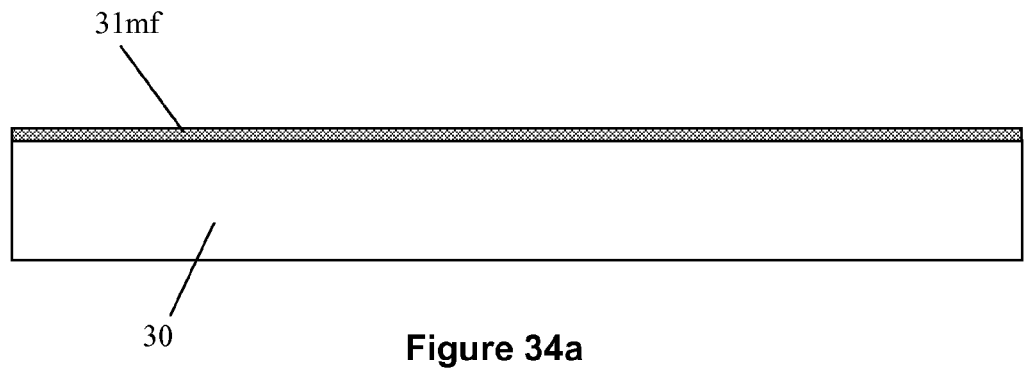
FIG. 34a schematically represents a substrate with a conductive coating.
Figure 34B:
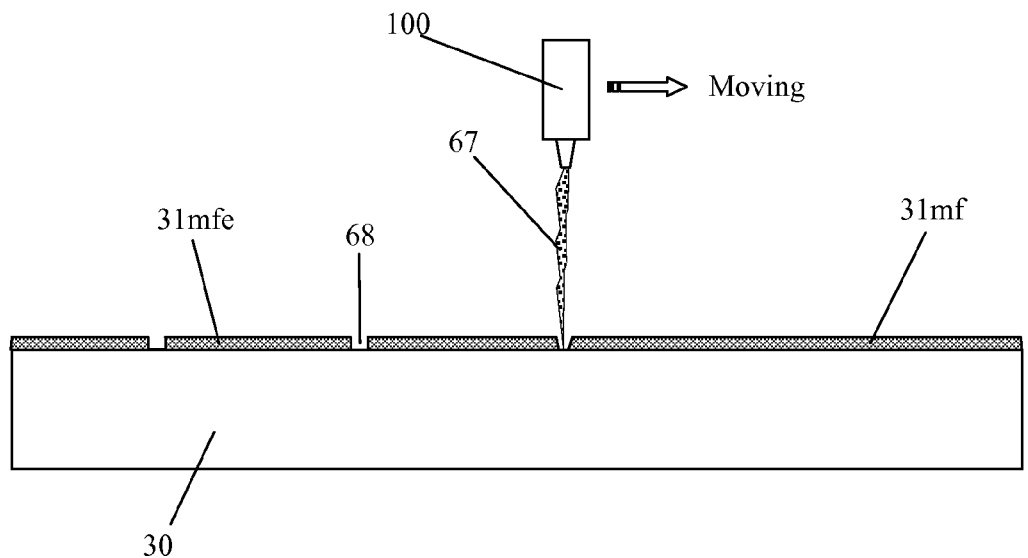
FIG. 34b schematically represents laser scoring grooves in the conductive coating.
Figure 34C:
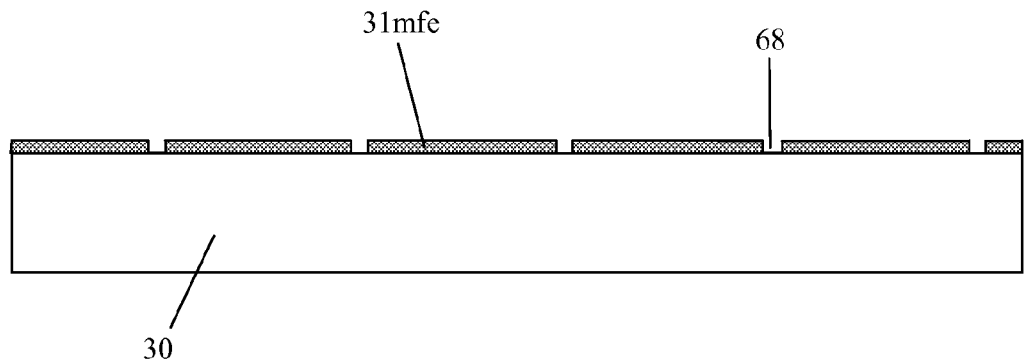
FIG. 34c schematically represents an electroded substrate with conductive stripes.

FIG. 34 shows another method of making a sheet with electrodes on the surface. FIG. 34*a* shows a metal film 31*mf* coated substrate 30. The metal film 31*mf* can be a shinny metal coating or can be a multiple layer, such as a conductive metal coating with a black absorbing coating or a color coating. One potential metal film 31*mf* coated substrate 30 would be metalized Mylar or PET. A laser 100 may be used to pattern metal electrode stripes 31*mfe* into the surface of the metal film 31*mf*, as shown in FIG. 34*b*. A laser beam 67 can be used to cut through the metal coating 31*mf* to form an opening 68 in the metal coating 31*mf* forming patterned metal electrode stripes 31*mfe*, as shown in FIG. 34*c*. The dips 68 in the electroded sheet surface where the metal is removed could be filled with a polymer or silicon material to planarize the surface. Note that since the metal electrode 31*mfe* covers virtually the entire surface, the metal electrode 31*mfe* will block any light or reflect any light trying to propagate through the substrate 30; therefore it could only be used as a back substrate in a display application.

Wire Embedding Process

The wire electrodes can be sunk or embedded into the substrate by scanning a heating element across or along the length of the eSheet while the wires are being pressed firmly against the substrate. This pressing force could be applied between the wires and the substrate as a result of rollers rolling along or across the wire electrodes. A plate could also be used to press the wires into the substrate while a "line" heater is scanned along the length of the eSheet. The eSheet could also be plunged into a furnace or run through a leer. In order to achieve a high quality eSheet with no bubbles or defects on the surface, a vacuum should be applied to the interface where the wires are being embedded into the substrate. To achieve a high quality eSheet, the vacuum should be below about 10 Torr and is preferable below 200 mTorr.

One very simple method of embedding the wire electrodes into the substrate wraps a rigid plate with the fine wire electrode. The rigid plate may be a glass plate that is coated with a release layer. Sacrificial saw tooth polymer wire guides could be placed on the ends of the glass plate to set the wire pitch and relax the wire stress to a desired amount on each wire wrap during the heating process. The polymer substrate is then placed across the strung wire array on the release coated glass substrate. The entire assembly is then placed in a vacuum bag. A release cloth or a breather material could be placed over the polymer substrate to remove all the air across the top side of the substrate and create vacuum ports around the perimeter of the substrate. A preferred substrate would be a PET base sheet coated with a lower melting point polymer coating. If this PET/polymer substrate is chosen, then the polymer side would be placed against the wire array. If a simple polymer substrate, like PMMA, is chosen then as the polymer substrate softens the top surface will take on the texture of the release cloth. If no texture is required or a different texture is required then a second layer could be placed between the release cloth or breather material and the PMMA substrate to provide that texture. If a smooth surface is desired then the second layer could be a rigid glass plate with a release coating. After the entire assembly is placed in the vacuum bag, it is sealed closed and a vacuum is pulled inside the bag. The vacuum pressure should be below 1 Torr and preferably in the 100 mTorr range to remove all the trapped gas or air from the interface between the flattening plate and the polymer substrate. Heat must be added to the vacuum bag assembly to get the polymer substrate to flow around the wire electrodes, such that the wire electrodes are embedded into the surface of the polymer sheet. The vacuum bag assembly could be simply placed into a furnace above the softening point of the polymer. However, during the initial heat-up stage some polymers outgas (especially those that have not been previously annealed). This outgased gas can get trapped at the interface between the polymer substrate and the flattening plate and cause detrimental affects to the flatness of the eSheet surface. One method of preventing the outgased gas from getting trapped in the interface is to scan the heat source across the vacuum bag assembly along the wire direction toward the vacuum port. As the heat zone is being scanned across the eSheet and the polymer softens and outgases, the gas is pulled along the channels around the wire electrodes and out through the vacuum pump. Note that before the wire electrodes are embedded into the polymer substrate the wires hold the substrate away from the flattening plate creating channels around and between the wires for the gas to escape. A heat zone can be created in many different ways including, but not limited to, scanning a heating rod across the surface of the vacuum bag, plunging the vacuum bag assembly into an oven or furnace, or sending the vacuum bag assembly through a leer. Sending the vacuum bag assembly through a leer provides for the opportunity to bring the temperature of the entire vacuum bag assembly up to slightly below the softening point ($T_g$) of the polymer substrate then through a hot zone where the polymer substrate softens and flattens onto the flattening plate. Bringing the vacuum bag assembly up to slightly below the glass transition temperature of the polymer substrate has two major effects: 1) the polymer will start to outgas and some of the gas will be able to be removed from the polymer substrate before it is formed onto the flattening plate surface, and 2) the increased starting temperature of the beginning of the heat zone will reduce the change in temperature ($\Delta T$) across the glass substrate to keep it from thermal stress cracking or breaking. All of the processes mentioned above to embed the wire electrodes into the polymer sheet could also be used to flatten the final eSheet with or without a conductive electrode film electrically attached to the conductive electrode.

One issue in forming an eSheet using some of the above methods is to achieve a uniform and exact pitch of the wire electrodes and the subsequent mask for the transparent conductive electrode. One method of achieving this pitch is by attaching wire guides to the edge of the plate or to cut a wire guide pattern into the edge of the plate. One issue with using a rigid wire guide pattern, similar to that obtained by cutting a pattern into the edge of the plate, is that the tension in the wire will be controlled by the tension in the wire during the wrapping of the wire and the difference in thermal expansion of the plate, the wire electrode and the polymer substrate as well as the glass transition temperature of the polymer substrate. It is important to control the tension or compression in the wire while embedded in the surface of the polymer film to prevent the stress in the wire from curling the eSheet. One method of setting all the wires across the eSheet at the same desired tension uses sacrificial wire guide edges on the ends of the plate while wrapping the wires around the plate. A serrated edge could be cut into the sacrificial wire guides on the desired wire pitch. The structure, softening and flow properties of the sacrificial wire guide edges can be designed to allow the wire electrodes to sink into them a desired amount to relieve the stress in the wire during the embedding process. Note that if the sacrificial wire guides edges soften during the flattening or wire embedding process then all of the wires will sink into them and the resulting tension in the wires will be very uniform across all the wires irrespective of the initial tension in the wires.

eSheet Products

There are many potential uses for an electroded sheet (eSheet). An eSheet can supply power to a line or plane in a device, such as a display, eSign, lamp, touch screen, battery, printer, speaker, heater, sensor, ribbon cable, or transmitter to name a few. An eSheet can also remove power from a line or plane in a device, such as a solar cell, fuel cell, battery, EMF/EMI shielding, sensor, or antenna to name a few.

eSheet Display Products

Figure 35A:
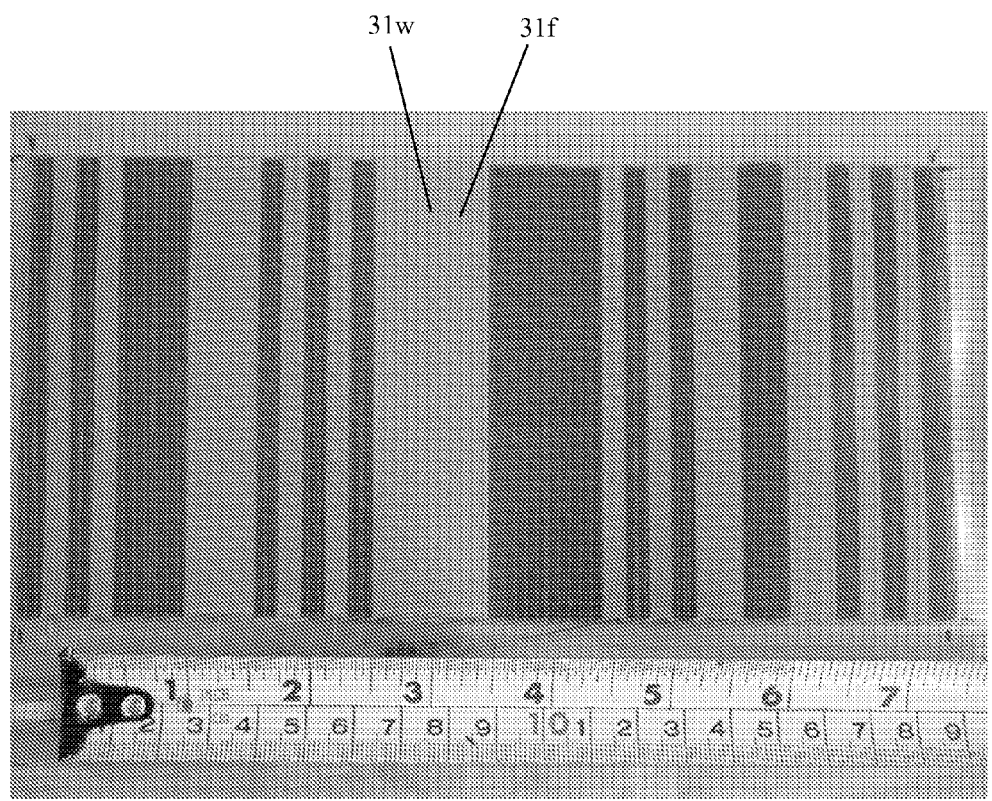
FIG. 35a is an image of Gyricon ePaper switched between two eSheets.
Figure 35B:
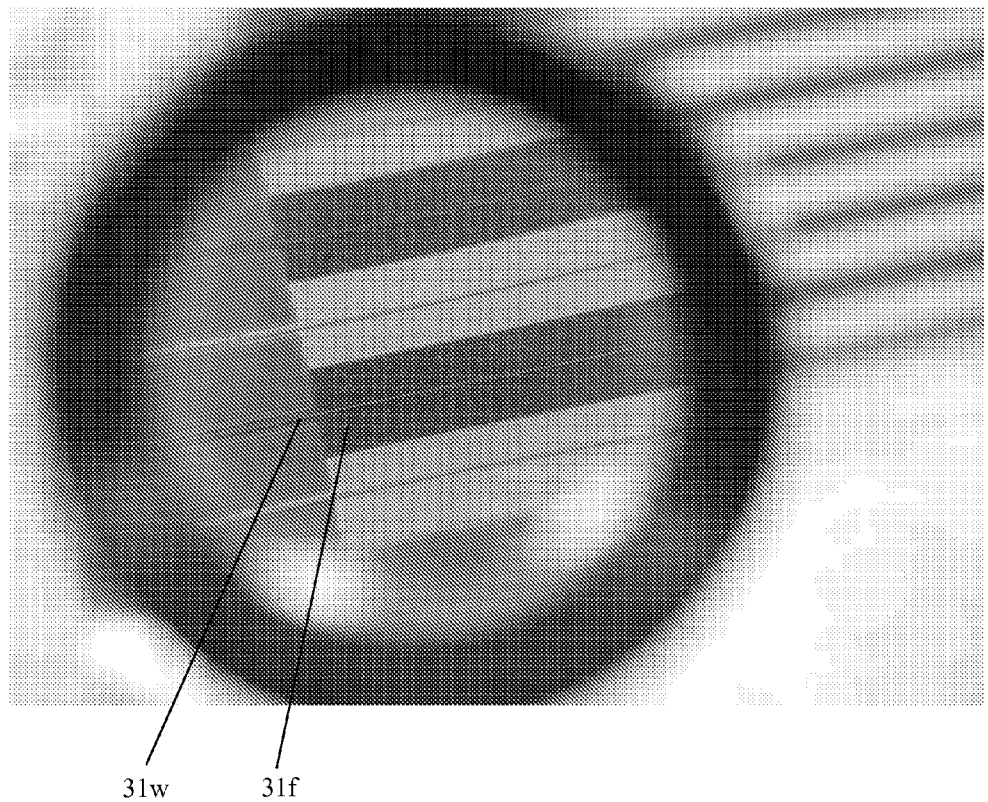
FIG. 35b is an image of E-Ink's electrophoretic material switched between two eSheets.

An electroded sheet or eSheet can be used for a vast number of different display products. The first type of display product using an eSheet is a segment addressed display. A segment addressed display means that each segment in the panel is attached to its own driver. The most simple segment addressed panel structure is two eSheets sandwiched around an electro-optic material, such as a liquid crystal (LC), electrophoretic, gyricon, electrochromic, quantum dot or an organic light emitting diode (OLED) material. If at least one of the eSheets has a segmented pattern designed into the surface then each individual segment can be switched by applying a potential to that segment in the eSheet. FIG. 35 shows two examples of electro-optic materials being modulated while sandwiched between two eSheets. FIG. 35a shows a Gyricon electro-optic material sandwiched between two electroded sheets (eSheets) where the top eSheet has a varying electrode pitch of 0.1" to 1". The top wire electrodes 31w in the eSheet are interdigitated and the voltages on each set of interdigitated pairs are switched to the two separate addressing voltages. The sample demonstrates that the voltage can be spread from a single electrode 31w across ½" of the transparent conductive electrode 31f to modulate the electro-optic material. FIG. 35b is a 10× zoomed in image of an eSheet switching E-Ink's electrophoretic material. The electrophoretic material switches under the wire electrodes 31w, but only close to the wire electrode unless the transparent conductive coating 31f is applied to the bottom of the eSheet. Note that in both images in FIG. 35 the transparent conductive electrode 31f was only applied and patterned where the electro-optic materials are switched between the black and white states. The eSheet may also be combined with plasma tubes to create a segment addressed display. Applying an AC between the eSheet electrode and an electrode in/on the plasma tube will ignite a plasma inside the plasma tube. Another type of display product using an eSheet is a passive addressed display.

A passive display usually has an x-y grid of electrodes where voltages can be applied to the individual electrodes to generate an image in the display. Addressing a passive display requires that the image is written to the display one line at a time and the electro-optic material has a voltage threshold. The voltage threshold requirement means that the difference in the voltage to switch the display between its two states has to be less than the switching voltage of the electro-optic material. An image can be generated in an electro-optic material by sandwiching the electro-optic material between two patterned striped eSheets and applying the proper voltage waveforms to the wire electrodes in the eSheets. The most well known electro-optic material that has a threshold and can be passively addressed is a liquid crystal (LC). If a standard twisted nematic LC is used then polarizers will have to be added to the passively-addressed display. There are other types of LC materials with voltage thresholds, like cholesteric LC and smectic A LC, that do not require polarizers and are also reflective and bistable. Reflectivity is very important for low energy applications because they do not require backlights. Bistability means that when an electro-optic material is modulated to a different state it holds that state until it is forced back to its original state, where multistable means the electro-optic material has many stable states. These reflective bistable color displays may replace standard color prints. There are two methods of creating a reflective color display or electronic sign (eSign). One method places the red, green and blue (RGB) pixels side-by-side like is presently done in all color video displays. A second method stacks the red, green and blue pixels on top of each other. This stacking method requires that the electro-optic material may be modulated from a transparent state to a reflective red, green or blue state. This stacking method also allows for the usage of the entire pixel to reflect the entire visible spectrum. In contrast, when the RGB colors are placed side-by-side, ⅔ of the light is wasted because the red pixel does not reflect green or blue, and a similar phenomenon occurs for the green and blue pixels. Therefore, a RGB stack three layer panel is required to create a high quality reflective color display. There are two known materials that may be modulated from a transparent to a reflective R/G/B state, a cholesteric liquid crystal (developed by Kent Displays) and a smectic-A liquid crystal (developed by PolyDisplay/TechnoDisplay). Both of these liquid crystals have thresholds and may be passively addressed. Therefore, reflective color electronic signs may be fabricated by using three separate panels consisting of two orthogonal electroded sheets sandwiched between each of the three color liquid crystal materials. This Stacked eSheet eSign (SeS) would allow for the manufacture of very large single substrate electronic signs (eSigns). A reflective color electronic sign may also be formed using two single-sided electroded sheets sandwiching two double-sided electroded sheets with the three primary color liquid crystals layers between each electroded sheet. Note that if the display is reflective then it would be advantageous to use cyan, magenta and yellow instead of red, green and blue for the colored liquid crystal materials. There are also other passively-addressed displays that may be constructed using electroded sheets. If an electroded sheet is designed such that the electrodes are exposed to the surface, then they may be used to address electro-optic materials that require current such as, electrochromic displays and passive addressed organic light emitting diode (OLED) displays. The electroded sheet may also be used to address other electroluminescent materials, such as quantum dots (as being developed by QD Vision, MIT's QD-OLED, and Evident Technologies). Passively-addressed displays are good for non-video rate applications.

For video rate applications, such as TV, a display with active addressing is required. An actively-addressed display is one that uses a switch "at every pixel" to set charge or flow current onto that pixel. Some examples of active switches used in displays are transistors, diodes, plasmas and micro-electromechanical (MEMS) elements. The actively-addressed displays are traditionally addressed one line at a time, however, it is the active switch, like a transistor, that is being addressed and not the electro-optic material. Active switches, like transistors, can be modulated much faster than most electro-optic materials, therefore the charge can be set very quickly at each pixel and the electro-optic material can then respond to that set charge. Adding an active switch to the displays removes the requirement that the electro-optic material has threshold. The most well know and widely used active display is the active matrix liquid crystal display (AMLCD), which used a transistor at each pixel in the display to charge a pixel pad, in turn modulating the LC at that pixel. An electroded sheet may alternatively be used as the column addressing plane in a plasma-addressed electro-optic display (PA-EO). In this case, the electroded sheet serves to set the charge in the plasma channels and act as a ground plane for modulation of the electro-optic material. The plated out charge in the plasma channels creates an electric field, which may be used to address several different electro-optic materials: liquid crystals, twisting balls or twisting cylinders (like those being developed by Xerox "Gyricon"), electrophoretic materials (like those being developed by E-Ink or SiPix), or suspended particle devices (such as those being developed by Research Frontiers Incorporated).

Figure 36A:
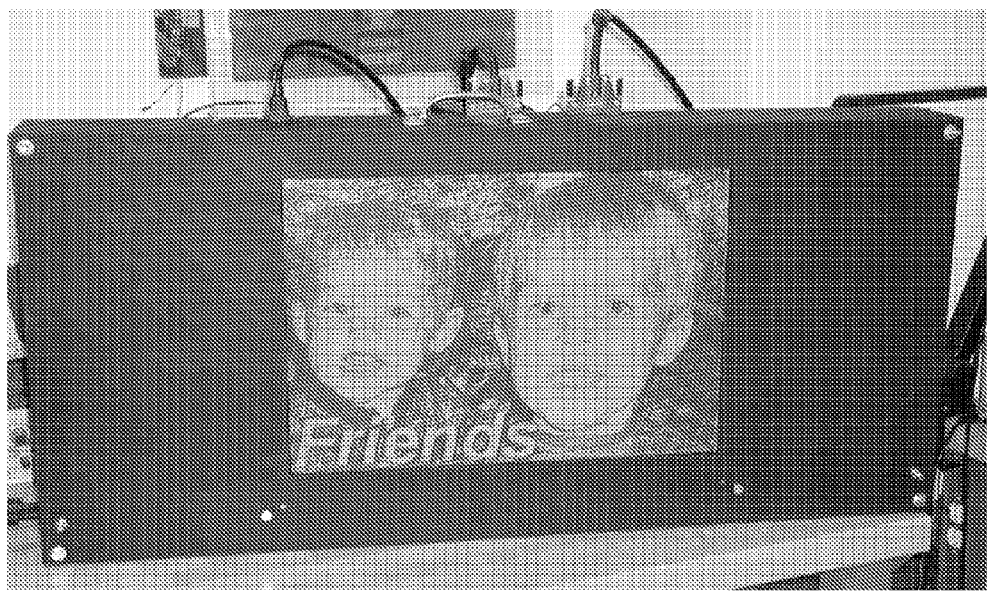
FIG. 36a is an image of a reflective bistable plasma-addressed display constructed using an eSheet for the column electrode plane.
Figure 36B:
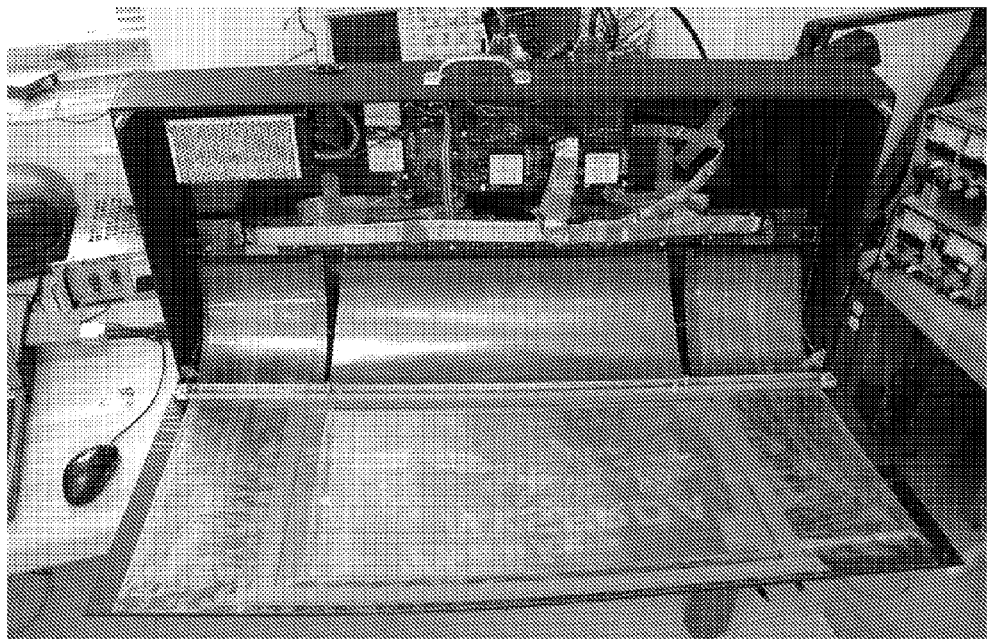
FIG. 36b is an image of the insides of the plasma-addressed display of FIG. 36a showing all the electrodes being attached to the drive electronics on one edge.

FIG. 36A shows a plasma-addressed display using Gyricon ePaper as the electro-optic material. An eSheet is used for the column addressing plane in the display and an array of plasma tube is used to generate and store the charge. The Gyricon ePaper is sandwiched between the eSheet and the plasma tube array. The display in FIG. 36A has 384 pixels×255 pixels and is 23 inches diagonal. FIG. 36*b* shows the display opened up and that all the wire electrodes are connected to a circuit board on one edge of the displays. The wires from the plasma tubes are bent to a 90° angle to connect to the electronics. Another type of active display is a plasma display. A plasma display can be fabricated using an electroded sheet attached to an array of plasma tubes as explained in US Patent Publication US-2007-0132387-A1, filed Dec. 11, 2006, entitled "TUBULAR PLASMA DISPLAY" and PCT Patent Application Number PCT/US2006/061872, filed Dec. 11, 2006, entitled "WIRE-BASED FLAT PANEL DISPLAYS", both incorporated herein by reference. FIG. 37*a* shows the basic structure of a tubular plasma display panel where an array of plasma tubes 57 are attached to an eSheet 56. FIG. 37*b* shows another basic property of an eSheet display. Since the eSheets are formed on a flexible substrate they can be rolled up. FIG. 37*b* shows an array of color coated plasma tubes 57*c* attached to an eSheet 56 that is rolled up into a tube. Therefore, it is possible to make a rollable color video display. FIGS. 37*c* and 37*d* show images of a tubular plasma display where alternating tubes are coated with color phosphors and sealed closed with a Xenon containing base gas. The images are actively addressed by applying voltage waveforms to the wire electrodes in the eSheet and the wire electrodes in the plasma tubes.

Some layers in flat panel displays require RGB color filters. In these cases, the color filter may be added to the electrode sheet. The RGB colors may be added to the TCE coating such that when they are deposited in a pattern, the color filter is deposited at the same time. In this case the RGB color filter is inherently aligned with the electrodes. The color filter may also be applied on top of the electroded sheets.

Most liquid crystal displays require polarizers in the optical film stack. Most traditional passive and active liquid crystal displays sandwich the liquid crystal cell with electrodes between two polarizers. The electroded structure could be designed into the surface of these polarizers, therefore the polarizer would serve as the substrate for the eSheet. The rubbing layer or liquid crystal alignment layer may also be applied to the surface of the eSheet polarizer. If the wire electrodes can not be embedded into the polarizer substrate then an additional thermal polymer material can be applied to the surface of the polarizers and the wire electrodes can be embedded into the surface of the thermal polymer. Another method of creating an eSheet polarizer is to form an eSheet in a separate process and substrate and optically bond the eSheet to the polarizer.

Electroded sheets could also be used for many other types of displays like microelectromechanical (MEMS) displays and 3-D and multi-view displays. 3-D and multi-view displays may require that a lenticular or other lens shape be embossed or molded into the surface of the electroded sheet while it is being formed.

The electroded sheets could also be used to form a display, like a reflective color electronic sign, as discussed above, and the electronic sign may be used in combination with another display, like a color video display. Combining more than one display serves multiple purposes, such as, a reflective electronic sign, color video, three-dimensional display, multiple view display and a double-sided display. Combining a reflective bistable color liquid crystal electronic sign with a color video display creates a display that will optimally display static images using the liquid crystal sign section without phosphor burn-in and large energy consumption and will also be capable of creating full motion video. If a three layer color stacked liquid crystal display is formed using electroded sheets and it is attached to a tubular plasma display formed using plasma tubes attached to an electroded sheet, then the combined display perfectly serves both static and video images and is rollable.

Other eSheet Products

The eSheet and methods of forming the eSheets can be used to make many different other types of products. ESheets may be used to make solar cells, such aα-Si, CdTe, CdSe, CdS, CuInSe$_2$, dye-sensitized solar cells, organic/polymer solar cells, nanostructured photovoltaic devices, to mention a few. The eSheets can be used to make single solar cells or the pattern eSheets can be used to make a series of solar cells where several solar cell devices are tied in series for higher voltages. Since most versions of the electrode sheet use a transparent conductive electrode, it is beneficial for the eSheets to be used for the top electrode plane. The top surface of the eSheet may also be textured to couple more light into the solar cell.

ESheets may be used to fabricate electrochemical cells, such as fuel cells and batteries. Fuel cells may also be constructed using eSheets, however it will not be necessary for the transparent conductive electrode, which is attached to the wire electrode, to be transparent. The conductive coating connected to the wire electrodes for each side of the cell may be the anode and cathode of the fuel cell, which sandwiches the electrolyte (or proton-conducting polymer membrane) in a proton exchange membrane fuel cell. The anode in the eSheet may contain platinum or platinum alloy to separate out the hydrogen and deliver it to the electrolyte. The eSheet substrate may have grooves or channels on the surface to deliver the gases to the cell. The eSheet substrate material may also be porous to allow the reactive gases to flow into the cell. The wire electrodes in the fuel cell will be beneficial to be able to pull the current out of the cell with minimal loss in power. In addition, the wire electrodes can be composed of virtually any metal capable of being drawn into wire. Batteries may also be fabricated using electroded sheets where two eSheets may form the positive and negative electrodes and sandwich an electrolyte material. The wire electrodes can be used to discharge or charge the battery.

The best use of the eSheet in a large area sensor is for touch screens using a resistive, capacitive and projective capacitive sensors. A multiplexed touch screen sensor can be built using an x-y grid from two orthogonal eSheets. The wire electrodes can be attached to the electronics to send and sense the location of the disturbance along the length of the line. The wire electrodes are very conductive and cause minimal dampening of the signal along the line. The transparent conductive stripes create a larger sensing area leading to higher sensitivity in the touch panel while blocking minimal light through the panel.

Electroded sheets can also be used to shield electromagnetic fields or EMI/EMF. The wire electrodes will create an easy connection and if a thin eSheet substrate is used then the EMF shield will be very formable or drapable. One difference in an EMF shield is that the transparent conductive electrode may not need to be patterned into stripes. Also, the conductive film attached to the wire electrodes may not need to be transparent.

The electroded sheet can also be used as an antenna to transmit or receive a wireless signal. The wire electrodes can be tied together at the ends to form a long antenna path through the eSheet. Also the eSheets can be made in very large or long sizes and can be rolled and unrolled for better reception.

EXAMPLE

This example uses an aluminum drum, 9"OD×6.5"L×¼" walls (28.3" circumference). A piece of polymer coated PET (MacTac TL5100 10 Mil Matte Polyester-7 mil thick Mylar® film with 3 mil thick polymeric adhesive) is cut 6" wide by 25" long. Double stick tape is used to attach both ends of the TL5100 film to the drum, polymer film facing outward. Once the TL5100 film is in place, 0.003"D Kovar wire is wrapped around the drum over the TL5100 film on a 0.100" pitch. Next the drum is placed in an oven at 130° C. for ½ hour. Calculations show that the 9"D aluminum drum expands 0.0228" in diameter going from 20° C. to 130° C., and the Kovar wire wrap diameter expands 0.0059". This difference of 0.0169" easily pushes the wires into the 0.003" polymer coating. Once the drum is at 130° C. and the wire is sunk into the polymer film, the Kovar wire is stretched 0.0343" for each turn on the drum resulting in a total stress on the wire electrode of 24,200 psi. Since the yield stress of Kovar is 50,000 psi, the wire does not break.

The drum with wire electroded TL5100 sheet is removed from the oven and allowed to cool. A 0.002" Tungsten wire is wrapped tight around the drum between the 3 mil Kovar wire electrode to serve as a shadow mask. Masking tape is placed over the array covering about ½" of both ends and the sides (to prevent coating this area). The drum assembly is then placed on rollers and turned at about 1.5 in/sec. A transparent conductive polymer, TCP, coating is then sprayed on the drum. The TCP is a 1:1 mixture by weight of Baytron CPP 105D and isopropanol. The solution is sprayed using an airbrush at about 1 ml every 15-20 sec. After coating the array, the drum is then placed in a 40° C. oven for 15 min to cure the TCP coating. The 2 mil Tungsten mask is then unwrapped from the drum and the TCP coating is further cured with a hot air gun (~70° C. for 5 minutes). The Kovar wire electrodes are then taped across the drum to hold them on pitch and the electroded sheet is removed from the drum. A narrow piece of TL5100 film is then sealed at both ends to better secure the wires and the wire electrodes in the sheet are soldered into a circuit board. The resistance was measured between adjacent wire electrodes and when no shadow mask was used the resistance was about 3 kΩ. Across adjacent wires which were shadow masked the resistance was around 1 MΩ, however, after applying about 50 volts the resistance would increase to over 30MΩ. Therefore, any small shorts may easily be "burned" open.

All of the processes mentioned above to embed the conductive electrodes into the polymer sheet could also be used to flatten the final eSheet with our without a conductive electrode film electrically connected to the conductive electrode.

Accordingly, it is to be understood that the embodiments of the invention herein described are merely illustrative of the application of the principles of the invention. Reference herein to details of the illustrated embodiments is not intended to limit the scope of the claims, which themselves recite those features regarded as essential to the invention.

What is claimed is:

1. A method of forming an electroded sheet comprising at least one step selected from the group consisting of:
    a) embossing an array of wire electrodes into a surface of a substrate;
    b) embossing an array of patterned conductive electrodes into the surface of the substrate;
    c) grooving a substrate surface and filling a plurality of grooves with a conductive electrode material;
    d) stringing an array of wire electrodes across the surface of the substrate and over coating the array of wire electrodes with a planarizing layer;
    e) patterning an array of electrodes on the substrate and over coating the patterned array of electrodes with a planarizing layer;
    f) stringing the array of wire electrodes across a surface of a setter, over coating the array of wires with a substrate material, and then removing the wires and substrate material from the setter to form the electroded sheet; and
    g) patterning an array of electrodes on the substrate, over coating the patterned array of electrodes with a substrate material, and then removing the patterned array of electrodes and substrate material from the setter to form the electroded sheet.

2. The method of claim 1, wherein embedding the array of electrodes into the surface of the polymer substrate uses a forcing surface selected from the group consisting of:
    a) at least one rigid plate;
    b) at least one roller; and
    c) at least one die.

3. The method of claim 2, wherein the forcing surface is coated with a release layer, wherein the release layer is selected from the group consisting of:
    a) a silicone based material;
    b) a carbon based material;
    c) a metal material;
    d) a layer of small particles; and
    e) any combination of a) through d).

4. The method of claim 1, wherein forming the electroded sheet further comprises the step of scanning a hot zone across the electroded sheet to embed wires or flatten the electroded sheet.

5. The method of claim 4, wherein the hot zone is created using a hot bar.

6. The method of claim 4, wherein the hot zone is created by plunging the electroded sheet into an oven or a furnace.

7. The method of claim 4, wherein the hot zone is created by translating the electroded sheet through a leer.

8. The method of claim 1, wherein a hot zone is scanned across the electroded sheet while embedding the electrodes or flattening the electroded sheet surface to prevent trapped air.

9. The method of claim 1, wherein forming the electroded sheet further comprises the step of cutting a wire guide pattern into an edge of a plate to set a pitch of the wire electrodes.

10. The method of claim 1, further comprising the step of attaching at least one sacrificial wire guide to a side of a plate comprising a substep selected from the group consisting of:
    a) setting the pitch of the electrodes;
    b) setting the pitch of a mask for a patterned film;
    c) releasing wire tension by setting all of the wires to the same tension; and
    d) releasing wire tension by lowering wire stress to choose a desired tension in the wire that produces a flat electroded sheet.

11. A method of forming an electroded sheet comprising the steps of:
    a) applying a plurality of electrodes onto a surface of a flat plate or a slightly arced plate, wherein the electrodes comprise a plurality of transparent conductive electrode stripes connected to a plurality of wire electrodes;
    b) after step a), performing at least one step selected from the group consisting of:

i) pressing a thermal polymer film or plate into the wire electrodes;
ii) filling a surface of the electrodes on the plate with a thermal polymer;
iii) filling a surface of the electrodes on the plate with a thermal set polymer;
iv) filling the surface of the electrodes on the plate with an ultraviolet curable polymer and curing the polymer; and
v) filling the surface of the electrodes on the plate with a silicone film; and c) after step b), removing the electroded sheet from the plate.

12. A method of forming an electroded sheet comprising the step of embedding a plurality of wire electrodes into a surface of a sheet, comprising at least one substep selected from the group consisting of:
a) extruding a polymer sheet and the wire electrodes in one process step;
b) stamping the wire electrodes into a surface of the polymer sheet in a roll-to-roll process;
c) rolling the wire electrodes into the surface of the polymer sheet in a roll-to-roll process; and
d) creating multiple electroded sheets by embedding the wire electrodes into a polymer sheet using flat plates in a batch process.

* * * * *